(12) United States Patent
Bessho et al.

(10) Patent No.: US 9,091,415 B2
(45) Date of Patent: Jul. 28, 2015

(54) LIGHT-EMITTING DEVICE, AND DISPLAY APPARATUS, WHICH CAN EFFICIENTLY EMIT, TO OUTSIDE, FLUORESCENCE GENERATED IN FLUORESCENT LAYER AND CAN REALIZE HIGH-LUMINANCE LIGHT EMISSION AND IN WHICH GENERATION OF BLURRINESS AND FUZZINESS OF DISPLAY IS SUPPRESSED

(75) Inventors: Hisanori Bessho, Osaka (JP); Mitsuhiro Koden, Osaka (JP); Akiko Iwata, Osaka (JP); Yoshimasa Fujita, Osaka (JP); Yuhki Kobayashi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/344,905

(22) PCT Filed: Sep. 11, 2012

(86) PCT No.: PCT/JP2012/073223
§ 371 (c)(1),
(2), (4) Date: Mar. 13, 2014

(87) PCT Pub. No.: WO2013/039072
PCT Pub. Date: Mar. 21, 2013

(65) Prior Publication Data
US 2015/0003040 A1    Jan. 1, 2015

(30) Foreign Application Priority Data
Sep. 16, 2011    (JP) ................. 2011-203454

(51) Int. Cl.
| | | |
|---|---|---|
| *H05B 33/02* | (2006.01) | |
| *H01L 33/48* | (2010.01) | |
| *F21V 9/10* | (2006.01) | |
| *H01L 51/52* | (2006.01) | |
| *H01L 27/32* | (2006.01) | |
| *F21V 13/02* | (2006.01) | |
| *F21V 13/14* | (2006.01) | |
| *H01L 33/50* | (2010.01) | |
| *G02F 1/1335* | (2006.01) | |

(52) U.S. Cl.
CPC . *F21V 9/10* (2013.01); *F21V 13/02* (2013.01); *F21V 13/14* (2013.01); *H01L 27/322* (2013.01); *H01L 33/507* (2013.01); *H01L 51/5262* (2013.01); *H01L 51/5268* (2013.01); *H01L 51/5271* (2013.01); *G02F 1/133617* (2013.01)

(58) Field of Classification Search
CPC ........... F21V 9/10; F21V 13/14; F21V 13/02; H01L 33/507; H01L 51/5271; H01L 51/5262; H01L 27/322; H01L 51/5268; G02F 1/133617
USPC .................................. 313/498–512; 428/690
See application file for complete search history.

(56) References Cited

U.S. PATENT DOCUMENTS

| | | |
|---|---|---|
| 4,402,827 A | 9/1983 | Joseph |
| 6,469,755 B1 | 10/2002 | Adachi et al. |
| 6,762,553 B1 | 7/2004 | Yokogawa et al. |

FOREIGN PATENT DOCUMENTS

| | | |
|---|---|---|
| JP | A-11-329726 | 11/1999 |
| JP | A-2000-131683 | 5/2000 |
| JP | A-2001-202827 | 7/2001 |
| JP | B-4279971 | 6/2009 |

*Primary Examiner* — Joseph L Williams
(74) *Attorney, Agent, or Firm* — Morrison & Foerster LLP

(57) ABSTRACT

A light-emitting device includes an excitation light source that emits excitation light; a first substrate which is disposed so as to face the excitation light source and on which a fluorescent layer and a first low-refractive-index layer are formed, the fluorescent layer being excited by the excitation light to emit fluorescence; and a barrier that surrounds side surfaces of the fluorescent layer, the side surfaces extending in a stacking direction of the excitation light source and the first substrate. At least a portion of the barrier that faces the fluorescent layer has a light-scattering property. The first low-refractive-index layer is located between the fluorescent layer and the first substrate. The first low-refractive-index layer has a refractive index lower than that of the first substrate.

20 Claims, 24 Drawing Sheets

LIGHT-EMITTING DEVICE, AND DISPLAY APPARATUS, WHICH CAN EFFICIENTLY EMIT, TO OUTSIDE, FLUORESCENCE GENERATED IN FLUORESCENT LAYER AND CAN REALIZE HIGH-LUMINANCE LIGHT EMISSION AND IN WHICH GENERATION OF BLURRINESS AND FUZZINESS OF DISPLAY IS SUPPRESSED

CROSS REFERENCE TO RELATED APPLICATIONS

This is a U.S. National Phase patent application of PCT/JP2012/073223, filed Sep. 11, 2012, which claims priority to Japanese patent application no. JP 2011-203454, filed Sep. 16, 2011, each of which are hereby incorporated by reference in the present disclosure in their entirety.

TECHNICAL FIELD

The present invention relates to a light-emitting device including a fluorescent layer that emits fluorescence through irradiation with excitation light, a display apparatus, an illumination apparatus, and an electricity-generating apparatus.

BACKGROUND ART

In recent years, needs of flat panel displays have been growing with realization of advanced information society. Examples of flat panel displays include liquid crystal displays (LCDs), which are non-self-emitting displays; and plasma displays (PDP), inorganic electroluminescence (inorganic EL) displays, and organic electroluminescence (hereinafter also referred to as "organic EL" or "organic LED") displays, which are self-emitting displays.

Among these flat panel displays, in particular, liquid crystal displays generally include an illumination device as a light source on the back surface of a transmission-type liquid crystal display element and the viewability of liquid crystal displays is improved by irradiating the liquid crystal display element from the back surface side.

In such a liquid crystal display, the light emitted from the light source is generally unpolarized light and 50% or more of the unpolarized light is absorbed by a polarizing plate disposed on the illumination-light-entering side of the liquid crystal display element. Thus, the efficiency of using light emitted from a light source is low. In color liquid crystal display apparatuses which include a white light source and a micro color filter that supports three primary colors or four primary colors within a display surface and in which color display is conducted by an additive color mixture, more than 70% of light is absorbed by the color filter and thus the efficiency of using light emitted from a light source is extremely low. Therefore, an increase in light utilization efficiency is highly demanded.

To solve the above problems, for example, there has been proposed a color display apparatus including a pair of transparent substrates disposed with a certain gap so that surfaces on which a transparent electrode is formed face each other, a liquid crystal layer sandwiched between the transparent substrates, a liquid crystal display element including voltage application means for applying a voltage corresponding to an image signal to matrix pixels formed by the transparent electrodes of the pair of transparent substrates, an illumination device that emits light in a blue region to a blue-green region, a wavelength-converting fluorescent body that emits red light by using, as excitation light, the light in a blue region to a blue-green region, a wavelength-converting fluorescent body that emits green light by using, as excitation light, the light in a blue region to a blue-green region, and a color filter that blocks light other than the light in a blue region to a blue-green region (e.g., refer to PTL 1).

There has been also proposed an organic EL element including an EL light-emitting element and a wavelength-converting fluorescent layer, in which, by disposing a reflective body on the side surfaces of the wavelength-converting fluorescent layer, light that travels toward the side surfaces can be efficiently output from the front (e.g., refer to PTL 2).

CITATION LIST

Patent Literature

PTL 1: Japanese Unexamined Patent Application Publication No. 2000-131683
PTL 2: Japanese Unexamined Patent Application Publication No. 11-329726
PTL 3: Japanese Unexamined Patent Application Publication No. 2001-202827

SUMMARY OF INVENTION

Technical Problem

However, in the color display apparatus disclosed in PTL 1, since the light emitted from the fluorescent layer spreads isotropically, part of the light is reflected at the interface between the substrate and the outside and is not output to the outside. The reflected light enters at least an adjacent pixel portion and causes the blurriness and fuzziness of display, which degrades the display quality. Furthermore, when the light is output to the outside from the fluorescent layer, for example, the light is absorbed by a black matrix disposed between the color filter and fluorescent layers corresponding to different pixels, which increases the loss of light and decreases the light utilization efficiency.

In the organic EL element disclosed in PTL 2, the incident angle of light that enters, from the fluorescent layer, the substrate which is in contact with the outside is not controlled. Therefore, the light that enters the substrate from the fluorescent layer has a light component that reflects at the interface between the substrate and the outside, and consequently the display quality cannot be sufficiently improved. In the light emitted from the fluorescent layer, part of a light component that travels toward the side surfaces of the fluorescent layer can be reused by the reflective body disposed on the side surfaces of the fluorescent layer. However, light emitted toward the light source side cannot be efficiently output and thus the light utilization efficiency cannot be sufficiently improved.

In a structure of a light-emitting element disclosed in PTL 3, measures for preventing the blurriness and fuzziness of display are taken because a low-refractive-index layer is disposed between a substrate and a fluorescent layer and thus the incident angle of light that enters, from the fluorescent layer, the substrate which is in contact with the outside is restricted. However, measures for reusing light returned to the fluorescent layer by being reflected at the interface between the substrate and the fluorescent layer are not taken. Therefore, the light utilization efficiency cannot be sufficiently improved.

In view of the foregoing, it is an object of the present invention to provide a light-emitting device, a display apparatus, and an illumination apparatus which can efficiently emit, to the outside, fluorescence generated in a fluorescent layer and can realize high-luminance light emission and in which the generation of the blurriness and fuzziness of display is suppressed.

Solution to Problem

To achieve the above object, several aspects of the present invention provide the following light-emitting device, display apparatus, illumination apparatus, and electricity-generating apparatus.

A light-emitting device according to one aspect of the present invention includes an excitation light source that emits excitation light; a first substrate which is disposed so as to face the excitation light source and on which a fluorescent layer and a first low-refractive-index layer are formed, the fluorescent layer being excited by the excitation light to emit fluorescence; and a barrier that surrounds side surfaces of the fluorescent layer, the side surfaces extending in a stacking direction of the excitation light source and the first substrate. In the light-emitting device, at least a portion of the barrier that faces the fluorescent layer has a light-scattering property, the first low-refractive-index layer is located between the fluorescent layer and the first substrate, and the first low-refractive-index layer has a refractive index lower than that of the first substrate.

The light-emitting device according to one aspect of the present invention may further include a second substrate located on an incident surface side of the fluorescent layer upon which the excitation light is incident.

The light emission according to one aspect of the present invention may further include the low-refractive-index layer located on an incident surface side of the fluorescent layer upon which the excitation light is incident.

The light-emitting device according to one aspect of the present invention may further include a wavelength-selective transmission/reflection layer configured to transmit at least light with a peak wavelength of the excitation light and reflect at least light with an emission peak wavelength of the fluorescent layer, the wavelength-selective transmission/reflection layer being located on an incident surface side of the fluorescent layer upon which the excitation light is incident.

In the light-emitting device according to one aspect of the present invention, the second low-refractive-index layer may be located between the fluorescent layer and the wavelength-selective transmission/reflection layer or between the wavelength-selective transmission/reflection layer and the excitation light source.

In the light-emitting device according to one aspect of the present invention, the fluorescent layer is constituted by a plurality of separated fluorescent layers each located in a predetermined region, and the first low-refractive-index layer may be formed so as to extend between the plurality of separated fluorescent layers and the first substrate.

The light-emitting device according to one aspect of the present invention may further include a light-absorbing layer disposed between two adjacent separated fluorescent layers among the plurality of separated fluorescent layers.

In the light-emitting device according to one aspect of the present invention, the light-absorbing layer may be located on at least one of an upper surface and a lower surface of the barrier.

In the light-emitting device according to one aspect of the present invention, the light-absorbing layer may be formed between the first low-refractive-index layer and the first substrate.

In the light-emitting device according to one aspect of the present invention, a surface of the light-absorbing layer that faces the fluorescent layer may be covered with the first low-refractive-index layer.

In the light-emitting device according to one aspect of the present invention, the first low-refractive-index layer may have such a refractive index that an outgoing angle of incident light that enters the first substrate from the first low-refractive-index layer is smaller than a critical angle of at least incident light that can be output from the first substrate toward the outside.

In the light-emitting device according to one aspect of the present invention, the first low-refractive-index layer may be composed of a gas.

The light-emitting device according to one aspect of the present invention may further include a gas barrier film configured to block the gas, the gas barrier film being disposed on an incident surface side of the fluorescent layer upon which the excitation light is incident.

In the light-emitting device according to one aspect of the present invention, at least a portion of the barrier that faces the fluorescent layer may be formed of a material containing a resin and light-scattering particles.

In the light-emitting device according to one aspect of the present invention, at least a portion of the barrier that faces the fluorescent layer may be white.

In the light-emitting device according to one aspect of the present invention, at least a portion of the barrier that faces the fluorescent layer may have irregularities.

A display apparatus according to another aspect of the present invention includes the light-emitting device.

In the display apparatus according to another aspect of the present invention, the excitation light source emits excitation light in an ultraviolet region; and the fluorescent layer may include a red fluorescent layer that emits red light through irradiation with the excitation light and constitutes a red pixel, a green fluorescent layer that emits green light through irradiation with the excitation light and constitutes a green pixel, and a blue fluorescent layer that emits blue light through irradiation with the excitation light and constitutes a blue pixel.

In the display apparatus according to another aspect of the present invention, the excitation light source emits blue excitation light; and the fluorescent layer may include a red fluorescent layer that emits red light through irradiation with the excitation light and constitutes a red pixel, a green fluorescent layer that emits green light through irradiation with the excitation light and constitutes a green pixel, and a scattering layer that scatters the excitation light and constitutes a blue pixel.

In the display apparatus according to another aspect of the present invention, an active-matrix drive element corresponding to the excitation light source may be disposed.

In the display apparatus according to another aspect of the present invention, the fluorescence may be output to the outside from the first substrate.

In the display apparatus according to another aspect of the present invention, the excitation light source may be a light-emitting diode, an organic electroluminescence element, or an inorganic electroluminescence element.

The display apparatus according to another aspect of the present invention may further include a liquid crystal device that can control a transmittance of the excitation light and is disposed between the excitation light source and the first substrate. In the display apparatus, the excitation light source may be a planar light source.

In the display apparatus according to another aspect of the present invention, the excitation light source may have directivity.

The display apparatus according to another aspect of the present invention may further include a polarizing plate having an extinction ratio of 10000 or more at a wavelength of 435 nm or more and 480 nm or less, the polarizing plate being disposed between the excitation light source and the substrate.

In the display apparatus according to another aspect of the present invention, a color filter may be disposed between the fluorescent layer and the first low-refractive-index layer and/or between the first low-refractive-index layer and the first substrate.

An illumination apparatus according to still another aspect of the present invention includes the light-emitting device.

An electricity-generating apparatus according to still yet another aspect of the present invention includes the light-emitting device and a solar cell device. In the electricity-generating apparatus, the excitation light source in the light-emitting device is sunlight.

Advantageous Effects of Invention

According to several aspects of the present invention, there can be provided a light-emitting device, a display apparatus, an illumination apparatus, and an electricity-generating apparatus which can efficiently emit, to the outside, fluorescence generated in a fluorescent layer and can realize high-luminance light emission and in which the generation of the blurriness and fuzziness of display is suppressed.

DESCRIPTION OF EMBODIMENTS

Figure 1:
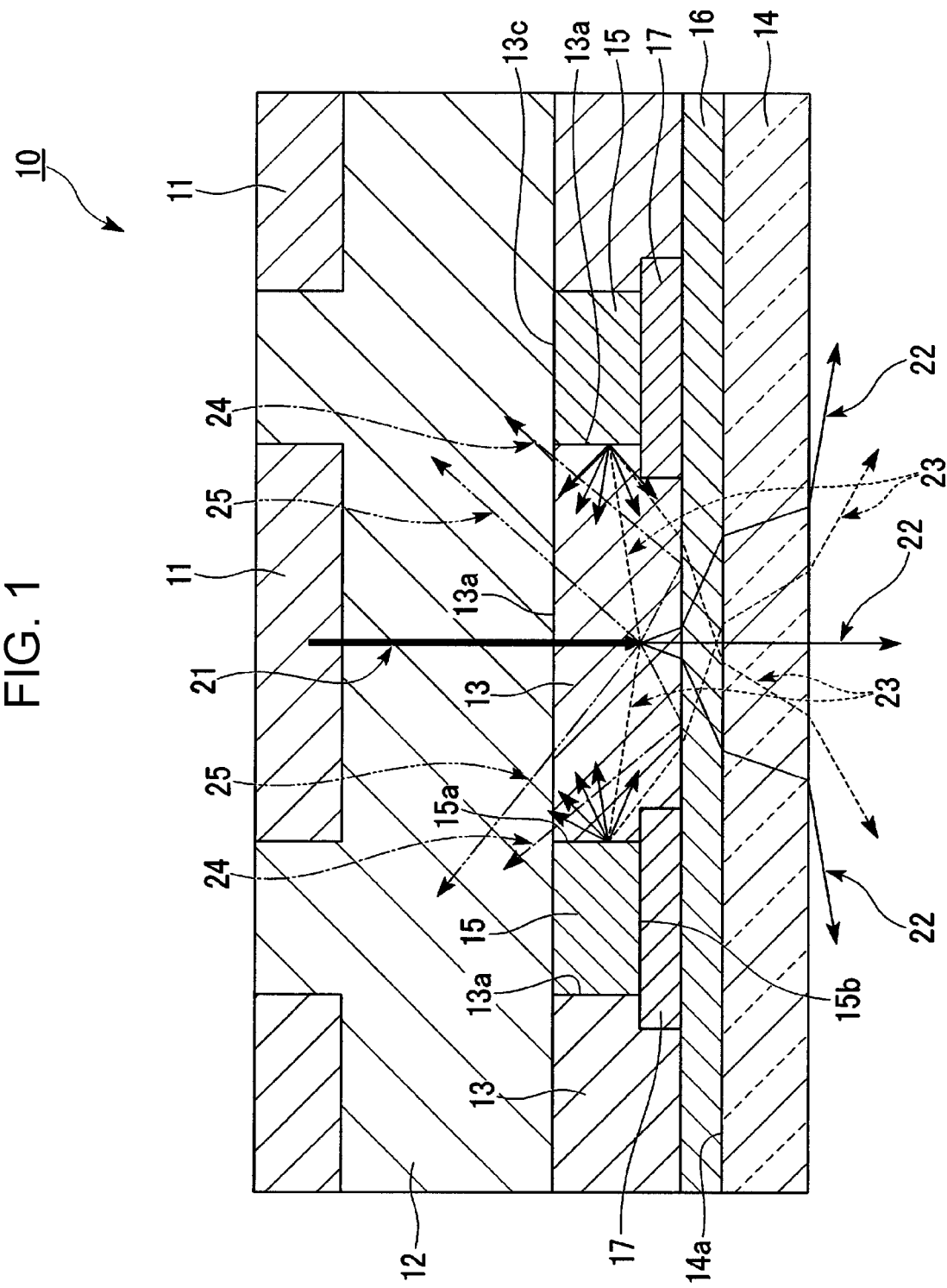
FIG. 1 is a schematic sectional view illustrating a first embodiment of a light-emitting device according to the present invention.

Embodiments of a light-emitting device, a display apparatus, an illumination apparatus, and an electricity-generating apparatus according to aspects of the present invention will now be described with reference to the attached drawings.

The following embodiments are specifically described in order to provide better understanding of the spirit of the present invention and thus do not limit the aspects of the present invention unless otherwise specified.

In the drawings used in the description below, the principal part is sometimes enlarged to provide clear understanding of the features according to the aspects of the present invention, and thus the size ratio of constituent elements may be different from that of real constituent elements.

Light-Emitting Device (1) First Embodiment

FIG. 1 is a schematic sectional view illustrating a first embodiment of a light-emitting device according to this embodiment.

A light-emitting device 10 schematically includes an excitation light source 11, a substrate 14, a barrier 15, and a low-refractive-index layer 16. The excitation light source 11 emits excitation light. The substrate 14 is disposed so as to face the excitation light source 11 through a planarizing film 12. A fluorescent layer 13 that is excited by the excitation light to emit fluorescence is formed on the substrate 14. The barrier 15 surrounds side surfaces 13a of the fluorescent layer 13, the side surfaces 13a extending in a stacking direction of the excitation light source 11 and the substrate 14. The low-refractive-index layer 16 is formed between the fluorescent layer 13 and the substrate 14. The low-refractive-index layer 16 has a refractive index lower than that of the substrate 14.

The barrier 15 has a light-scattering property at least in a portion that faces the fluorescent layer 13 (a side surface 15a of the barrier 15).

Examples of a structure in which the barrier 15 has a light-scattering property include a structure in which the barrier 15 itself is formed of a material containing a resin and light-scattering particles and a structure in which a light-scattering layer (light-scattering film) formed of a material containing a resin and light-scattering particles is disposed on the side surface 15a of the barrier 15.

The fluorescent layer 13 is constituted by a plurality of separated fluorescent layers each located in a predetermined region on one surface 14a of the substrate 14. In the plurality of separated fluorescent layers 13, a light-absorbing layer 17 is formed between the two adjacent separated fluorescent layers 13. Furthermore, the light-absorbing layer 17 is formed between the low-refractive-index layer 16 and the barrier 15, that is, on a lower surface (a surface on the low-refractive-index layer 16 side) 15b side of the barrier 15.

Herein, light emission in known light-emitting devices will be described.

Figure 2:
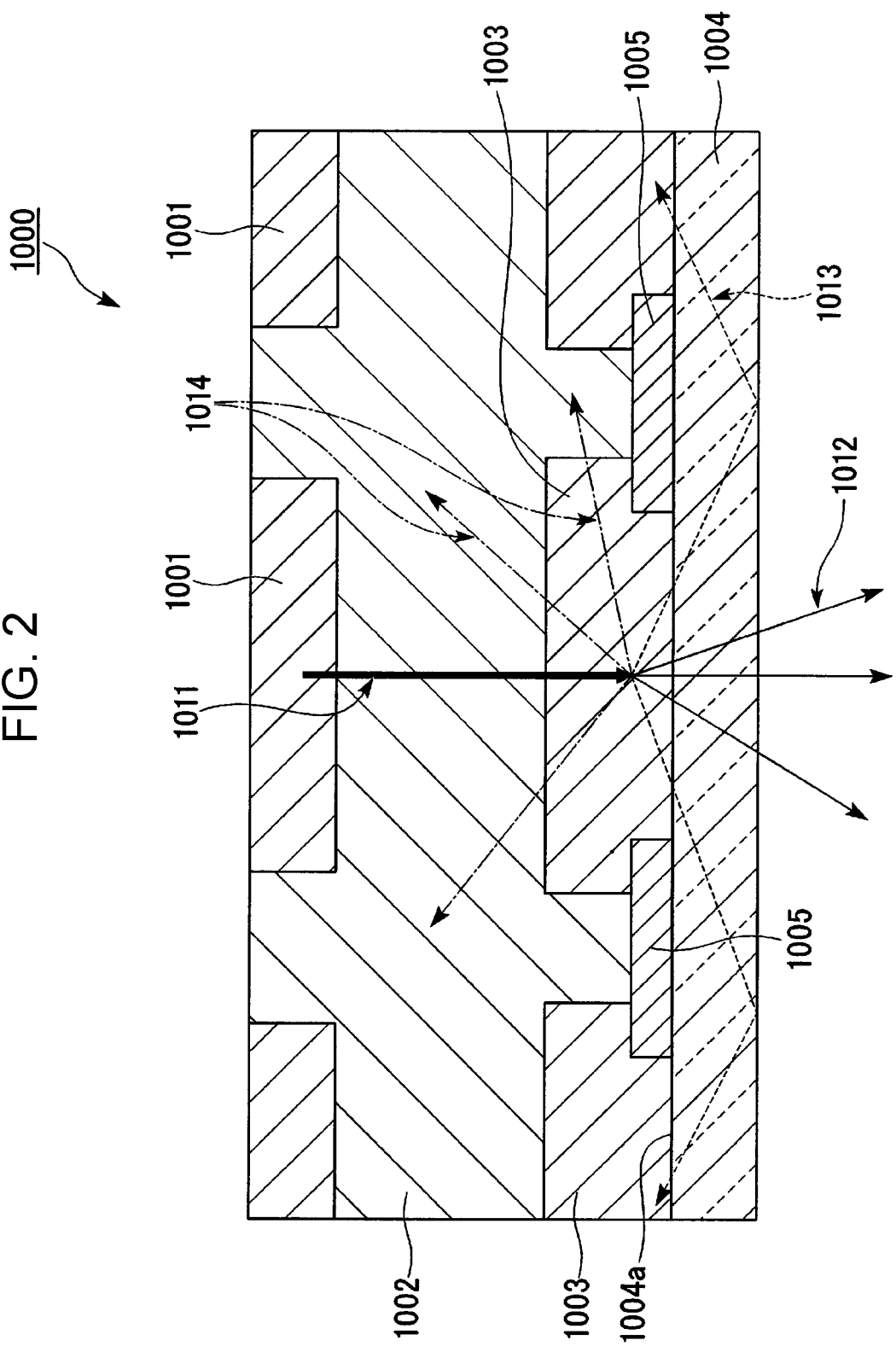
FIG. 2 is a schematic sectional view illustrating a first example of known light-emitting devices.

FIG. 2 is a schematic sectional view illustrating a first example of known light-emitting devices.

A light-emitting device 1000 schematically includes an excitation light source 1001 that emits excitation light and a substrate 1004 which is disposed so as to face the excitation light source 1001 through a planarizing film 1002 and on which a fluorescent layer 1003 that is excited by the excitation light to emit fluorescence is formed.

The fluorescent layer 1003 is constituted by a plurality of separated fluorescent layers formed at predetermined intervals on one surface 1004a of the substrate 1004. In the plurality of separated fluorescent layers 1003, a light-absorbing layer 1005 is formed between two adjacent separated fluorescent layers 1003.

In the light-emitting device 1000, when excitation light 1011 enters the fluorescent layer 1003 from the excitation light source 1001, fluorescence from a fluorescent body is isotropically emitted from each fluorescent layer 1003. Part of a fluorescent component 1012 (indicated by a solid line in FIG. 2) emitted to the light-output side (front direction, substrate 1004 side) among the fluorescent components emitted from the fluorescent layer 1003 can be effectively output to the outside as emission light.

On the other hand, among the fluorescent components emitted from the fluorescent layer 1003, a fluorescent component 1013 (indicated by a broken line in FIG. 2) that enters the substrate 1004 at a large angle relative to the direction of the normal to the substrate 1004 is reflected at the interface with the outside and enters adjacent fluorescent layers 1003, which causes the blurriness and fuzziness of display. A fluorescent component 1014 (indicated by a dot-and-dash line in FIG. 2) emitted in a direction toward a side surface 1013a of the fluorescent layer 1013 and emitted to the side (back surface side) opposite the light-output side cannot be effectively output to the outside as emission light, which results in the loss of emission.

As described above, when the excitation light 1011 enters the fluorescent layer 1003 from the excitation light source 1001, fluorescence from a fluorescent body is isotropically emitted from each fluorescent layer 1003. Therefore, the amount of light that can be actually output to the light-output side is about 10% of the entire light emission from the fluorescent layer 1013.

Figure 3:
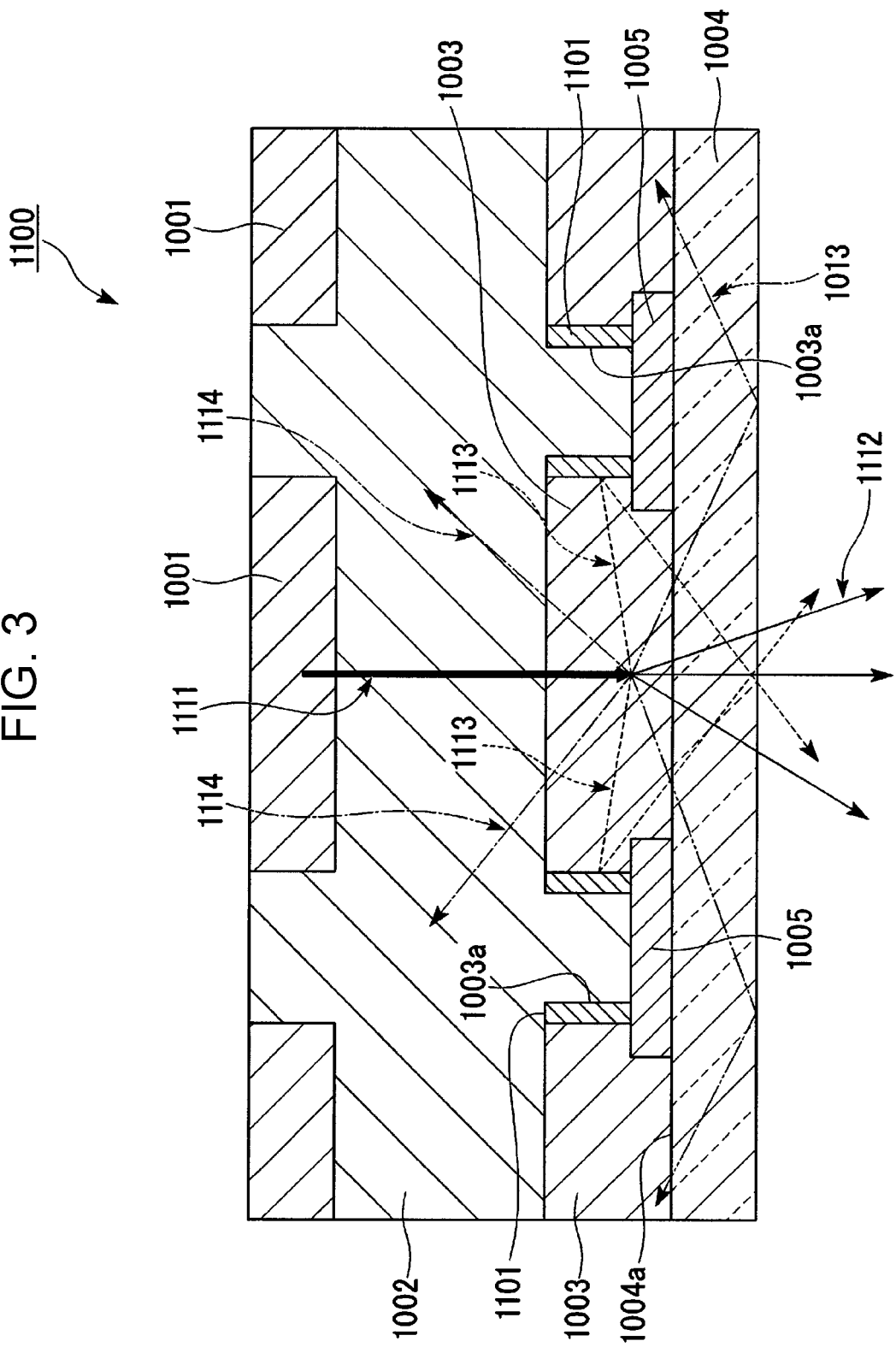
FIG. 3 is a schematic sectional view illustrating a second example of known light-emitting devices.

FIG. 3 is a schematic sectional view illustrating a second example of known light-emitting devices. In FIG. 3, the same constituent elements as those of the light-emitting device 1000 illustrated in FIG. 2 are designated by the same reference numerals, and the descriptions thereof are omitted.

A light-emitting device 1100 is different from the above light-emitting device 1000 in that an optical reflection layer 1101 made of a metal or the like is disposed on a side surface 1003a of the fluorescent layer 1003.

In the light-emitting device 1100, when excitation light 1111 enters the fluorescent layer 1003 from the excitation light source 1001, fluorescence from a fluorescent body is isotropically emitted from each fluorescent layer 1003. Part of a fluorescent component 1112 (indicated by a solid line in FIG. 3) emitted to the light-output side (front direction, substrate 1004 side) among the fluorescent components emitted from the fluorescent layer 1003 can be effectively output to the outside as emission light. Among the fluorescent components emitted from the fluorescent layer 1003, a fluorescent component 1113 (indicated by a broken line in FIG. 3) emitted in a direction toward the side surface 1003a of the fluorescent layer 1003 is reflected by the optical reflection layer 1101 and part of the fluorescent component 1113 can be effectively output to the outside as emission light.

On the other hand, among the fluorescent components emitted from the fluorescent layer 1003, a fluorescent component 1114 (indicated by a dot-and-dash line in FIG. 3) emitted to the excitation light source 1001 side (back surface side) cannot be effectively output to the outside as emission light, which results in the loss of emission. Therefore, the light cannot be efficiently output. Among the fluorescent components emitted from the fluorescent layer 1003, a fluorescent component 1115 (indicated by a dash-dot-dot line in FIG. 3) that enters the substrate 1004 at a large angle relative to the direction of the normal to the substrate 1004 is reflected at the interface with the outside and enters adjacent fluorescent layers 1003, which causes the blurriness and fuzziness of display.

Figure 4:
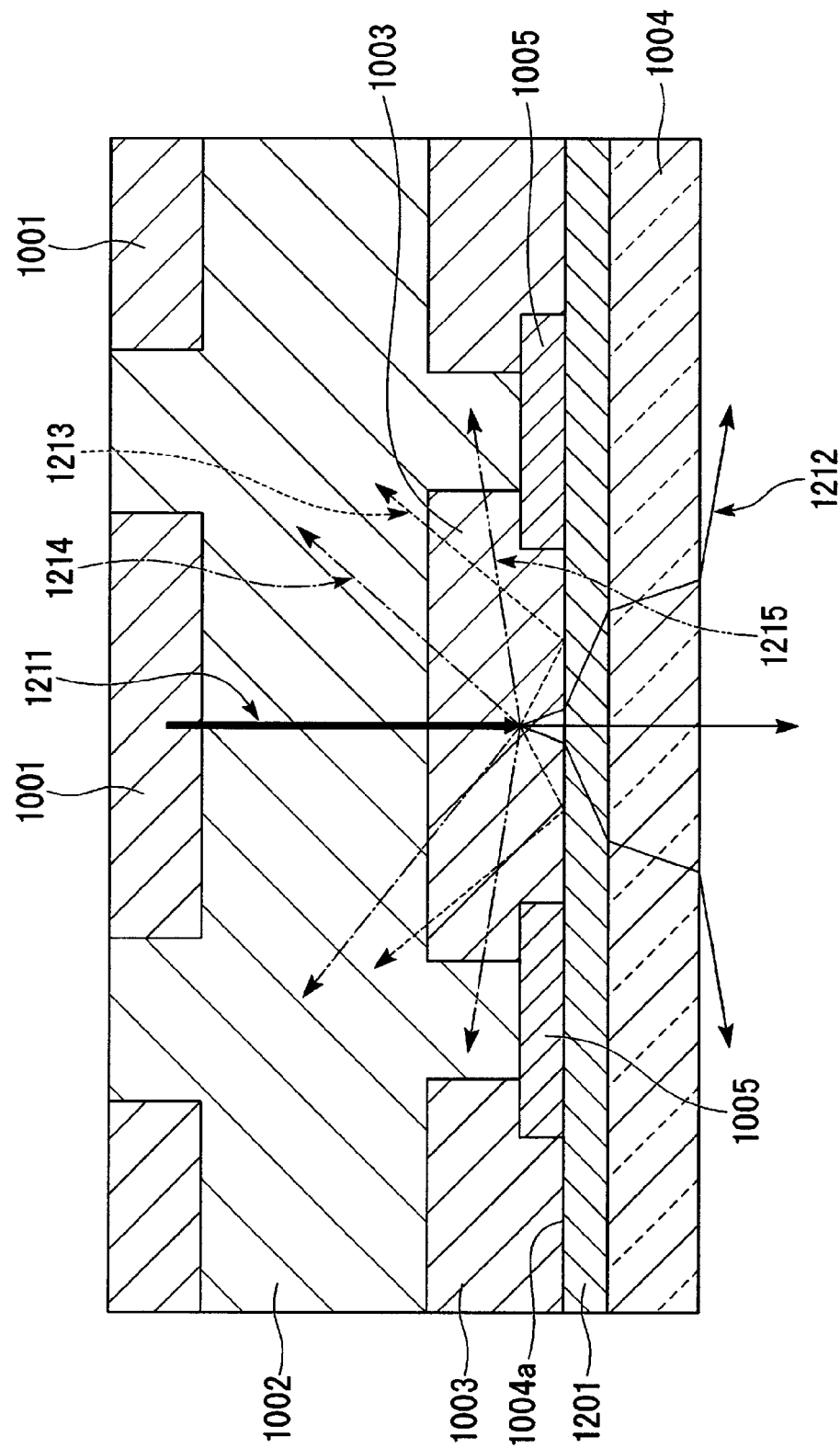
FIG. 4 is a schematic sectional view illustrating a third example of known light-emitting devices.

FIG. 4 is a schematic sectional view illustrating a third example of known light-emitting devices. In FIG. 4, the same constituent elements as those of the light-emitting device 1000 illustrated in FIG. 2 are designated by the same reference numerals, and the descriptions thereof are omitted.

A light-emitting device 1200 is different from the above light-emitting device 1000 in that a low-refractive-index layer 1201 is disposed between the fluorescent layer 1003 and the substrate 1004 and between the light-absorbing layer 1005 and the substrate 1004.

In the light-emitting device 1200, when excitation light 1211 enters the fluorescent layer 1003 from the excitation light source 1001, fluorescence from a fluorescent body is isotropically emitted from each fluorescent layer 1003. Part of a component 1212 (indicated by a solid line in FIG. 4) emitted to the light-output side (front direction, substrate 1004 side) among the fluorescent components emitted from the fluorescent layer 1003 can be effectively output to the outside as emission light. Among the fluorescent components emitted from the fluorescent layer 1003, a fluorescent component 1213 (indicated by a broken line in FIG. 4) having a large angle relative to the direction of the normal to the substrate 1004 is reflected at the interface between the fluorescent layer 1003 and the low-refractive-index layer 1201 and does not enter the substrate 1004. Therefore, the reflection of the fluorescent component that enters the substrate 1004 at the interface between the substrate 1004 and the outside can be reduced, which can suppress the generation of the blurriness and fuzziness of display.

On the other hand, among the fluorescent components emitted from the fluorescent layer 1003, the fluorescent component 1213 and a fluorescent component 1214 (indicated by a dot-and-dash line in FIG. 4) emitted to the side (back surface side) opposite the light-output side cannot be efficiently output to the outside because measures for effectively using the fluorescent components 1213 and 1214 by reflecting the fluorescent components 1213 and 1214 are not taken and thus the loss of emission increases. Among the fluorescent components emitted from the fluorescent layer 1003, a component 1215 (indicated by a dash-dot-dot line in FIG. 4) emitted in a direction toward the side surface 1003a of the fluorescent layer 1003 cannot be effectively output to the outside as emission light because measures for effectively using the component 1215 through reflection are not taken, which results in the loss of emission.

Figure 5:
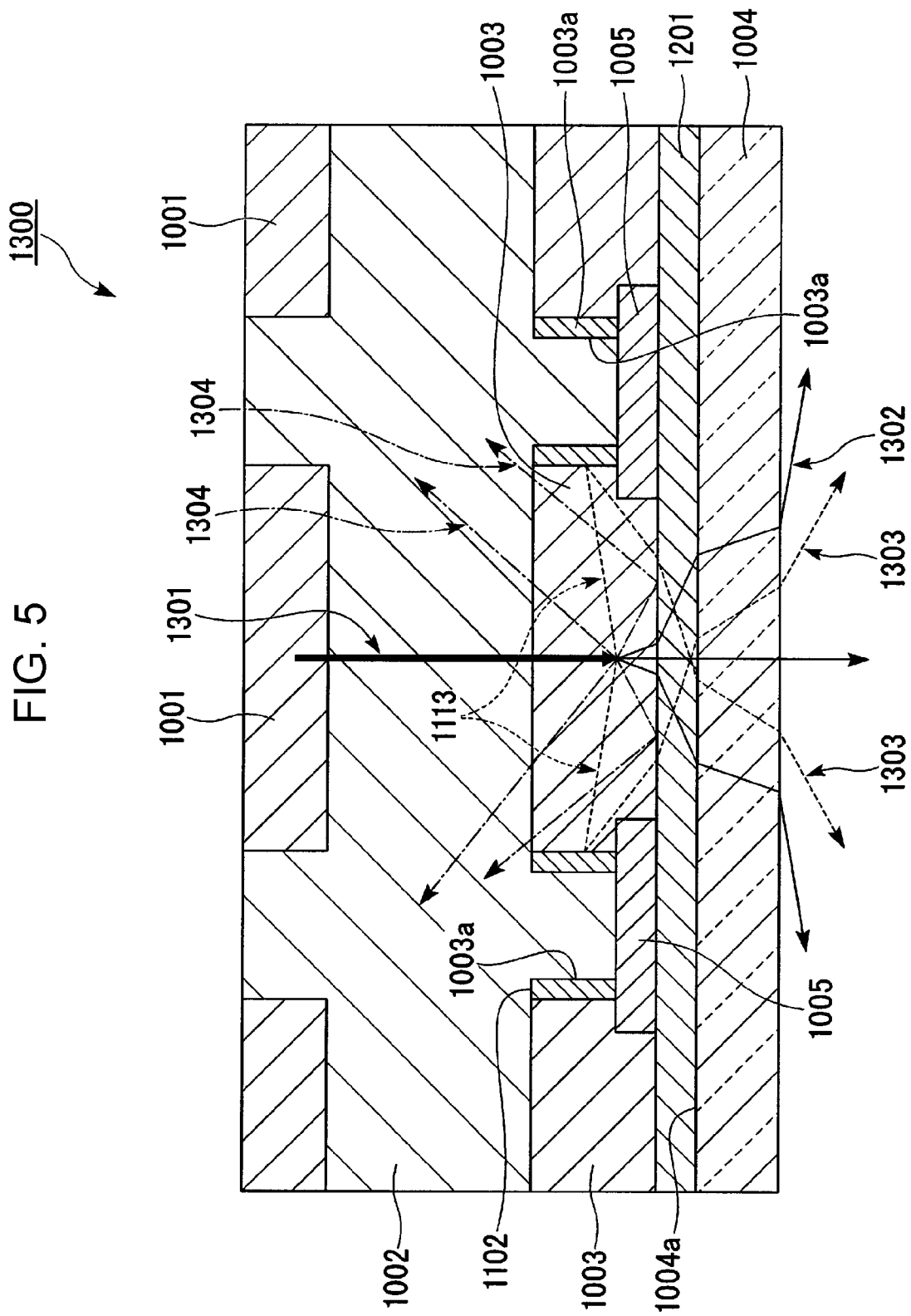
FIG. 5 is a schematic sectional view illustrating a fourth example of known light-emitting devices.

FIG. 5 is a schematic sectional view illustrating a fourth example of known light-emitting devices. In FIG. 5, the same constituent elements as those of the light-emitting device 1000 illustrated in FIG. 2, the light-emitting device 1100 illustrated in FIG. 3, and the light-emitting device 1200 illustrated in FIG. 4 are designated by the same reference numerals, and the descriptions thereof are omitted.

A light-emitting device 1300 is different from the above light-emitting device 1000 in that an optical reflection layer 1101 made of a metal or the like is disposed on the side surface 1003a of the fluorescent layer 1003 and a low-refractive-index layer 1201 is disposed between the fluorescent layer 1003 and the substrate 1004 and between the light-absorbing layer 1005 and the substrate 1004.

In the light-emitting device 1300, when excitation light 1301 enters the fluorescent layer 1002 from the excitation light source 1001, fluorescence from a fluorescent body is isotropically emitted from each fluorescent layer 1003. Part of a fluorescent component 1302 (indicated by a solid line in FIG. 5) emitted to the light-output side (front direction, substrate 1003 side) among the fluorescent components emitted from the fluorescent layer 1002 can be effectively output to the outside as emission light. Part of a fluorescent component 1303 (indicated by a broken line in FIG. 5) emitted in a direction toward the side surface 1003a of the fluorescent layer 1003 among the fluorescent components emitted from the fluorescent layer 1003 is reflected by the optical reflection layer 1101 and can be effectively output to the outside as emission light.

On the other hand, the rest of the fluorescent component 1303 (indicated by a broken line in FIG. 5) emitted in a direction toward the side surface 1003a of the fluorescent layer 1003 among the fluorescent components emitted from the fluorescent layer 1003 is regularly reflected (reflected at the same angle as the incident angle) by the optical reflection layer 1101 and the incident angle of the reflected light that enters the interface of the fluorescent layer 1003 again cannot be changed. Therefore, the rest of the fluorescent component 1303 cannot be output from the fluorescent layer 1003. In other words, a component endlessly guided in the fluorescent layer 1003 is generated and cannot be effectively output to the outside as emission light. This results in the loss of emission and light cannot be efficiently output. Among the fluorescent components emitted from the fluorescent layer 1003, a fluorescent component 1304 (indicated by a dot-and-dash line in FIG. 5) emitted to the excitation light source 1001 side (back surface side) cannot be effectively output to the outside as emission light. This results in the loss of emission and light cannot be efficiently output.

Hereafter, members constituting the light-emitting device 10 and a method for forming the light-emitting device 10 will be specifically described, but this embodiment is not limited to the members and the formation method.

A light source that emits ultraviolet light or blue light is used as the excitation light source 11 used to excite a fluorescent body. Examples of the light source include light-emitting elements such as ultraviolet-light-emitting diodes (hereafter may be abbreviated as "ultraviolet LEDs"), blue-light-emitting diodes (hereafter may be abbreviated as "blue LEDs"), ultraviolet-light-emitting inorganic electroluminescence elements (hereafter may be abbreviated as "ultraviolet-light-emitting inorganic EL elements"), blue-light-emitting inorganic electroluminescence elements (hereafter may be abbreviated as "blue-light-emitting inorganic EL elements"), ultraviolet-light-emitting organic electroluminescence elements (hereafter may be abbreviated as "ultraviolet-light-emitting organic EL elements"), and blue-light-emitting organic electroluminescence elements (hereafter may be abbreviated as "blue-light-emitting organic EL elements"). The above light sources are exemplified as the excitation light source 11, but the excitation light source 11 is not limited thereto.

The ON/OFF of light emission for displaying images can be controlled by directly switching the excitation light source 11. The ON/OFF of light emission can also be controlled by disposing a layer having a shutter function, such as a liquid crystal layer, between the excitation light source 11 and the fluorescent layer 13 and controlling the layer. The ON/OFF can also be controlled by using both the excitation light source 11 and the layer having a shutter function, such as a liquid crystal layer.

The planarizing film 12 is disposed on an upper surface (a surface facing the excitation light source 11) 13c of the fluorescent layer 13 so that the upper surface 13c of the fluorescent layer 13 is planarized. This can prevent the formation of a gap between the excitation light source 11 and the fluorescent layer 13 and can improve the adhesiveness between the excitation light source 11 and the fluorescent layer 13.

The fluorescent layer 13 is constituted by a red fluorescent layer, a green fluorescent layer, and a blue fluorescent layer that absorb excitation light emitted from a light-emitting element such as an ultraviolet LED, a blue LED, an ultraviolet-light-emitting inorganic EL element, a blue-light-emitting inorganic EL element, an ultraviolet-light-emitting organic EL element, or a blue-light-emitting organic EL element to emit red light, green light, and blue light, respectively.

The red fluorescent layer, the green fluorescent layer, and the blue fluorescent layer are composed of, for example, a thin film with a rectangular shape in plan view.

When necessary, fluorescent bodies that emit cyan light and yellow light are preferably added to each pixel constituting the fluorescent layer 13. When the color purity of each pixel that emits cyan light or yellow light is located outside a triangle formed by connecting three points representing color purities of pixels that emit red light, green light, and blue light on a chromaticity diagram, the color reproduction region can be further broadened compared with display apparatuses that use pixels which emit light of the three primary colors, namely, red light, green light, and blue light.

The fluorescent layer 13 may be composed of only a fluorescent material shown below. The fluorescent layer 13 may also be composed of a fluorescent material shown below and, if necessary, additives. The fluorescent layer 13 may have a structure in which a fluorescent material shown below is dispersed in a polymer material (binder resin) or an inorganic material.

A publicly known fluorescent material can be used as the fluorescent material contained in the fluorescent layer 13. Such a fluorescent material is classified into an organic fluorescent material and an inorganic fluorescent material. Specific compounds of the organic fluorescent material and inorganic fluorescent material are shown below, but this embodiment is not limited to these materials.

The organic fluorescent material is shown below. Examples of blue fluorescent dyes that convert ultraviolet excitation light into blue light include stilbenzene dyes such as 1,4-bis(2-methylstyryl)benzene and trans-4,4'-diphenylstilbenezene; coumarin dyes such as 7-hydroxy-4-methylcoumarin, ethyl 2,3,6,7-tetrahydro-11-oxo-1H,5H,11H-[1]benzopyrano[6,7,8-ij]quinolizine-10-carboxylate (Coumarin 314) and 10-acetyl-2,3,6,7-tetrahydro-1H,5H,11H-[1]benzopyrano[6,7,8-ij]quinolizin-11-one (Coumarin 334); and anthracene dyes such as 9,10-bis(phenylethynyl)anthracene and perylene.

Examples of green fluorescent dyes that convert ultraviolet or blue excitation light into green light include coumarin dyes such as 2,3,5,6-1H,4H-tetrahydro-8-trifluoromethylquinolizino(9,9a,1-gh)coumarin (Coumarin 153), 3-(2'-benzothiazolyl)-7-diethylaminocoumarin (Coumarin 6), 3-(2'-benzimidazolyl)-7-N,N-diethylaminocoumarin (Coumarin 7), 10-(benzothiazol-2-yl)-2,3,6,7-tetrahydro-1H,5H,11H-[1]benzopyrano[6,7,8-ij]quinolizin-11-one (Coumarin 545), Coumarin 545T, and Coumarin 545P; naphthalimide dyes such as Basic Yellow 51, Solvent Yellow 11, Solvent Yellow 98, Solvent Yellow 116, Solvent Yellow 43, and Solvent Yellow 44; perylene dyes such as Lumogen Yellow, Lumogen Green, and Solvent Green 5; fluorescein dyes; azo dyes; phthalocyanine dyes; anthraquinone dyes; quinacridone dyes; isoindolinone dyes; thioindigo dyes; and dioxazine dyes.

Examples of red fluorescent dyes that convert ultraviolet or blue excitation light into red light include cyanine dyes such as 4-dicyanomethylene-2-methyl-6-(p-dimethylaminostyryl)-4H-pyran; pyridine dyes such as 1-ethyl-2-[4-(p-dimethylaminophenyl)-1,3-butadienyl]-pyridinium-perchlorate (Pyridine 1); xanthene dyes such as Rhodamine B, Rhodamine 6G, Rhodamine 3B, Rhodamine 101, Rhodamine 110, Basic Violet 11, Sulforhodamine 101, Basic Violet 11, and Basic Red 2; perylene dyes such as Lumogen Orange, Lumogen Pink, Lumogen Red, and Solvent Orange 55; oxazine dyes; chrysene dyes; thioflavine dyes; pyrene dyes; anthracene dyes; acridone dyes; acridine dyes; fluorene dyes; terphenyl dyes; ethene dyes; butadiene dyes; hexatriene dyes; oxazole dyes; coumarin dyes; stilbene dyes; di/triphenylmethane dyes; thiazole dyes; thiazine dyes; naphthalimide dyes; and anthraquinone dyes.

When the organic fluorescent material is used as a fluorescent body of each color, a dye that is not easily degraded by natural light and blue or ultraviolet light of a backlight is desirably used. In this regard, a perylene dye having high light resistance and a high quantum yield is particularly preferably used.

The inorganic fluorescent material is shown below. Examples of blue fluorescent bodies that convert ultraviolet excitation light into blue light include $Sr_2P_2O_7:Sn^{4+}$, $Sr_4Al_{14}O_{25}:Eu^{2+}$, $BaMgAl_{10}O_{17}:Eu^{2+}$, $SrGa_2S_4:Ce^{3+}$, $CaGa_2S_4:Ce^{3+}$, $(Ba,Sr)(Mg,Mn)Al_{10}O_{17}:Eu^{2+}$, $(Sr,Ca,Ba_2,OMg)_{10}(PO_4)_6Cl_2:Eu^{2+}$, $BaAl_2SiO_8:Eu^{2+}$, $Sr_2P_2O_7:Eu^{2+}$, $Sr_5(PO_4)_3Cl:Eu^{2+}$, $(Sr,Ca,Ba)_5(PO_4)_3Cl:Eu^{2+}$, $BaMg_2Al_{16}O_{27}:Eu^{2+}$, $(Ba,Ca)_5(PO_4)_3Cl:Eu^{2+}$, $Ba_3MgSi_2O_8:Eu^{2+}$, and $Sr_3MgSi_2O_8:Eu^{2+}$.

Examples of green fluorescent bodies that convert ultraviolet or blue excitation light into green light include $(BaMg)Al_{16}O_{27}:Eu^{2+}$, $Mn^{2+}$, $Sr_4Al_{14}O_{25}:Eu^{2+}$, $(SrBa)Al_{12}Si_2O_8:Eu^{2+}$, $(BaMg)_2SiO_4:Eu^{2+}$, $Y_2SiO_5:Ce^{3+}$, $Tb^{3+}$, $Sr_2P_2O_7$—$Sr_2B_2O_5:Eu^{2+}$, $(BaCaMg)_5(PO_4)_3Cl:Eu^{2+}$, $Sr_2Si_3O_8$-$2SrCl_2:Eu^{2+}$, $Zr_2SiO_4$, $MgAl_{11}O_{19}:Ce^{3+}$, $Tb^{3+}$, $Ba_2SiO_4:Eu^{2+}$, $Sr_2SiO_4:Eu^{2+}$, and $(BaSr)SiO_4:Eu^{2+}$.

Examples of red fluorescent bodies that convert ultraviolet or blue excitation light into red light include $Y_2O_2S:Eu^{3+}$, $YAlO_3:Eu^{3+}$, $Ca_2Y_2(SiO_4)_6:Eu^{3+}$, $LiY_9(SiO_4)_6O_2:Eu^{3+}$, $YVO_4:Eu^{3+}$, $CaS:Eu^{3+}$, $Gd_2O_3:Eu^{3+}$, $Gd_2O_2S:Eu^{3+}$, $Y(P,V)O_4:Eu^{3+}$, $Mg_4GeO_{5.5}F:Mn^{4+}$, $Mg_4GeO_6:Mn^{4+}$, $K_5Eu_{2.5}(WO_4)_{6.25}$, $Na_5Eu_{2.5}(WO_4)_{6.25}$, $K_5Eu_{2.5}(MoO_4)_{6.25}$, and $Na_5Eu_{2.5}(MoO_4)_{6.25}$.

The inorganic fluorescent materials may be optionally subjected to surface modification. The surface modification is performed by, for example, a chemical treatment that uses a silane coupling agent or the like, a physical treatment in which submicron fine particles or the like are added, or the combination of the chemical treatment and the physical treatment.

The inorganic fluorescent material is preferably used in consideration of the stability in terms of, for example, the degradation due to excitation light and emitted light.

When the inorganic fluorescent material is used, the average particle diameter ($d_{50}$) is preferably 0.5 µm to 50 µm. If the average particle diameter of the inorganic fluorescent material is less than 0.5 µm, the luminous efficiency of the fluorescent body considerably decreases. If the average particle diameter of the inorganic fluorescent material is more than 50 µm, it is very difficult to form a planarizing film and a gap (a gap (refractive index: 1.0) between the excitation light source 11 and the fluorescent layer 13 (refractive index: about 2.3)) is formed between the fluorescent layer 13 and the excitation light source 11. As a result, light emitted from the excitation light source 11 does not efficiently reach the fluorescent layer 13, which decreases the luminous efficiency of the fluorescent layer 13. Furthermore, it becomes difficult to planarize the fluorescent layer 13 and thus a liquid crystal layer cannot be formed (e.g., since the distance between electrodes that sandwich a liquid crystal layer varies and an electric field is not uniformly applied, the liquid crystal layer does not uniformly operates).

The fluorescent layer 13 can be formed by a publicly known wet process, for example, a coating method such as a spin coating method, a dipping method, a doctor blade method, a discharge coating method, or a spray coating method or a printing method such as an ink-jet method, a letterpress printing method, an intaglio printing method, a screen printing method, or a microgravure coating method, using a coating solution for forming fluorescent layers, the coating solution being prepared by dissolving or dispersing the above fluorescent material and a resin material in a solvent. Alternatively, the fluorescent layer 13 can be formed by subjecting the above fluorescent material to a publicly known dry process or a laser transfer method. Examples of the dry process include a resistance heating evaporation method, an electron beam (EB) deposition method, a molecular beam epitaxy (MBE) method, a sputtering method, and an organic vapor phase deposition (OVPD) method.

When a photosensitive resin can be used as the above polymer resin, the fluorescent layer 13 can be patterned by a photolithography method.

Examples of the photosensitive resin include photosensitive resins having a reactive vinyl group (photo-curable resist materials), such as acrylic acid resins, methacrylic acid resins, polyvinyl cinnamate resins, and ebonite resins. These photosensitive resins may be used alone or in combination as a mixture of two or more.

Alternatively, the fluorescent material can be directly patterned by a wet process such as an ink-jet method, a letterpress printing method, an intaglio printing method, a screen printing method, or a dispenser method; a publicly known dry process such as a resistance heating evaporation method that uses a shadow mask, an electron beam (EB) deposition method, a molecular beam epitaxy (MBE) method, a sputtering method, or an organic vapor phase deposition (OVPD) method; or a laser transfer method.

The binder resin material is preferably a light-transmissive resin. Examples of the resin material include acrylic resins, melamine resins, polyester resins, polyurethane resins, alkyd resins, epoxy resins, butyral resins, polysilicone resins, polyamide resins, polyimide resins, melanin resins, phenolic resins, polyvinyl alcohol, polyvinylhydrin, hydroxyethyl cellulose, carboxymethyl cellulose, aromatic sulfonamide resins, urea resins, benzoguanamine resins, triacetyl cellulose (TAC), polyethersulfone, polyetherketone, nylon, polystyrene, melamine beads, polycarbonate, polyvinyl chloride, polyvinylidene chloride, polyvinyl acetate, polyethylene, polymethyl methacrylate, polyMBS, intermediate density polyethylene, high density polyethylene, tetrafluoroethylene, polychlorotrifluoroethylene, and polytetrafluoroethylene.

The thickness of the fluorescent layer 13 is normally about 100 nm to 100 μm and preferably 1 μm to 100 μm. If the thickness is less than 100 nm, light emitted from the excitation light source 11 cannot be sufficiently absorbed. Therefore, the luminous efficiency is decreased and the color purity is degraded as a result of the mixing of blue transmitted light with the required color. The thickness is preferably 1 μm or more in order to improve the absorption of light emitted from the excitation light source 11 and reduce blue transmitted light to such a degree that the color purity is not adversely affected. Even if the thickness is more than 100 μm, the efficiency does not increase because blue light emitted from the excitation light source 11 is already sufficiently absorbed. This only consumes the material, which means an increase in the material cost.

The substrate 14 needs to pass through emitted light in an emission region of the fluorescent body because the light emitted from the fluorescent layer 13 needs to be output to the outside. Examples of the substrate 14 include inorganic material substrates composed of glass, quartz, and the like and plastic substrates composed of polyethylene terephthalate, polycarbazole, and polyimide. However, this embodiment is not limited thereto.

A plastic substrate is preferably used to allow the formation of a curbed portion or a bent portion without applying a stress. Furthermore, a substrate obtained by coating a plastic substrate with an inorganic material is more preferably used from the viewpoint of improving the gas barrier properties. The use of such a substrate can prevent the degradation of organic EL elements due to the permeation of moisture, the degradation being the largest problem posed when a plastic substrate is used as a substrate of an organic EL element (it is known that organic EL elements are degraded with a small amount of moisture).

A material containing a resin and light-scattering particles is used as a material (hereafter referred to as a "barrier material") for forming the barrier 15 or a material (hereafter referred to as a "light-scattering film material") for forming the light-scattering layer (light-scattering film) disposed on the side surface 15a of the barrier 15.

Examples of the resin include acrylic resins (refractive index: 1.49), melamine resins (refractive index: 1.57), nylon (refractive index: 1.53), polystyrene (refractive index: 1.60), melamine beads (refractive index: 1.57), polycarbonate (refractive index: 1.57), polyvinyl chloride (refractive index: 1.60), polyvinylidene chloride (refractive index: 1.61), polyvinyl acetate (refractive index: 1.46), polyethylene (refractive index: 1.53), polymethyl methacrylate (refractive index: 1.49), polyMBS (refractive index: 1.54), intermediate density polyethylene (refractive index: 1.53), high density polyethylene (refractive index: 1.54), tetrafluoroethylene (refractive index: 1.35), polychlorotrifluoroethylene (refractive index: 1.42), and polytetrafluoroethylene (refractive index: 1.35). However, this embodiment is not limited to these resins.

The light-scattering particles may be composed of either an inorganic material or an organic substrate.

When an inorganic material is used for the light-scattering particles, the light-scattering particles are, for example, particles (fine particles) mainly composed of an oxide of at least one metal selected from the group consisting of silicon, titanium, zirconium, aluminum, indium, zinc, tin, and antimony. However, this embodiment is not limited to these inorganic materials.

In the case where particles (inorganic fine particles) composed of an inorganic material are used as the light-scattering particles, examples of the light-scattering particles include silica beads (refractive index: 1.44), alumina beads (refractive index: 1.63), titanium oxide beads (refractive index of anatase type: 2.50, refractive index of rutile type: 2.70), zirconium oxide beads (refractive index: 2.05), zinc oxide beads (refractive index: 2.00), and barium titanate ($BaTiO_3$) (refractive index: 2.4). However, this embodiment is not limited to the above inorganic fine particles.

In the case where particles (organic fine particles) composed of an organic material are used as the light-scattering particles, examples of the light-scattering particles include polymethyl methacrylate beads (refractive index: 1.49), acrylic beads (refractive index: 1.50), acrylic-styrene copolymer beads (refractive index: 1.54), melamine beads (refractive index: 1.57), high-refractive-index melamine beads (refractive index: 1.65), polycarbonate beads (refractive index: 1.57), styrene beads (refractive index: 1.60), cross-linked polystyrene beads (refractive index: 1.61), polyvinyl chloride beads (refractive index: 1.60), benzoguanamine-melamine-formaldehyde beads (refractive index: 1.68), and silicone beads (refractive index: 1.50). However, this embodiment is not limited to the above organic fine particles.

The particle diameter of the light-scattering particles needs to be in a region of Mie scattering in order to effectively scatter blue light at the barrier 15. Therefore, the particle diameter of the light-scattering particles is preferably about 100 nm to 500 nm.

The barrier material and the light-scattering film material may contain a photopolymerization initiator and an antifoaming agent/leveling agent such as dipropylene glycol monomethyl ether or 1-(2-methoxy-2-methylethoxy)-2-propanol.

The barrier 15 may have a white color. Specifically, the barrier material and the light-scattering film material may contain a white resist.

An example of the white resist is a material containing a resin having a carboxyl group but not an aromatic ring, a photopolymerization initiator, a hydrogenated epoxy compound, a rutile-type titanium oxide, and a diluent.

By selecting an alkali-soluble resin as the resin for the barrier material and adding a photopolymerizable monomer, a photopolymerization initiator, a solvent, and the like, the barrier material and the light-scattering film material can be treated as photo resists. Thus, the barrier 15 or the light-scattering layer disposed on the side surface 15a of the barrier 15 can be patterned by a photolithography method.

The low-refractive-index layer 16 is disposed between the fluorescent layer 13 and the substrate 14 and is a layer having a property of decreasing the incident angle of fluorescence that enters the substrate 14 in the fluorescence isotropically emitted from the fluorescent layer 13.

Examples of a material for the low-refractive-index layer 16 include transparent materials such as a fluorocarbon resin with a refractive index of about 1.35 to 1.4, a silicone resin with a refractive index of about 1.4 to 1.5, silica aerogel with a refractive index of about 1.003 to 1.3, and a porous silica with a refractive index of about 1.2 to 1.3. However, this embodiment is not limited to the above materials.

The low-refractive-index layer 16 preferably has such a refractive index that the outgoing angle (refracting angle) of incident light that enters the substrate 14 from the low-refractive-index layer 16 is smaller than the critical angle of at least the incident light that can be output from the substrate 14 toward the outside. By allowing the fluorescence isotropically emitted from the fluorescent layer 13 to pass through the low-refractive-index layer 16, the light that enters the substrate 14 through the low-refractive-index layer 16 can be output to the outside with certainty. As a result, fluorescence can be considerably efficiently output to the outside.

The low-refractive-index layer 16 is obtained by uniformly forming a transparent material on one surface 14a of the substrate 14.

The refractive index of the low-refractive-index layer 16 is preferably in the range of 1.0 to 1.4.

If the refractive index of the low-refractive-index layer 16 is more than 1.4, the difference in refractive index between the substrate 14 and the low-refractive-index layer 16 decreases. Consequently, most of the light that enters the substrate 14 from the low-refractive-index layer 16 is reflected at the interface between the substrate 14 and the outside and thus cannot be output to the outside. For example, in the case where the light-emitting device 10 includes a plurality of separated fluorescent layers 13 each located in a predetermined region, the light reflected at the interface between the substrate 14 and the outside at least enters two adjacent fluorescent layers 13, which may cause the blurriness and fuzziness of display.

The refractive index of the low-refractive-index layer 16 is desirably as low as possible. To provide pores and gaps in the low-refractive-index layer 16 for the purpose of decreasing the refractive index, the low-refractive-index layer 16 is more preferably formed of silica aerogel, porous silica, or the like. Silica aerogel is particularly preferred because the refractive index of silica aerogel is extremely low.

As disclosed in U.S. Pat. No. 4,402,827, Japanese Patent No. 4279971, and Japanese Unexamined Patent Application Publication No. 2001-202827, silica aerogel is produced by drying a wet gel compound having a silica skeleton in the presence of a solvent such as an alcohol or carbon dioxide in a supercritical state that exceeds the critical point of the solvent, the gel compound being obtained by hydrolysis and polymerization of alkoxysilane.

The thickness of the low-refractive-index layer 16 is preferably in the range of 100 nm to 50 μm.

A low-refractive-index layer having a thickness of more than 50 μm increases the traveling distance of the light that diagonally enters the low-refractive-index layer 16 from the fluorescent layer 13 and travels in a horizontal direction relative to the substrate 14 (in a direction perpendicular to the thickness direction of the substrate 14) until the light reaches the interface between the low-refractive-index layer 16 and the substrate 14. Consequently, the light-emitting region of the fluorescence output to the outside from the substrate 14 becomes larger than the emission region of the fluorescent layer 13 itself, which is not preferred for high-definition display apparatuses and the like. Furthermore, since the production process may also be affected, the low-refractive-index layer 16 is preferably a thin film.

The low-refractive-index layer 16 is preferably composed of a gas. As described above, the refractive index of the low-refractive-index layer 16 is desirably as low as possible. If the low-refractive-index layer 16 is formed of a material such as a solid, a liquid, or a gel, the lower limit of the refractive index is about 1.003 as described in U.S. Pat. No. 4,402,827, Japanese Patent No. 4279971, and Japanese Unexamined Patent Application Publication No. 2001-202827. On the other hand, when the low-refractive-index layer 16 is a gaseous layer composed of a gas such as oxygen or nitrogen, the refractive index can be set to 1.0. Consequently, the fluorescence that is isotropically emitted from the fluorescent layer 13 and enters the substrate 14 through the gaseous layer (low-refractive-index layer 16) can be output to the outside with certainty. Thus, fluorescence can be considerably efficiently output to the outside.

When the low-refractive-index layer 16 is the gaseous layer, a gas barrier film is preferably disposed at least on a surface of the fluorescent layer upon which the excitation light is incident to prevent the gas from leaking outside the light-emitting device 10. The gas barrier film can block gas.

The gas barrier film may be formed of, for example, silicon oxide ($SiO_2$) or silicon oxynitride (SiON) having a good light transmission property.

The light-absorbing layer 17 is composed of a material having a light-absorbing property and is formed in a region between adjacent pixels. The light-absorbing layer 17 can improve the contrast of display.

The thickness of the light-absorbing layer 17 is normally about 100 nm to 100 μm and is preferably 100 nm to 10 μm. The thickness of the light-absorbing layer 17 is preferably smaller than that of the fluorescent layer 13 to efficiently output, to the outside, the light that travels to the side surface of the fluorescent layer 13.

Light emission in the light-emitting device 10 will be described with reference to FIG. 1.

In the light-emitting device 10, when excitation light 21 enters the fluorescent layer 13 from the excitation light source 11, fluorescence from a fluorescent body is isotropically emitted from the fluorescent layer 13. Part of a fluorescent component 22 (indicated by a solid line in FIG. 1) emitted to the light-output side (front direction, substrate 14 side) among the fluorescent components emitted from the fluorescent layer 13 can be effectively output to the outside as emission light. A fluorescent component 23 (indicated by a broken line in FIG. 1) emitted in a direction toward the side surface 13a of the fluorescent layer 13 among the fluorescent components emitted from the fluorescent layer 13 is scattered at the side surface 15a of the barrier 15 having a light-scattering property, and part of the scattered light can be effectively output to the outside as emission light. On the other hand, among the fluorescent components emitted from the fluorescent layer 13, a fluorescent component 24 (indicated by a dot-and-dash line in FIG. 1) that is emitted at a large angle relative to the direction of the normal to the substrate 14 and is reflected at the interface between the fluorescent layer 13 and the low-refractive-index layer 16 and a fluorescent component 25 (indicated by a dash-dot-dot line in FIG. 1) emitted to the side opposite the light-output side of the fluorescent layer 13 are scattered at the side surface 15a of the barrier 15 having a light-scattering property and recycled as components that can be output to the substrate 14 side again.

If the light-emitting device 10 does not include the low-refractive-index layer 16, a fluorescent component emitted in a direction from the fluorescent layer 13 toward the side surface is recycled by the barrier 15 having a light-scattering property and thus can be efficiently guided to the substrate 14. However, since the incident angle of a fluorescent component that enters the substrate 14 is not controlled, most of the fluorescent component that enters the substrate 14 cannot be output to the outside. This increases the loss of emission. If the light-emitting device 10 does not include the barrier 15 having a light-scattering property, a fluorescent component emitted at a large angle relative to the direction of the normal to the substrate 14 among the fluorescent components emitted from the fluorescent layer 13 in a front direction (a direction toward the substrate 14) is reflected at the low-refractive-index layer 16 and prevented from entering the substrate 14, which can suppress the amount of a component lost in the substrate 14. However, since the fluorescent component reflected at the low-refractive-index layer 16 is not recycled, the loss of emission increases. That is, when the light-emitting device 10 includes the low-refractive-index layer 16 and the barrier 15 having a light-scattering property in a combined manner, the fluorescent component emitted from the fluorescent layer 13 can be considerably efficiently output to the outside.

As described above, in the light-emitting device 10, the barrier 15 has a light-scattering property at least in a portion that faces the fluorescent layer 13 and the low-refractive-index layer 16 having a refractive index lower than that of the substrate 14 is formed between the fluorescent layer 13 and the substrate 14. Therefore, the incident angle of light that can enter the substrate 14 from the fluorescent layer 13 can be controlled, and the light that enters the substrate 14 can be output to the light-output side (front direction, substrate 14 side) with certainty without being reflected at the interface between the substrate 14 and the outside. Consequently, the light utilization efficiency can be improved while the generation of the blurriness and fuzziness of display can be prevented. Furthermore, among the fluorescent components emitted from the fluorescent layer 13, the fluorescent component 24 that is reflected at the interface between the fluorescent layer 13 and the low-refractive-index layer 16 and the fluorescent component 25 emitted to the side (back surface side) opposite the light-output side of the fluorescent layer 13 are scattered at the side surface 15a of the barrier 15 having a light-scattering property and recycled as components that can be output to the substrate 14 side again. Therefore, the light utilization efficiency can be further improved.

(2) Second Embodiment

Figure 6:
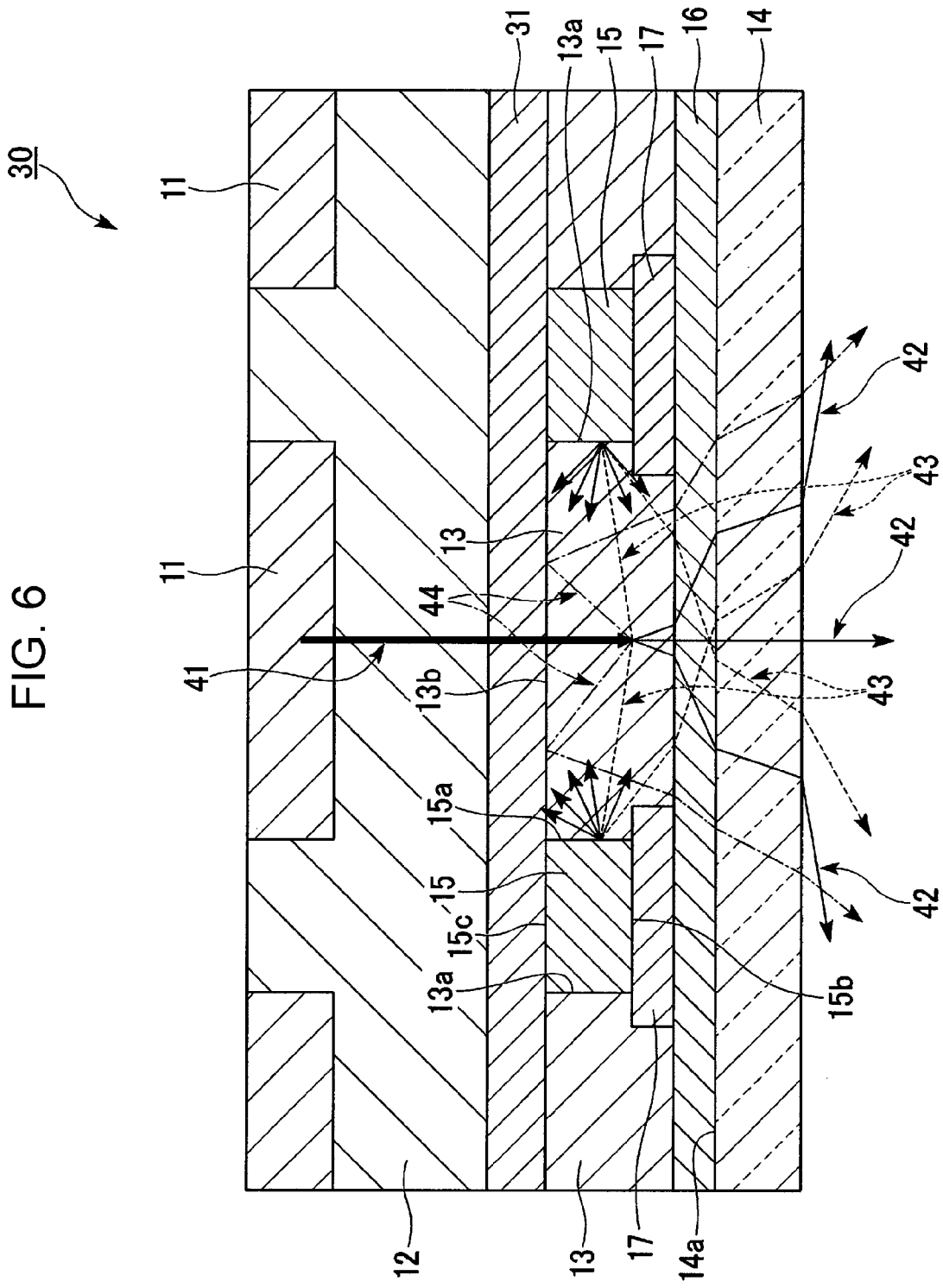
FIG. 6 is a schematic sectional view illustrating a second embodiment of the light-emitting device according to the present invention.

FIG. 6 is a schematic sectional view illustrating a second embodiment of a light-emitting device according to the present invention. In FIG. 6, the same constituent elements as those of the light-emitting device 10 illustrated in FIG. 1 are designated by the same reference numerals, and the descriptions thereof are omitted.

A light-emitting device 30 schematically includes an excitation light source 11, a substrate 14, a barrier 15, a low-refractive-index layer 16, a light-absorbing layer 17, and a wavelength-selective transmission/reflection layer 31. The excitation light source 11 emits excitation light. The substrate 14 is disposed so as to face the excitation light source 11 through a planarizing film 12. A fluorescent layer 13 that is excited by the excitation light to emit fluorescence is formed on the substrate 14. The barrier 15 surrounds side surfaces 13a of the fluorescent layer 13, the side surfaces 13a extending in a stacking direction of the excitation light source 11 and the substrate 14. The low-refractive-index layer 16 is formed between the fluorescent layer 13 and the substrate 14. The low-refractive-index layer 16 has a refractive index lower than that of the substrate 14. The light-absorbing layer 17 is formed between the low-refractive-index layer 16 and the barrier 15. The wavelength-selective transmission/reflection layer 31 is formed on an incident surface 13b side of the fluorescent layer 13 upon which the excitation light is incident.

Specifically, the wavelength-selective transmission/reflection layer 31 is formed on the incident surface 13b of the fluorescent layer 13 upon which the excitation light is incident and on an upper surface (a surface not facing the low-refractive-index layer 16) 15c of the barrier 15. The wavelength-selective transmission/reflection layer 31 is a layer configured to transmit at least light with a peak wavelength of the excitation light emitted from the excitation light source 11 and reflect at least light with an emission peak wavelength of the fluorescent layer 13.

Among the fluorescent components isotropically emitted from the fluorescent layer 13 in all directions, a fluorescent component emitted toward the back surface side of the light-emitting device 30 can be efficiently reflected in a front direction (to the substrate 14 side) by the wavelength-selective transmission/reflection layer 31 disposed on the incident surface 13b of the fluorescent layer 13. Thus, the luminous efficiency can be improved (the front luminance can be improved).

The wavelength-selective transmission/reflection layer 31 may be, for example, an inorganic material substrate composed of a dielectric multilayer film, metal thin film glass, or quartz or a plastic substrate composed of polyethylene terephthalate, polycarbazole, or polyimide. However, this embodiment is not limited thereto.

Light emission in the light-emitting device 30 will be described with reference to FIG. 6.

In the light-emitting device 30, when excitation light 41 enters the fluorescent layer 13 from the excitation light source 11, fluorescence from a fluorescent body is isotropically emitted from the fluorescent layer 13. Part of a fluorescent component 42 (indicated by a solid line in FIG. 6) emitted to the light-output side (front direction, substrate 14 side) among the fluorescent components emitted from the fluorescent layer 13 can be effectively output to the outside as emission light. A fluorescent component 43 (indicated by a broken line in FIG. 6) emitted in a direction toward the side surface 13a of the fluorescent layer 13 among the fluorescent components emitted from the fluorescent layer 13 is scattered at the side surface 15a of the barrier 15 having a light-scattering property, and part of the scattered light can be effectively output to the outside as emission light. A fluorescent component 44 (indicated by a dot-and-dash line in FIG. 6) that is emitted to the side (back surface side) opposite the light-output side of the fluorescent layer 13 is reflected toward the light-output side (front direction, substrate 14 side) at the interface between the fluorescent layer 13 and the wavelength-selective transmission/reflection layer 31 and can be effectively output to the outside as emission light.

As described above, in the light-emitting device 30, the barrier 15 has a light-scattering property at least in a portion that faces the fluorescent layer 13 and the low-refractive-index layer 16 having a refractive index lower than that of the substrate 14 is formed between the fluorescent layer 13 and the substrate 14. Therefore, the incident angle of light that can enter the substrate 14 from the fluorescent layer 13 can be controlled, and the light that enters the substrate 14 can be output to the outside with certainty without being reflected at the interface between the substrate 14 and the outside. Furthermore, since the wavelength-selective transmission/reflection layer 31 is formed on the incident surface 13b side of the fluorescent layer 13, the component 44 emitted to the back surface side among the fluorescent components emitted from the fluorescent layer 13 is reflected toward the light-output side (front direction, substrate 14 side) at the interface between the fluorescent layer 13 and the wavelength-selective transmission/reflection layer 31 and can be output to the outside with certainty. Consequently, the light utilization efficiency can be improved while the generation of the blurriness and fuzziness of display can be prevented.

(3) Third Embodiment

Figure 7:
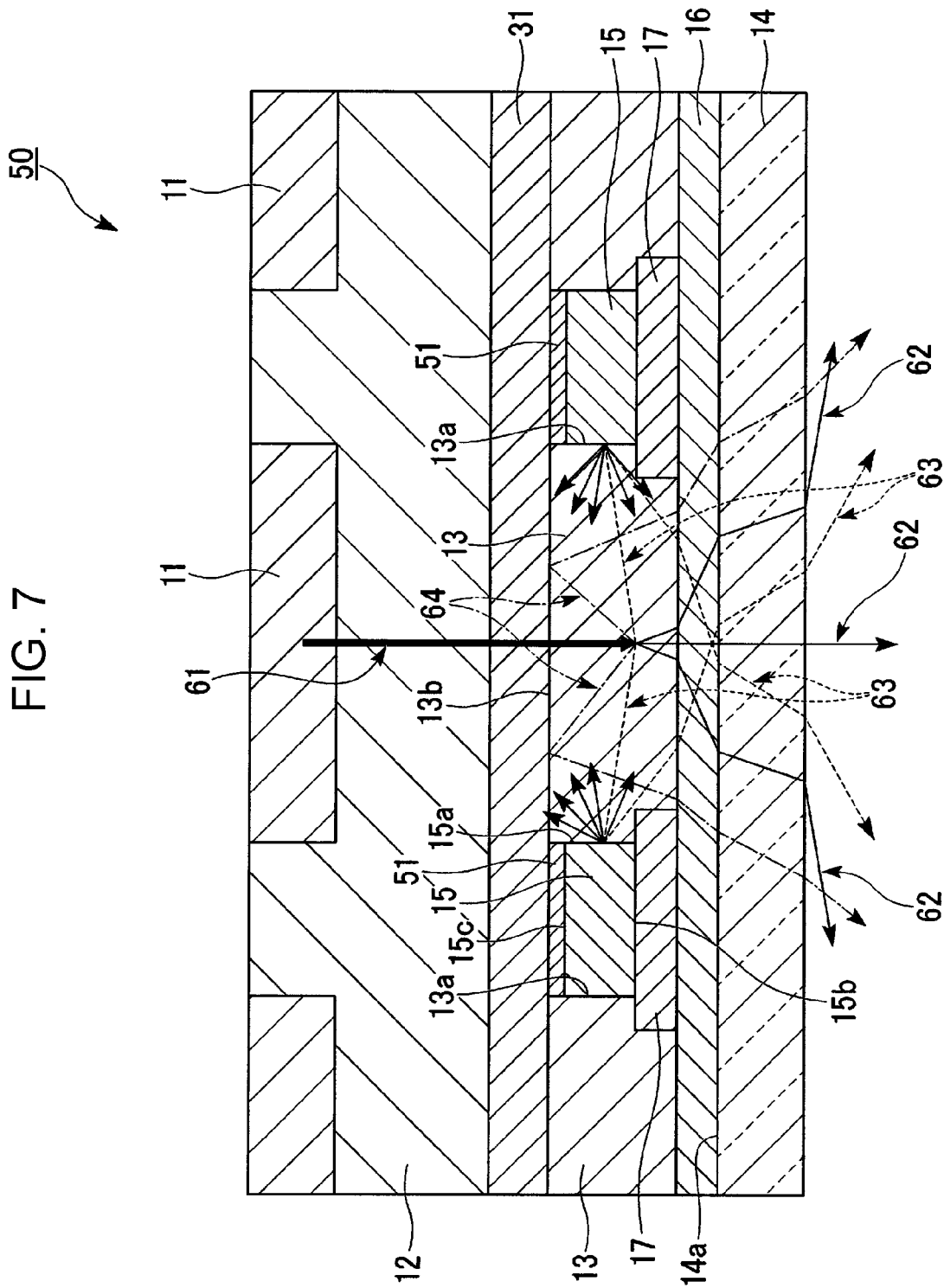
FIG. 7 is a schematic sectional view illustrating a third embodiment of the light-emitting device according to the present invention.

FIG. 7 is a schematic sectional view illustrating a third embodiment of a light-emitting device according to the present invention. In FIG. 7, the same constituent elements as those of the light-emitting device 10 illustrated in FIG. 1 and the light-emitting device 30 illustrated in FIG. 6 are designated by the same reference numerals, and the descriptions thereof are omitted.

A light-emitting device 50 schematically includes an excitation light source 11, a substrate 14, a barrier 15, a low-refractive-index layer 16, a light-absorbing layer 17, a wavelength-selective transmission/reflection layer 31, and a second light-absorbing layer 51. The excitation light source 11 emits excitation light. The substrate 14 is disposed so as to face the excitation light source 11 through a planarizing film 12. A fluorescent layer 13 that is excited by the excitation light to emit fluorescence is formed on the substrate 14. The barrier 15 surrounds side surfaces 13a of the fluorescent layer 13, the side surfaces 13a extending in a stacking direction of the excitation light source 11 and the substrate 14. The low-refractive-index layer 16 is formed between the fluorescent layer 13 and the substrate 14. The low-refractive-index layer 16 has a refractive index lower than that of the substrate 14. The light-absorbing layer 17 is formed between the low-refractive-index layer 16 and the barrier 15. The wavelength-selective transmission/reflection layer 31 is formed on an incident surface 13b side of the fluorescent layer 13 upon which the excitation light is incident. The second light-absorbing layer 51 is formed between the wavelength-selective transmission/reflection layer 31 and the barrier 15.

The second light-absorbing layer 51 is composed of the same material as the above light-absorbing layer 17.

Light emission in the light-emitting device 50 will be described with reference to FIG. 7.

In the light-emitting device 50, when excitation light 61 enters the fluorescent layer 13 from the excitation light source 11, fluorescence from a fluorescent body is isotropically emitted from the fluorescent layer 13. Part of a fluorescent component 62 (indicated by a solid line in FIG. 7) emitted to the light-output side (front direction, substrate 14 side) among the fluorescent components emitted from the fluorescent layer 13 can be effectively output to the outside as emission light. A fluorescent component 63 (indicated by a broken line in FIG. 7) emitted in a direction toward the side surface 13a of the fluorescent layer 13 among the fluorescent components emitted from the fluorescent layer 13 is scattered at the side surface 15a of the barrier 15 having a light-scattering property, and part of the scattered light can be effectively output to the outside as emission light. A fluorescent component 64 (indicated by a dot-and-dash line in FIG. 7) that is emitted to the side (back surface side) opposite the light-output side of the fluorescent layer 13 is reflected toward the light-output side (front direction, substrate 14 side) at the interface between the fluorescent layer 13 and the wavelength-selective transmission/reflection layer 31 and can be effectively output to the outside as emission light.

As described above, in the light-emitting device 50, the barrier 15 has a light-scattering property at least in a portion that faces the fluorescent layer 13 and the low-refractive-index layer 16 having a refractive index lower than that of the substrate 14 is formed between the fluorescent layer 13 and the substrate 14. Therefore, the incident angle of light that can enter the substrate 14 from the fluorescent layer 13 can be controlled, and the light that enters the substrate 14 can be output to the outside with certainty without being reflected at the interface between the substrate 14 and the outside. Furthermore, since the wavelength-selective transmission/reflection layer 31 is formed on the incident surface 13b side of the fluorescent layer 13, the component 64 emitted to the back surface side among the fluorescent components emitted from the fluorescent layer 13 is reflected toward the light-output side (front direction, substrate 14 side) at the interface between the fluorescent layer 13 and the wavelength-selective transmission/reflection layer 31 and can be output to the outside with certainty. Consequently, the light utilization efficiency can be improved while the generation of the blurriness and fuzziness of display can be prevented. Furthermore, since the second light-absorbing layer 51 is formed between the wavelength-selective transmission/reflection layer 31 and the barrier 15, the contrast of display can be further improved.

(4) Fourth Embodiment

Figure 8:
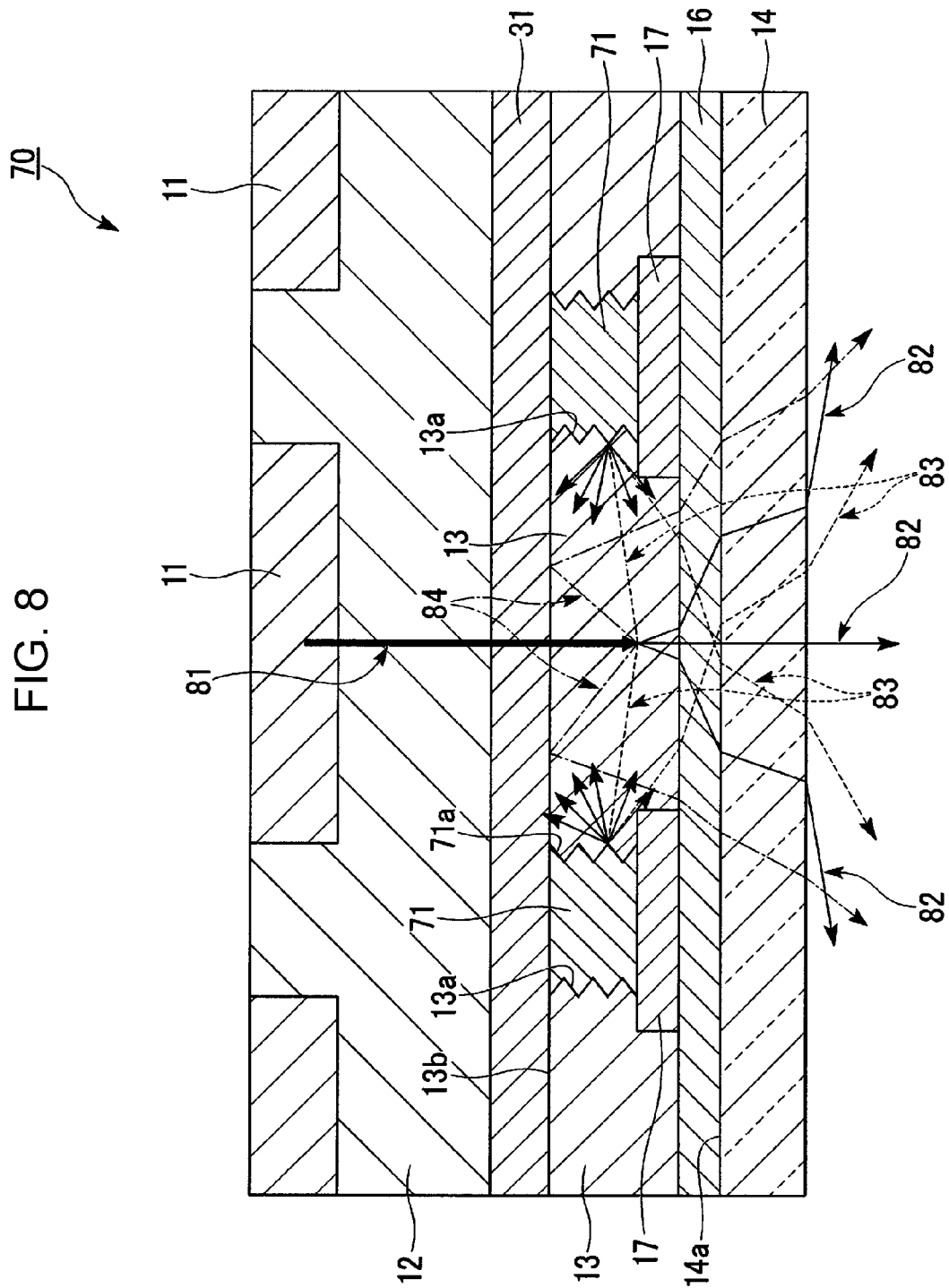
FIG. 8 is a schematic sectional view illustrating a fourth embodiment of the light-emitting device according to the present invention.

FIG. 8 is a schematic sectional view illustrating a fourth embodiment of a light-emitting device according to the present invention. In FIG. 8, the same constituent elements as those of the light-emitting device 10 illustrated in FIG. 1 and the light-emitting device 30 illustrated in FIG. 6 are designated by the same reference numerals, and the descriptions thereof are omitted.

A light-emitting device 70 schematically includes an excitation light source 11, a substrate 14, a barrier 71, a low-refractive-index layer 16, a light-absorbing layer 17, and a wavelength-selective transmission/reflection layer 31. The excitation light source 11 emits excitation light. The substrate 14 is disposed so as to face the excitation light source 11 through a planarizing film 12. A fluorescent layer 13 that is excited by the excitation light to emit fluorescence is formed on the substrate 14. The barrier 71 surrounds side surfaces 13a of the fluorescent layer 13, the side surfaces 13a extending in a stacking direction of the excitation light source 11 and the substrate 14. The low-refractive-index layer 16 is formed between the fluorescent layer 13 and the substrate 14. The low-refractive-index layer 16 has a refractive index lower than that of the substrate 14. The light-absorbing layer 17 is formed between the low-refractive-index layer 16 and the barrier 15. The wavelength-selective transmission/reflection layer 31 is formed on an incident surface 13b side of the fluorescent layer 13 upon which the excitation light is incident.

The barrier 71 has a light-scattering property at least in a portion (a side surface 71a of the barrier 71) that faces the fluorescent layer 13.

Examples of a structure in which the barrier 71 has a light-scattering property include a structure in which the barrier 71 itself is formed of a material containing a resin and light-scattering particles and a structure in which a light-scattering layer (light-scattering film) formed of a material containing a resin and light-scattering particles is disposed on a side surface 71a of the barrier 71.

In the barrier 71, at least the portion (the side surface 71a of the barrier 71) that faces the fluorescent layer 13 has irregularities. Specifically, the side surface 71a of the barrier 71 has irregularities formed by connecting V-shaped grooves when viewed in cross section. However, this embodiment is not limited to the irregularities. The irregularities of the side surface 71a of the barrier 71 may have any shape as long as the fluorescence emitted from the fluorescent layer 13 can be efficiently reflected.

A barrier material for forming the barrier 71 or a light-scattering film material for forming the light-scattering layer (light-scattering film) disposed on the side surface 71a of the barrier 71 may be the same material as the barrier 15.

Light emission in the light-emitting device 70 will be described with reference to FIG. 8.

In the light-emitting device 70, when excitation light 81 enters the fluorescent layer 13 from the excitation light source 11, fluorescence from a fluorescent body is isotropically emitted from the fluorescent layer 13. Part of a fluorescent component 82 (indicated by a solid line in FIG. 8) emitted to the light-output side (front direction, substrate 14 side) among the fluorescent components emitted from the fluorescent layer 13 can be effectively output to the outside as emission light. A fluorescent component 83 (indicated by a broken line in FIG. 8) emitted in a direction toward the side surface 13a of the fluorescent layer 13 among the fluorescent components emitted from the fluorescent layer 13 is scattered at the side surface 71a of the barrier 71 having a light-scattering property, and part of the scattered light can be effectively output to the outside as emission light. A fluorescent component 84 (indicated by a dot-and-dash line in FIG. 8) that is emitted to the side (back surface side) opposite the light-output side of the fluorescent layer 13 is reflected toward the light-output side (front direction, substrate 14 side) at the interface between the fluorescent layer 13 and the wavelength-selective transmission/reflection layer 31 and can be effectively output to the outside as emission light.

As described above, in the light-emitting device 70, the barrier 71 has a light-scattering property at least in a portion that faces the fluorescent layer 13 and has irregularities at least in a portion that faces the fluorescent layer 13, and the low-refractive-index layer 16 having a refractive index lower than that of the substrate 14 is formed between the fluorescent layer 13 and the substrate 14. Therefore, the incident angle of light that can enter the substrate 14 from the fluorescent layer 13 can be controlled, and the light that enters the substrate 14 can be output to the outside with certainty without being reflected at the interface between the substrate 14 and the outside. Furthermore, since the wavelength-selective transmission/reflection layer 31 is formed on the incident surface 13b side of the fluorescent layer 13, the fluorescent component 84 emitted to the back surface side among the fluorescent components emitted from the fluorescent layer 13 is reflected toward the light-output side (front direction, substrate 14 side) at the interface between the fluorescent layer 13 and the wavelength-selective transmission/reflection layer 31 and can be output to the outside with certainty. Consequently, the light utilization efficiency can be improved while the generation of the blurriness and fuzziness of display can be prevented.

(5) Fifth Embodiment

Figure 9:
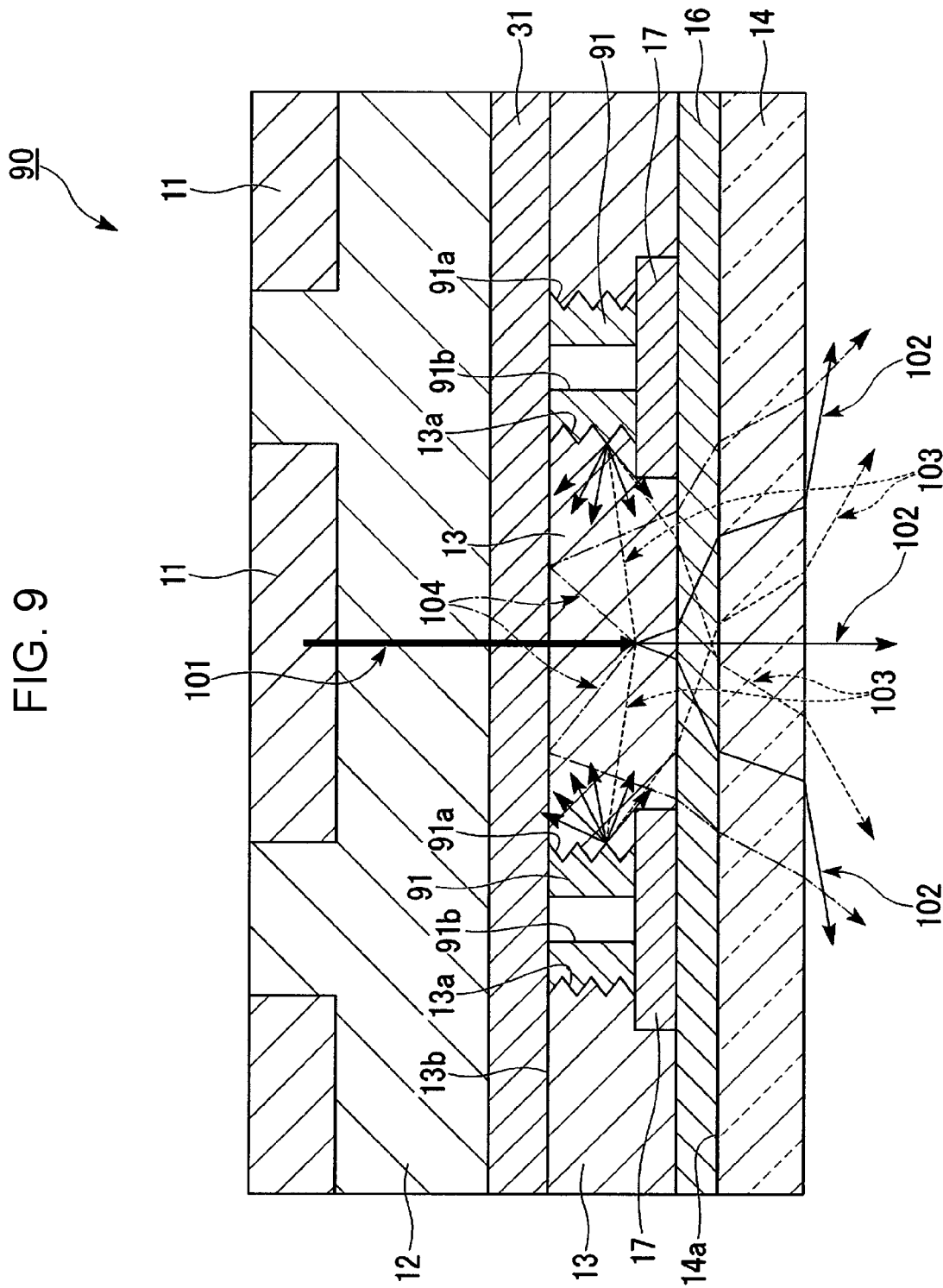
FIG. 9 is a schematic sectional view illustrating a fifth embodiment of the light-emitting device according to the present invention.

FIG. 9 is a schematic sectional view illustrating a fifth embodiment of a light-emitting device according to the present invention. In FIG. 9, the same constituent elements as those of the light-emitting device 10 illustrated in FIG. 1 and the light-emitting device 30 illustrated in FIG. 6 are designated by the same reference numerals, and the descriptions thereof are omitted.

A light-emitting device 90 schematically includes an excitation light source 11, a substrate 14, a barrier 91, a low-refractive-index layer 16, a light-absorbing layer 17, and a wavelength-selective transmission/reflection layer 31. The excitation light source 11 emits excitation light. The substrate 14 is disposed so as to face the excitation light source 11 through a planarizing film 12. A fluorescent layer 13 that is excited by the excitation light to emit fluorescence is formed on the substrate 14. The barrier 91 surrounds side surfaces 13a of the fluorescent layer 13, the side surfaces 13a extending in a stacking direction of the excitation light source 11 and the substrate 14. The low-refractive-index layer 16 is formed between the fluorescent layer 13 and the substrate 14. The low-refractive-index layer 16 has a refractive index lower than that of the substrate 14. The light-absorbing layer 17 is formed between the low-refractive-index layer 16 and the barrier 15. The wavelength-selective transmission/reflection layer 31 is formed on an incident surface 13b side of the fluorescent layer 13 upon which the excitation light is incident.

The barrier 91 has a light-scattering property at least in a portion (a side surface 91a of the barrier 91) that faces the fluorescent layer 13.

Examples of a structure in which the barrier 91 has a light-scattering property include a structure in which the barrier 91 itself is formed of a material containing a resin and light-scattering particles and a structure in which a light-scattering layer (light-scattering film) formed of a material containing a resin and light-scattering particles is disposed on a side surface 91a of the barrier 91.

In the barrier 91, at least the portion (the side surface 91a of the barrier 91) that faces the fluorescent layer 13 has irregularities. Specifically, the side surface 91a of the barrier 91 has irregularities formed by connecting V-shaped grooves when viewed in cross section. However, this embodiment is not limited to the irregularities. The irregularities of the side surface 91a of the barrier 91 may have any shape as long as the fluorescence emitted from the fluorescent layer 13 can be efficiently reflected.

A barrier material for forming the barrier 91 or a light-scattering film material for forming the light-scattering layer (light-scattering film) disposed on the side surface 91a of the barrier 91 may be same material as the barrier 15.

An opening 91b that penetrates through the barrier 91 in its thickness direction is formed in the central portion of the barrier 91.

Light emission in the light-emitting device 90 will be described with reference to FIG. 9.

In the light-emitting device 90, when excitation light 101 enters the fluorescent layer 13 from the excitation light source 11, fluorescence from a fluorescent body is isotropically emitted from the fluorescent layer 13. Part of a fluorescent component 102 (indicated by a solid line in FIG. 9) emitted to the light-output side (front direction, substrate 14 side) among the fluorescent components emitted from the fluorescent layer 13 can be effectively output to the outside as emission light. A fluorescent component 103 (indicated by a broken line in FIG. 9) emitted in a direction toward the side surface 13a of the fluorescent layer 13 among the fluorescent components emitted from the fluorescent layer 13 is scattered at the side surface 91a of the barrier 91 having a light-scattering property, and part of the scattered light can be effectively output to the outside as emission light. A fluorescent component 104 (indicated by a dot-and-dash line in FIG. 9) that is emitted to the side (back surface side) opposite the light-output side of the fluorescent layer 13 is reflected toward the light-output side (front direction, substrate 14 side) at the interface between the fluorescent layer 13 and the wavelength-selective transmission/reflection layer 31 and can be effectively output to the outside as emission light.

As described above, in the light-emitting device 90, the barrier 91 has a light-scattering property at least in a portion that faces the fluorescent layer 13 and has irregularities at least in a portion that faces the fluorescent layer 13, and the low-refractive-index layer 16 having a refractive index lower than that of the substrate 14 is formed between the fluorescent layer 13 and the substrate 14. Therefore, the incident angle of light that can enter the substrate 14 from the fluorescent layer 13 can be controlled, and the light that enters the substrate 14 can be output to the outside with certainty without being reflected at the interface between the substrate 14 and the outside. Furthermore, since the wavelength-selective transmission/reflection layer 31 is formed on the incident surface 13b side of the fluorescent layer 13, the fluorescent component 104 emitted to the back surface side among the fluorescent components emitted from the fluorescent layer 13 is reflected toward the light-output side (front direction, substrate 14 side) at the interface between the fluorescent layer 13 and the wavelength-selective transmission/reflection layer 31 and can be output to the outside with certainty. Consequently, the light utilization efficiency can be improved while the generation of the blurriness and fuzziness of display can be prevented. Furthermore, since the opening 91b is formed in the barrier 91, the weight of the light-emitting device 90 can be decreased and the amount of the barrier 91 used can also be decreased.

(6) Sixth Embodiment

Figure 10:
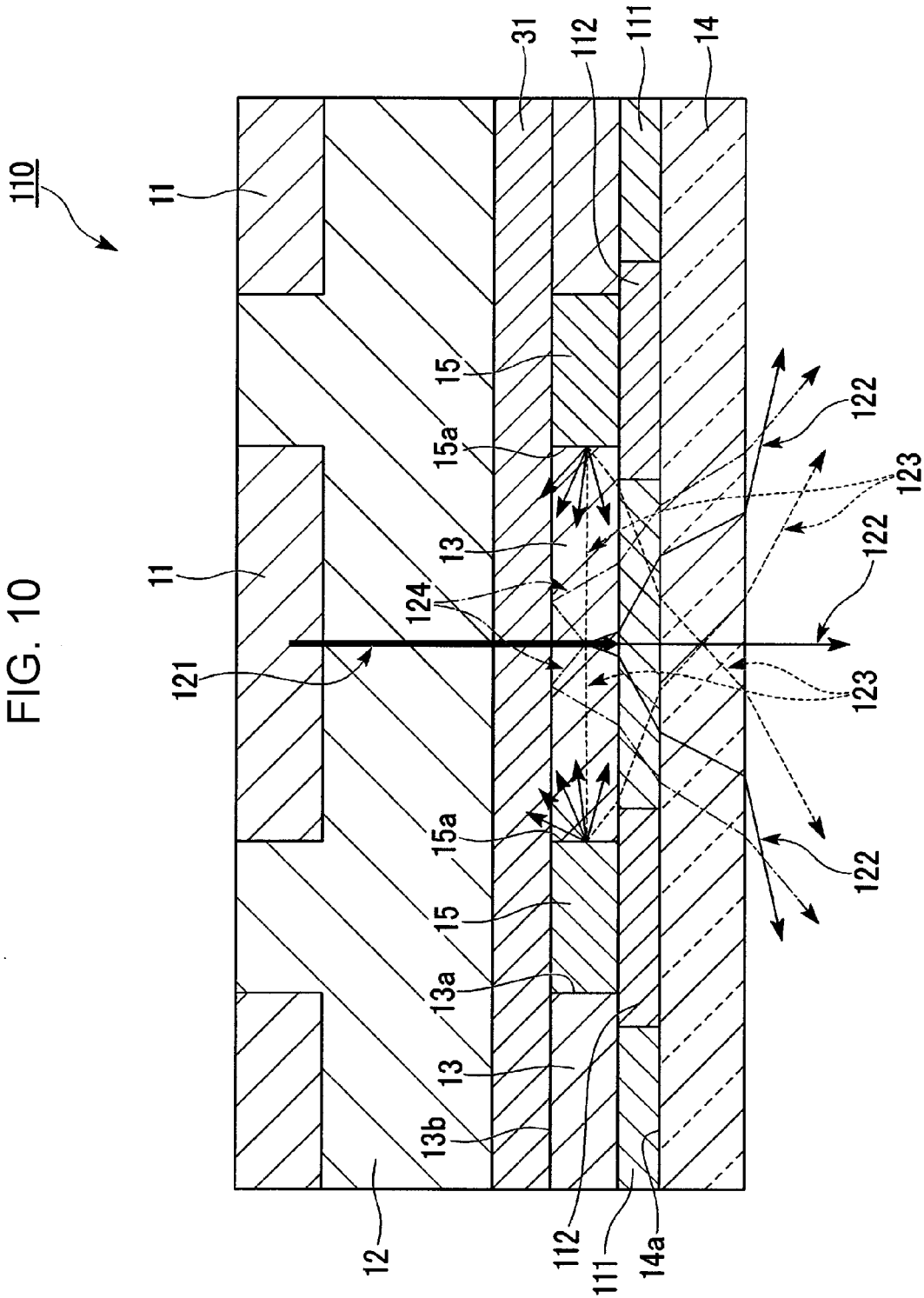
FIG. 10 is a schematic sectional view illustrating a sixth embodiment of the light-emitting device according to the present invention.

FIG. 10 is a schematic sectional view illustrating a sixth embodiment of a light-emitting device according to the present invention. In FIG. 10, the same constituent elements as those of the light-emitting device 10 illustrated in FIG. 1 and the light-emitting device 30 illustrated in FIG. 6 are designated by the same reference numerals, and the descriptions thereof are omitted.

A light-emitting device 110 schematically includes an excitation light source 11, a substrate 14, a barrier 15, a low-refractive-index layer 111, a light-absorbing layer 112, and a wavelength-selective transmission/reflection layer 31. The excitation light source 11 emits excitation light. The substrate 14 is disposed so as to face the excitation light source 11 through a planarizing film 12. A fluorescent layer 13 that is excited by the excitation light to emit fluorescence is formed on the substrate 14. The barrier 15 surrounds side surfaces 13a of the fluorescent layer 13, the side surfaces 13a extending in a stacking direction of the excitation light source 11 and the substrate 14. The low-refractive-index layer 111 is constituted by a plurality of separated low-refractive-index layers each located in a predetermined region, the low-refractive-index layers being disposed between the fluorescent layer 13 and the substrate 14. The low-refractive-index layer 111 has a refractive index lower than that of the substrate 14. The light-absorbing layer 112 is formed between the substrate 14 and the barrier 15. The wavelength-selective transmission/reflection layer 31 is formed on an incident surface 13b side of the fluorescent layer 13 upon which the excitation light is incident.

The low-refractive-index layer 111 is constituted by a plurality of separated low-refractive-index layers each located in a predetermined region on one surface 14a of the substrate 14. In the plurality of separated low-refractive-index layers 111, the light-absorbing layer 112 is formed between the two adjacent separated low-refractive-index layers 111.

The low-refractive-index layer 111 is composed of the same material as the above low-refractive-index layer 16.

The light-absorbing layer 112 is composed of the same material as the above light-absorbing layer 17.

Light emission in the light-emitting device 110 will be described with reference to FIG. 10.

In the light-emitting device 110, when excitation light 121 enters the fluorescent layer 13 from the excitation light source 11, fluorescence from a fluorescent body is isotropically emitted from the fluorescent layer 13. Part of a fluorescent component 122 (indicated by a solid line in FIG. 10) emitted to the light-output side (front direction, substrate 14 side) among the fluorescent components emitted from the fluorescent layer 13 can be effectively output to the outside as emission light. A fluorescent component 123 (indicated by a broken line in FIG. 10) emitted in a direction toward the side surface 13a of the fluorescent layer 13 among the fluorescent components emitted from the fluorescent layer 13 is scattered at the side surface 15a of the barrier 15 having a light-scattering property, and part of the scattered light can be effectively output to the outside as emission light. A fluorescent component 124 (indicated by a dot-and-dash line in FIG. 10) that is emitted to the side (back surface side) opposite the light-output side of the fluorescent layer 13 is reflected toward the light-output side (front direction, substrate 14 side) at the interface between the fluorescent layer 13 and the wavelength-selective transmission/reflection layer 31 and can be effectively output to the outside as emission light.

As described above, in the light-emitting device 110, the barrier 15 has a light-scattering property at least in a portion that faces the fluorescent layer 13 and the low-refractive-index layer 111 having a refractive index lower than that of the substrate 14 is formed between the fluorescent layer 13 and the substrate 14. Therefore, the incident angle of light that can enter the substrate 14 from the fluorescent layer 13 can be controlled, and the light that enters the substrate 14 can be output to the outside with certainty without being reflected at the interface between the substrate 14 and the outside. Furthermore, since the wavelength-selective transmission/reflection layer 31 is formed on the incident surface 13b side of the fluorescent layer 13, the fluorescent component 124 emitted to the back surface side among the fluorescent components emitted from the fluorescent layer 13 is reflected at the interface between the fluorescent layer 13 and the wavelength-selective transmission/reflection layer 31 and can be output to the outside with certainty (front direction, substrate 14 side). Consequently, the light utilization efficiency can be improved while the generation of the blurriness and fuzziness of display can be prevented. Furthermore, since the low-refractive-index layer 111 and the light-absorbing layer 112 are formed on the same surface (one surface 14a) of the substrate 14, the total thickness of the light-emitting device 110 can be decreased.

(7) Seventh Embodiment

Figure 11:
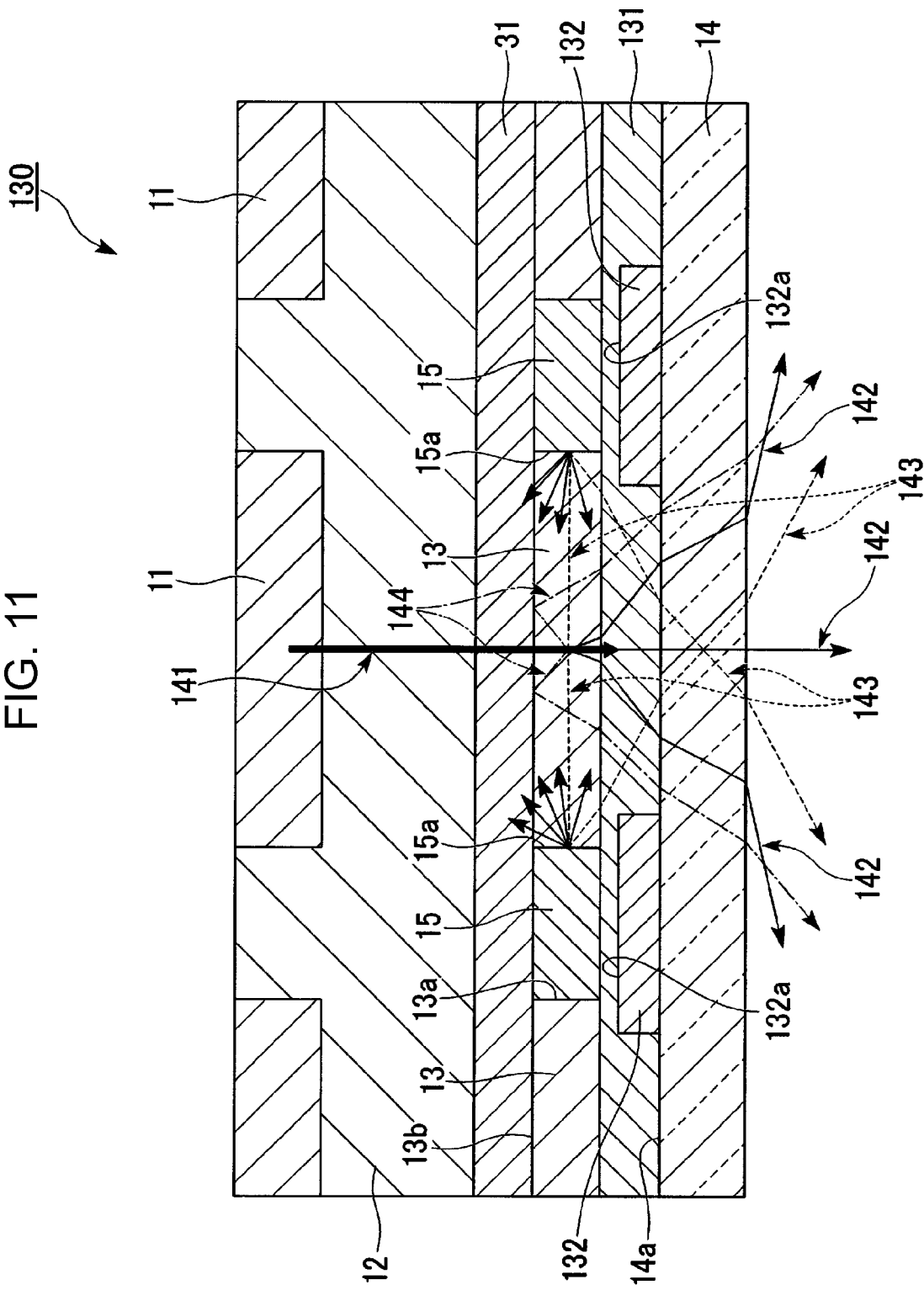
FIG. 11 is a schematic sectional view illustrating a seventh embodiment of the light-emitting device according to the present invention.

FIG. 11 is a schematic sectional view illustrating a seventh embodiment of a light-emitting device according to the present invention. In FIG. 11, the same constituent elements as those of the light-emitting device 10 illustrated in FIG. 1 and the light-emitting device 30 illustrated in FIG. 6 are designated by the same reference numerals, and the descriptions thereof are omitted.

A light-emitting device 130 schematically includes an excitation light source 11, a substrate 14, a barrier 15, a low-refractive-index layer 131, a light-absorbing layer 132, and a wavelength-selective transmission/reflection layer 31. The excitation light source 11 emits excitation light. The substrate 14 is disposed so as to face the excitation light source 11 through a planarizing film 12. A fluorescent layer 13 that is excited by the excitation light to emit fluorescence is formed on the substrate 14. The barrier 15 surrounds side surfaces 12a of the fluorescent layer 13, the side surfaces 12a extending in a stacking direction of the excitation light source 11 and the substrate 14. The low-refractive-index layer 131 is formed between the fluorescent layer 13 and the substrate 14. The low-refractive-index layer 131 has a refractive index lower than that of the substrate 14. The light-absorbing layer 132 is formed between the substrate 14 and the barrier 15 so that a surface (upper surface) 132a facing the fluorescent layer 13 is covered with the low-refractive-index layer 131. The wavelength-selective transmission/reflection layer 31 is formed on an incident surface 12b side of the fluorescent layer 13 upon which the excitation light is incident.

Specifically, the light-absorbing layer 132 is formed in a region sandwiched between the substrate 14 and the barrier 15, the region being located on one surface 14a of the substrate 14, and the surface (upper surface) 132a of the light-absorbing layer 132 that faces the fluorescent layer 13 is covered with the low-refractive-index layer 131. That is, the low-refractive-index layer 131 is present between the barrier 15 and the light-absorbing layer 132 formed on the one surface of the substrate 14.

The low-refractive-index layer 131 is composed of the same material as the above low-refractive-index layer 16. The light-absorbing layer 132 is composed of the same material as the above light-absorbing layer 17.

Light emission in the light-emitting device 130 will be described with reference to FIG. 11.

In the light-emitting device 130, when excitation light 141 enters the fluorescent layer 13 from the excitation light source 11, fluorescence from a fluorescent body is isotropically emitted from the fluorescent layer 13. Part of a fluorescent component 142 (indicated by a solid line in FIG. 11) emitted to the light-output side (front direction, substrate 14 side) among the fluorescent components emitted from the fluorescent layer 13 can be effectively output to the outside as emission light. A fluorescent component 143 (indicated by a broken line in FIG. 11) emitted in a direction toward the side surface 13a of the fluorescent layer 13 among the fluorescent components emitted from the fluorescent layer 13 is scattered at the side surface 15a of the barrier 15 having a light-scattering property, and part of the scattered light can be effectively output to the outside as emission light. A fluorescent component 144 (indicated by a dot-and-dash line in FIG. 11) that is emitted to the side (back surface side) opposite the light-output side of the fluorescent layer 13 is reflected toward the light-output side (front direction, substrate 14 side) at the interface between the fluorescent layer 13 and the wavelength-selective transmission/reflection layer 31 and can be effectively output to the outside as emission light.

As described above, in the light-emitting device 130, the barrier 15 has a light-scattering property at least in a portion that faces the fluorescent layer 13 and the low-refractive-index layer 131 having a refractive index lower than that of the substrate 14 is formed between the fluorescent layer 13 and the substrate 14. Therefore, the incident angle of light that can enter the substrate 14 from the fluorescent layer 13 can be controlled, and the light that enters the substrate 14 can be output to the outside with certainty without being reflected at the interface between the substrate 14 and the outside. Furthermore, since the wavelength-selective transmission/reflection layer 31 is formed on the incident surface 13b side of the fluorescent layer 13, the fluorescent component 144 emitted to the back surface side among the fluorescent components emitted from the fluorescent layer 13 is reflected toward the light-output side (front direction, substrate 14 side) at the interface between the fluorescent layer 13 and the wavelength-selective transmission/reflection layer 31 and can be output to the outside with certainty. Consequently, the light utilization efficiency can be improved while the generation of the blurriness and fuzziness of display can be prevented. Furthermore, since the light-absorbing layer 132 is formed in a region sandwiched between the substrate 14 and the barrier 15, the region being located on one surface 14a of the substrate 14, and the surface 132a of the light-absorbing layer 132 that faces the fluorescent layer 13 is covered with the low-refractive-index layer 131, the fluorescent layer 13 is uniformly formed on the flat low-refractive-index layer 131. Therefore, the degree of adhesion between the low-refractive-index layer 131 and the fluorescent layer 13 is increased and the loss of light at the interface between the low-refractive-index layer 131 and the fluorescent layer 13 is minimized. Thus, fluorescence can be considerably efficiently output to the outside.

(8) Eighth Embodiment

Figure 12:
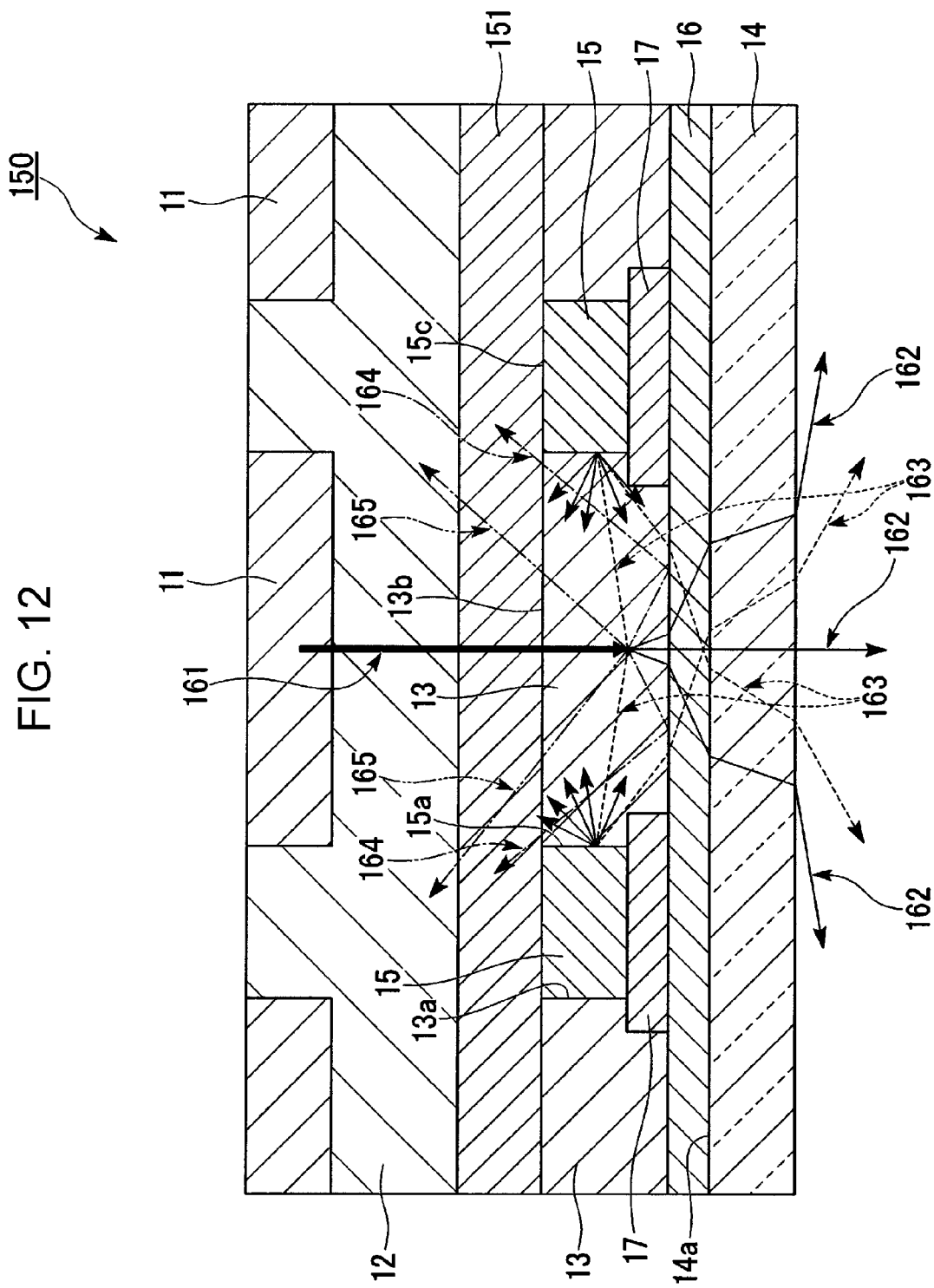
FIG. 12 is a schematic sectional view illustrating an eighth embodiment of the light-emitting device according to the present invention.

FIG. 12 is a schematic sectional view illustrating an eighth embodiment of a light-emitting device according to the present invention. In FIG. 12, the same constituent elements as those of the light-emitting device 10 illustrated in FIG. 1 are designated by the same reference numerals, and the descriptions thereof are omitted.

A light-emitting device 150 schematically includes an excitation light source 11, a substrate 14, a barrier 15, a low-refractive-index layer 16, a light-absorbing layer 17, and a second substrate 151. The excitation light source 11 emits excitation light. The substrate 14 is disposed so as to face the excitation light source 11 through a planarizing film 12. A fluorescent layer 13 that is excited by the excitation light to emit fluorescence is formed on the substrate 14. The barrier 15 surrounds side surfaces 13a of the fluorescent layer 13, the side surfaces 13a extending in a stacking direction of the excitation light source 11 and the substrate 14. The low-refractive-index layer 16 is formed between the fluorescent layer 13 and the substrate 14. The low-refractive-index layer 16 has a refractive index lower than that of the substrate 14. The light-absorbing layer 17 is formed between the low-refractive-index layer 16 and the barrier 15. The second substrate 151 is formed on an incident surface 13b side of the fluorescent layer 13 upon which the excitation light is incident.

Specifically, the second substrate 151 faces the excitation light source 11 and is formed on the incident surface 13b of the fluorescent layer 13 upon which the excitation light is incident and on an upper surface (a surface not facing the low-refractive-index layer 16) 15c of the barrier 15.

The same substrate as the above substrate 14 is used as the second substrate 151.

Light emission in the light-emitting device 150 will be described with reference to FIG. 12.

In the light-emitting device 150, when excitation light 161 enters the fluorescent layer 13 from the excitation light source 11, fluorescence from a fluorescent body is isotropically emitted from the fluorescent layer 13. Part of a fluorescent component 162 (indicated by a solid line in FIG. 12) emitted to the light-output side (front direction, substrate 14 side) among the fluorescent components emitted from the fluorescent layer 13 can be effectively output to the outside as emission light. A fluorescent component 163 (indicated by a broken line in FIG. 12) emitted in a direction toward the side surface 13a of the fluorescent layer 13 among the fluorescent components emitted from the fluorescent layer 13 is scattered at the side surface 15a of the barrier 15 having a light-scattering property, and part of the scattered light can be effectively output to the outside as emission light. Among the fluorescent components emitted from the fluorescent layer 13, a fluorescent component 164 (indicated by a dot-and-dash line in FIG. 12) that is emitted at a large angle relative to the direction of the normal to the substrate 14 and is reflected at the interface between the fluorescent layer 13 and the substrate 14 and a fluorescent component 165 (indicated by a dash-dot-dot line in FIG. 12) emitted to the side opposite the light-output side of the fluorescent layer 13 are scattered at the side surface 15a of the barrier 15 having a light-scattering property and recycled as components that can be output to the substrate 14 side again.

As described above, in the light-emitting device 150, the barrier 15 has a light-scattering property at least in a portion that faces the fluorescent layer 13 and the low-refractive-index layer 16 having a refractive index lower than that of the substrate 14 is formed between the fluorescent layer 13 and the substrate 14. Therefore, the incident angle of light that can enter the substrate 14 from the fluorescent layer 13 can be controlled, and the light that enters the substrate 14 can be output to the outside with certainty without being reflected at the interface between the substrate 14 and the outside. Consequently, the light utilization efficiency can be improved while the generation of the blurriness and fuzziness of display can be prevented. Furthermore, by using the second substrate 151, the light-emitting device 150 is made to have a structure surrounded by two substrates (substrate 14 and second substrate 151), which can improve the strength of the device. Moreover, in the structure including the second substrate 151, the barrier 15 and the fluorescent layer 13 can be formed from the second substrate 151 side, which allows to conduct a process in which a gaseous layer, which is an ideal low-refractive-index layer, is very easily formed between the substrate 14 and the fluorescent layer 13 (refer to Example 3).

(9) Ninth Embodiment

Figure 13:
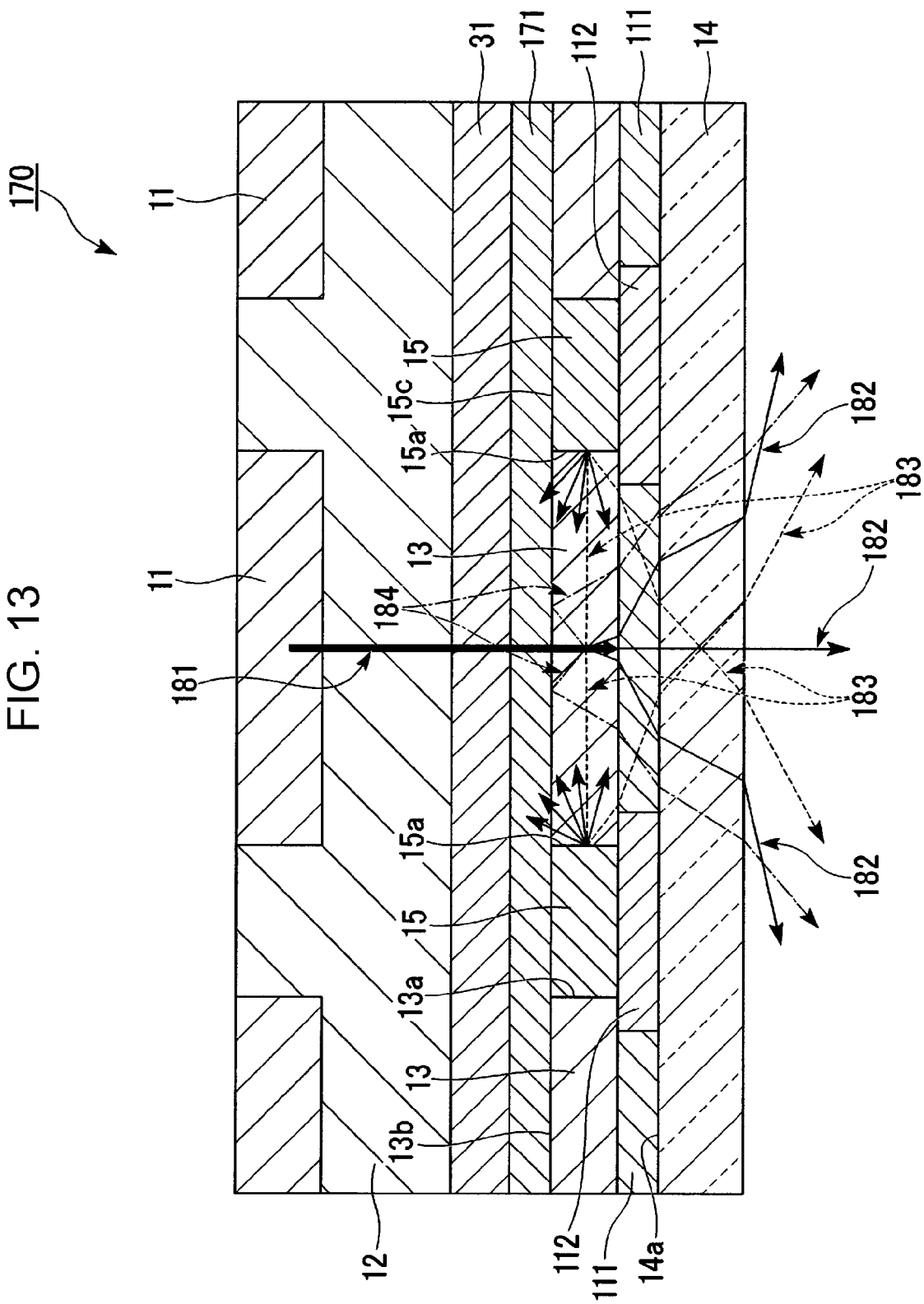
FIG. 13 is a schematic sectional view illustrating a ninth embodiment of the light-emitting device according to the present invention.

FIG. 13 is a schematic sectional view illustrating a ninth embodiment of a light-emitting device according to the present invention. In FIG. 13, the same constituent elements as those of the light-emitting device 10 illustrated in FIG. 1, the light-emitting device 30 illustrated in FIG. 6, and the light-emitting device 110 illustrated in FIG. 10 are designated by the same reference numerals, and the descriptions thereof are omitted.

A light-emitting device 170 schematically includes an excitation light source 11, a substrate 14, a barrier 15, a low-refractive-index layer 111, a light-absorbing layer 112, a wavelength-selective transmission/reflection layer 31, and a second low-refractive-index layer 171. The excitation light source 11 emits excitation light. The substrate 14 is disposed so as to face the excitation light source 11 through a planarizing film 12. A fluorescent layer 13 that is excited by the excitation light to emit fluorescence is formed on the substrate 14. The barrier 15 surrounds side surfaces 13a of the fluorescent layer 13, the side surfaces 13a extending in a stacking direction of the excitation light source 11 and the substrate 14. The low-refractive-index layer 111 is constituted by a plurality of separated low-refractive-index layers each located in a predetermined region, the separated low-refractive-index layers being disposed between the fluorescent layer 13 and the substrate 14. The low-refractive-index layer 111 has a refractive index lower than that of the substrate 14. The light-absorbing layer 112 is formed between the substrate 14 and the barrier 15. The wavelength-selective transmission/reflection layer 31 is formed on an incident surface 13b side of the fluorescent layer 13 upon which the excitation light is incident. The second low-refractive-index layer 171 is formed between the fluorescent layer 13 and the barrier 15. The second low-refractive-index layer 171 has a refractive index lower than that of the substrate 14.

Specifically, the second low-refractive-index layer 171 faces the wavelength-selective transmission/reflection layer 31 and is formed on the incident surface 13b of the fluorescent layer 13 upon which the excitation light is incident and on an upper surface (a surface not facing the low-refractive-index layer 16) 14c of the barrier 15.

The second low-refractive-index layer 171 is composed of the same material as the above low-refractive-index layer 16.

Light emission in the light-emitting device 170 will be described with reference to FIG. 13.

In the light-emitting device 170, when excitation light 181 enters the fluorescent layer 13 from the excitation light source 11, fluorescence from a fluorescent body is isotropically emitted from the fluorescent layer 13. Part of a fluorescent component 182 (indicated by a solid line in FIG. 13) emitted to the light-output side (front direction, substrate 14 side) among the fluorescent components emitted from the fluorescent layer 13 can be effectively output to the outside as emission light. A fluorescent component 183 (indicated by a broken line in FIG. 13) emitted in a direction toward the side surface 13a of the fluorescent layer 13 among the fluorescent components emitted from the fluorescent layer 13 is scattered at the side surface 15a of the barrier 15 having a light-scattering property, and part of the scattered light can be effectively output to the outside as emission light. A fluorescent component 184 (indicated by a dot-and-dash line in FIG. 13) that is emitted to the side (back surface side) opposite the light-output side of the fluorescent layer 13 is reflected toward the light-output side (front direction, substrate 14 side) at the interface between the fluorescent layer 13 and the second low-refractive-index layer 171 and can be effectively output to the outside as emission light.

As described above, in the light-emitting device 170, the barrier 15 has a light-scattering property at least in a portion that faces the fluorescent layer 13 and the low-refractive-index layer 111 having a refractive index lower than that of the substrate 14 is formed between the fluorescent layer 13 and the substrate 14. Therefore, the incident angle of light that can enter the substrate 14 from the fluorescent layer 13 can be controlled, and the light that enters the substrate 14 can be output to the outside with certainty without being reflected at the interface between the substrate 14 and the outside. Furthermore, the second low-refractive-index layer 171 is formed on the incident surface 13b side of the fluorescent layer 13. Therefore, in the component 184 emitted to the back surface side among the fluorescent components emitted from the fluorescent layer 13, a fluorescent component emitted at an angle larger than the critical angle of the interface between the fluorescent layer 13 and the second low-refractive-index layer 171 is reflected toward the light-output side (front direction, substrate 14 side) at the interface between the fluorescent layer 13 and the second low-refractive-index layer 171 and can be output to the outside with certainty. Consequently, the light utilization efficiency can be improved (the front luminance can be improved) while the generation of the blurriness and fuzziness of display can be prevented. Furthermore, since the low-refractive-index layer 111 and the light-absorbing layer 112 are formed on the same surface (one surface 14a) of the substrate 14, the total thickness of the light-emitting device 170 can be decreased.

(10) Tenth Embodiment

Figure 14:
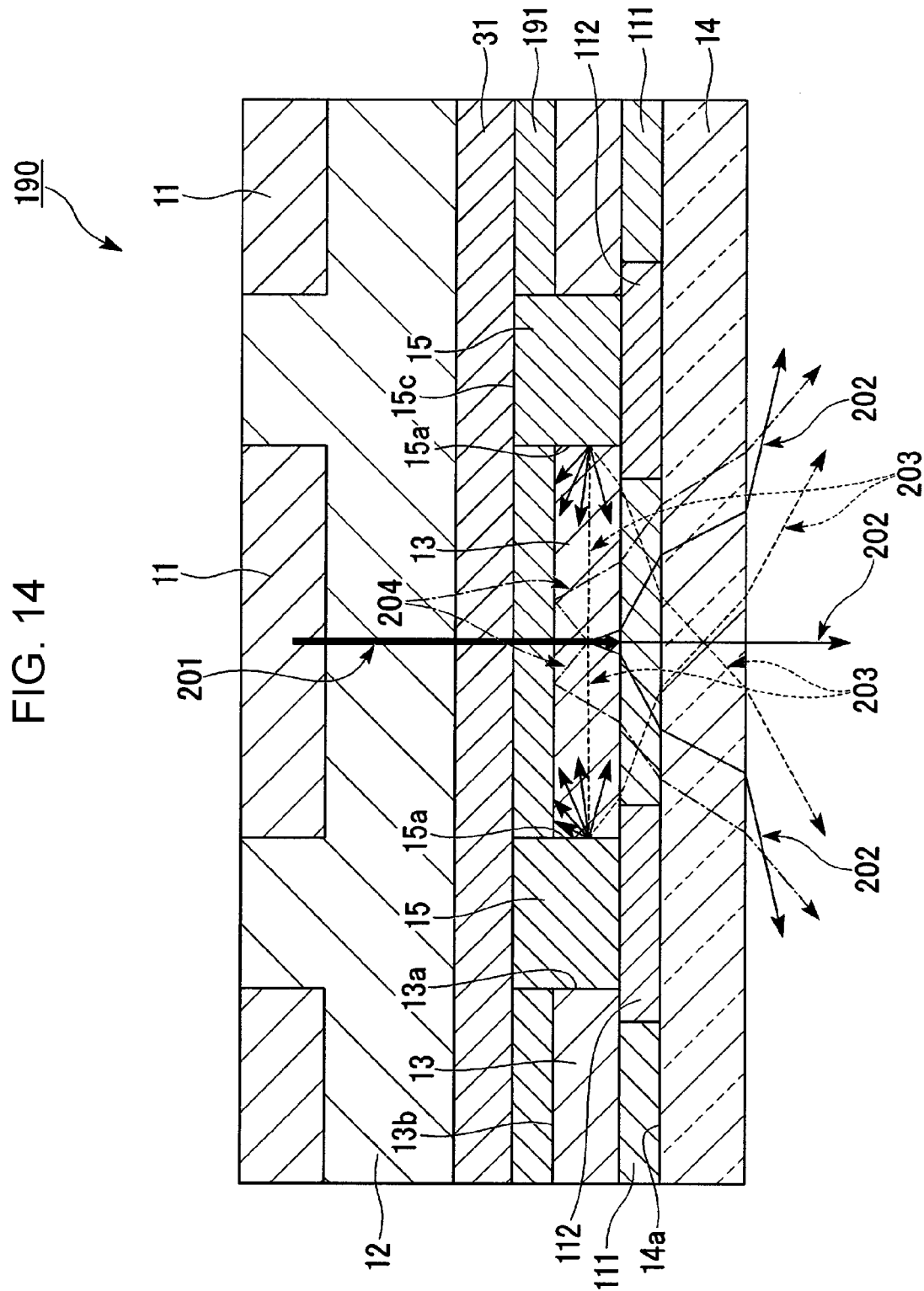
FIG. 14 is a schematic sectional view illustrating a tenth embodiment of the light-emitting device according to the present invention.

FIG. 14 is a schematic sectional view illustrating a tenth embodiment of a light-emitting device according to the present invention. In FIG. 14, the same constituent elements as those of the light-emitting device 10 illustrated in FIG. 1, the light-emitting device 30 illustrated in FIG. 6, and the light-emitting device 110 illustrated in FIG. 10 are designated by the same reference numerals, and the descriptions thereof are omitted.

A light-emitting device 190 schematically includes an excitation light source 11, a substrate 14, a barrier 15, a low-refractive-index layer 111, a light-absorbing layer 112, a wavelength-selective transmission/reflection layer 31, and a second low-refractive-index layer 191. The excitation light source 11 emits excitation light. The substrate 14 is disposed so as to face the excitation light source 11 through a planarizing film 12. A fluorescent layer 13 that is excited by the excitation light to emit fluorescence is formed on the substrate 14. The barrier 15 surrounds side surfaces 13a of the fluorescent layer 13, the side surfaces 13a extending in a stacking direction of the excitation light source 11 and the substrate 14. The low-refractive-index layer 111 is constituted by a plurality of separated low-refractive-index layers each located in a predetermined region, the separated low-refractive-index layers being disposed between the fluorescent layer 13 and the substrate 14. The low-refractive-index layer 111 has a refractive index lower than that of the substrate 14. The light-absorbing layer 112 is formed between the substrate 14 and the barrier 15. The wavelength-selective transmission/reflection layer 31 is formed on an incident surface 13b side of the fluorescent layer 13 upon which the excitation light is incident. The second low-refractive-index layer 191 is formed between the wavelength-selective transmission/reflection layer 31 and the fluorescent layer 13. The second low-refractive-index layer 191 has a refractive index lower than that of the substrate 14.

Specifically, the second low-refractive-index layer 191 faces the wavelength-selective transmission/reflection layer 31 and is disposed on the incident surface 13b of the fluorescent layer 13 upon which the excitation light is incident. The second low-refractive-index layer 191 is disposed in each of regions that are separated by the barrier 15 so as to face the wavelength-selective transmission/reflection layer 31.

The second low-refractive-index layer 191 composed of the same material as the above low-refractive-index layer 16.

Light emission in the light-emitting device 190 will be described with reference to FIG. 14.

In the light-emitting device 190, when excitation light 201 enters the fluorescent layer 13 from the excitation light source 11, fluorescence from a fluorescent body is isotropically emitted from the fluorescent layer 13. Part of a fluorescent component 202 (indicated by a solid line in FIG. 14) emitted to the light-output side (front direction, substrate 14 side) among the fluorescent components emitted from the fluorescent layer 13 can be effectively output to the outside as emission light. A fluorescent component 203 (indicated by a broken line in FIG. 14) emitted in a direction toward the side surface 13a of the fluorescent layer 13 among the fluorescent components emitted from the fluorescent layer 13 is scattered at the side surface 15a of the barrier 15 having a light-scattering property, and part of the scattered light can be effectively output to the outside as emission light. A fluorescent component 204 (indicated by a dot-and-dash line in FIG. 14) that is emitted to the side (back surface side) opposite the light-output side of the fluorescent layer 13 is reflected toward the light-output side (front direction, substrate 14 side) at the interface between the fluorescent layer 13 and the second low-refractive-index layer 191 and can be effectively output to the outside as emission light.

As described above, in the light-emitting device 190, the barrier 15 has a light-scattering property at least in a portion that faces the fluorescent layer 13 and the low-refractive-index layer 111 having a refractive index lower than that of the substrate 14 is formed between the fluorescent layer 13 and the substrate 14. Therefore, the incident angle of light that can enter the substrate 14 from the fluorescent layer 13 can be controlled, and the light that enters the substrate 14 can be output to the outside with certainty without being reflected at the interface between the substrate 14 and the outside. Furthermore, the second low-refractive-index layer 191 is formed on the incident surface 13b side of the fluorescent layer 13. Therefore, in the component 204 emitted to the back surface side among the fluorescent components emitted from the fluorescent layer 13, a fluorescent component emitted at an angle larger than the critical angle of the interface between the fluorescent layer 13 and the second low-refractive-index layer 191 is reflected toward the light-output side (front direction, substrate 14 side) at the interface between the fluorescent layer 13 and the second low-refractive-index layer 191 and can be output to the outside with certainty. Consequently, the light utilization efficiency can be improved (the front luminance can be improved) while the generation of the blurriness and fuzziness of display can be prevented.

Furthermore, since the low-refractive-index layer 111 and the light-absorbing layer 112 are formed on the same surface (one surface 14a) of the substrate 14, the total thickness of the light-emitting device 190 can be decreased.

Display Apparatus

The details of embodiments of display apparatuses each including a fluorescent substrate and a light source will be described.

In the display apparatus of this embodiment, the fluorescent substrate is the substrate 14 in the first to tenth embodiments of the above light-emitting devices on which the fluorescent layer 13, the barrier 15, the low-refractive-index layer 16, the light-absorbing layer 17, and the like are formed. In the display apparatus of this embodiment, the light source refers to the substrate (light-emitting element substrate) in the first to tenth embodiments of the above light-emitting devices on which the excitation light source 11 is formed.

In the display apparatus of this embodiment, a publicly known ultraviolet LED, blue LED, ultraviolet-light-emitting inorganic EL element, blue-light-emitting inorganic EL element, ultraviolet-light-emitting organic EL element, blue-light-emitting organic EL element, or the like is used as the light source. However, this embodiment is not limited to these light sources, and a light source manufactured by a publicly known manufacturing method using a publicly known material can also be used.

Herein, the ultraviolet light is preferably light having a main emission peak at 360 nm to 410 nm. The blue light is light having a main emission peak at 410 nm to 470 nm.

(1) First Embodiment

Figure 15:
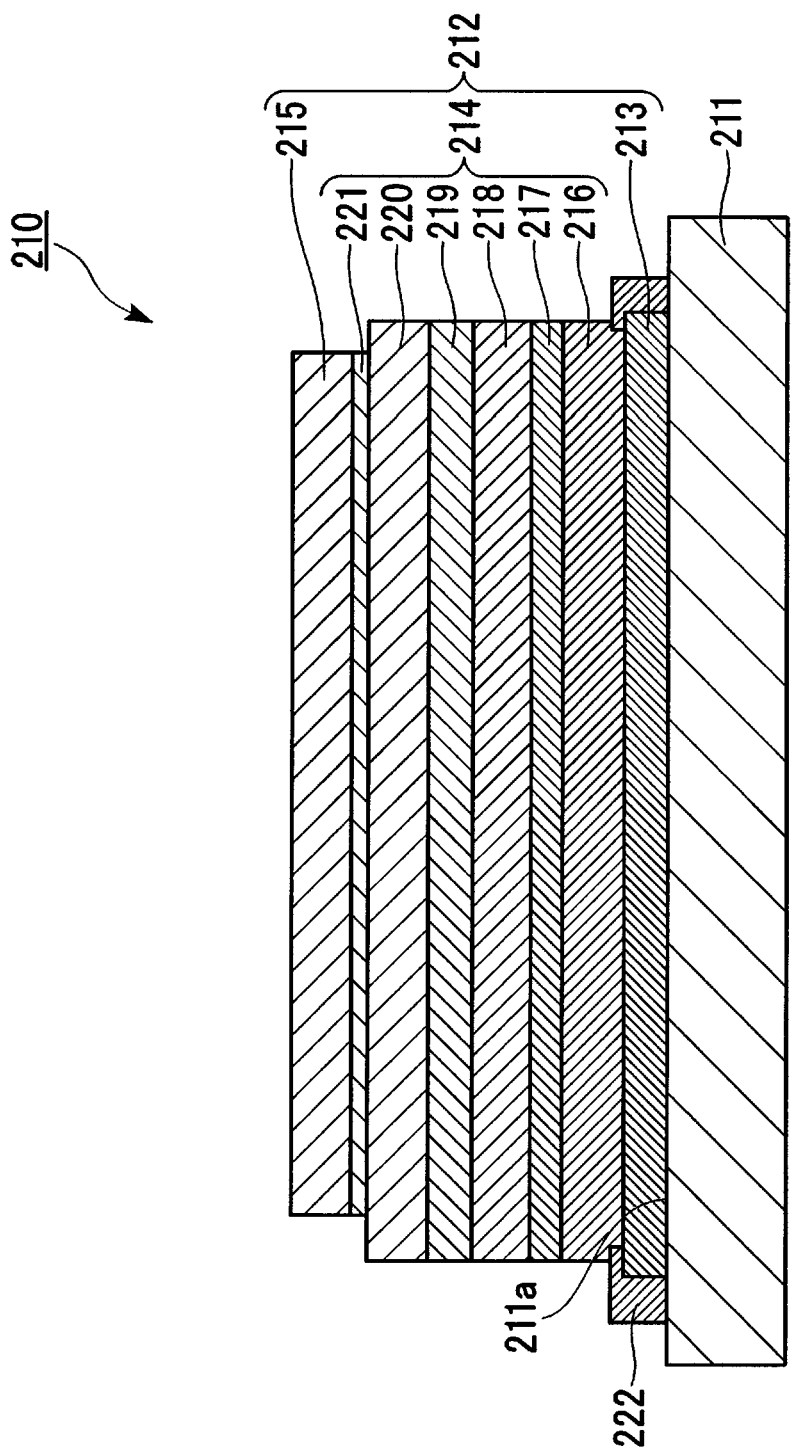
FIG. 15 is a schematic sectional view illustrating an organic EL element substrate in a first embodiment of a display apparatus according to the present invention.

FIG. 15 is a schematic sectional view illustrating an organic EL element substrate constituting a first embodiment of a display apparatus according to the present invention.

The display apparatus of this embodiment schematically includes a fluorescent substrate which is the substrate 14 in the first to tenth embodiments of the above light-emitting devices on which the fluorescent layer 13, the barrier 15, the low-refractive-index layer 16, the light-absorbing layer 17, and the like are formed and an organic EL element substrate (light source) 210 bonded to the fluorescent substrate through the planarizing film 12 and the like in the first to tenth embodiments of the above light-emitting devices.

The organic EL element substrate 210 schematically includes a substrate 211 and an organic EL element 212 disposed on one surface 211a of the substrate 211.

The organic EL element 212 schematically includes a first electrode 213, an organic EL layer 214, and a second electrode 215 sequentially disposed on the one surface 211a of the substrate 211. In other words, the organic EL element 212 includes a pair of electrodes, namely, the first electrode 213 and the second electrode 215 and the organic EL layer 214 sandwiched between the pair of electrodes, the pair of electrodes and the organic EL layer 214 being disposed on the one surface 211a of the substrate 211.

The first electrode 213 and the second electrode 215 function as a pair of an anode and a cathode of the organic EL element 212.

The optical path length between the first electrode 213 and the second electrode 215 is adjusted so that a micro-cavity structure is formed.

The organic EL layer 214 includes a hole injection layer 216, a hole transport layer 217, a light-emitting layer 218, a hole blocking layer 219, an electron transport layer 220, and an electron injection layer 221 sequentially stacked in a direction from the first electrode 213 to the second electrode 215.

The hole injection layer 216, the hole transport layer 217, the light-emitting layer 218, the hole blocking layer 219, the electron transport layer 220, and the electron injection layer 221 may each have a single-layer structure or a multilayer structure. The hole injection layer 216, the hole transport layer 217, the light-emitting layer 218, the hole blocking layer 219, the electron transport layer 220, and the electron injection layer 221 may each be an organic thin film or an inorganic thin film.

The hole injection layer 216 is a layer for efficiently injecting holes from the first electrode 213.

The hole transport layer 217 is a layer for efficiently transporting holes to the light-emitting layer 218.

The electron transport layer 220 is a layer for efficiently transporting electrons to the light-emitting layer 218.

The electron injection layer 221 is a layer for efficiently injecting electrons from the second electrode 215.

The hole injection layer 216, the hole transport layer 217, the electron transport layer 220, and the electron injection layer 221 correspond to carrier injection/transport layers.

The organic EL element 212 is not limited to the above structure, and the organic EL layer 214 may have a single-layer structure including only the light-emitting layer or a multilayer structure including the light-emitting layer and the carrier injection/transport layers. Specific examples of the structure of the organic EL element 212 include structures below:

(1) a structure in which only a light-emitting layer is disposed between the first electrode 213 and the second electrode 215, (2) a structure in which a hole transport layer and a light-emitting layer are sequentially stacked in a direction from the first electrode 213 to the second electrode 215, (3) a structure in which a light-emitting layer and an electron transport layer are sequentially stacked in a direction from the first electrode 213 to the second electrode 215, (4) a structure in which a hole transport layer, a light-emitting layer, and an electron transport layer are sequentially stacked in a direction from the first electrode 213 to the second electrode 215, (5) a structure in which a hole injection layer, a hole transport layer, a light-emitting layer, and an electron transport layer are sequentially stacked in a direction from the first electrode 213 to the second electrode 215, (6) a structure in which a hole injection layer, a hole transport layer, a light-emitting layer, an electron transport layer, and an electron injection layer are sequentially stacked in a direction from the first electrode 213 to the second electrode 215, (7) a structure in which a hole injection layer, a hole transport layer, a light-emitting layer, a hole blocking layer, and an electron transport layer are sequentially stacked in a direction from the first electrode 213 to the second electrode 215, (8) a structure in which a hole injection layer, a hole transport layer, a light-emitting layer, a hole blocking layer, an electron transport layer, and an electron injection layer are sequentially stacked in a direction from the first electrode 213 to the second electrode 215, and (9) a structure in which a hole injection layer, a hole transport layer, an electron blocking layer, a light-emitting layer, a hole blocking layer, an electron transport layer, and an electron injection layer are sequentially stacked in a direction from the first electrode 213 to the second electrode 215.

Each of the light-emitting layer, the hole injection layer, the hole transport layer, the hole blocking layer, the electron blocking layer, the electron transport layer, and the electron injection layer may have a single-layer structure or a multi-layer structure. Each of the light-emitting layer, the hole injection layer, the hole transport layer, the hole blocking layer, the electron blocking layer, the electron transport layer, and the electron injection layer may be an organic thin film or an inorganic thin film.

An edge cover 222 is formed so as to cover the end face of the first electrode 213. That is, the edge cover 222 is disposed between the first electrode 213 and the second electrode 215 so as to cover an edge portion of the first electrode 213 formed on one surface 211a of the substrate 211 for the purpose of preventing the leakage between the first electrode 213 and the second electrode 215.

The constituent members of the organic EL element substrate 210 and the method for forming the organic EL element substrate 210 will now be specifically described, but this embodiment is not limited to the constituent members and the formation method.

The substrate 211 may be, for example, an inorganic material substrate composed of glass, quartz, or the like; a plastic substrate composed of polyethylene terephthalate, polycarbazole, polyimide, or the like; an insulating substrate such as a ceramic substrate composed of alumina or the like; a metal substrate composed of aluminum (Al), iron (Fe), or the like; a substrate obtained by coating the above substrate with an insulator composed of silicon oxide ($SiO_2$), an organic insulating material, or the like; or a substrate obtained by subjecting a surface of a metal substrate composed of aluminum or the like to an insulating treatment by, for example, anodic oxidation. However, this embodiment is not limited to these substrates. Among these substrates, the plastic substrate or the metal substrate is preferably used to allow the formation of a curbed portion or a bent portion without applying a stress.

Furthermore, a substrate obtained by coating a plastic substrate with an inorganic material or a substrate obtained by coating a metal substrate with an inorganic insulating material is more preferably used. The use of such a substrate coated with an inorganic material can prevent the permeation of moisture into organic EL which occurs when a plastic substrate is used as the organic EL element substrate. Moreover, a leak (short circuit) caused by a protrusion of a metal substrate when the metal substrate is used as the organic EL element substrate can be prevented (it is known that, since the thickness of organic EL layers is as extremely small as about 100 nm to 200 nm, a leak (short circuit) occurs at a pixel portion due to a protrusion).

When a TFT is formed, a substrate that is not melted or distorted at a temperature of 500° C. or less is preferably used as the substrate 211. A generally used metal substrate has a thermal expansion coefficient different from that of glass and thus it is difficult to form a TFT on the metal substrate by known production equipment. However, by using a metal substrate composed of an iron-nickel alloy having a linear expansion coefficient of $1 \times 10^{-5}/°$ C. or less, which is substantially the same as the linear expansion coefficient of glass, a TFT can be formed on the metal substrate using known production equipment at low cost.

The plastic substrate has a low heat-resistant temperature. Therefore, by forming a TFT on a glass substrate and then transferring the TFT on the glass substrate onto a plastic substrate, the TFT can be formed on the plastic substrate.

When light emitted from the organic EL layer 214 is output from the side opposite the substrate 211, there are no limitations on the substrate. However, when light emitted from the organic EL layer 214 is output from the substrate 211 side, a transparent or semitransparent substrate needs to be used to output, to the outside, the light emitted from the organic EL layer 214.

The TFT formed on the substrate 211 is formed on one surface 211a of the substrate 211 in advance before the organic EL element 212 is formed and functions as a pixel switching element and an organic EL element driving element.

A publicly known TFT is used as the TFT in this embodiment. A metal-insulator-metal (MIM) diode may also be used instead of the TFT.

A TFT that can be used for active drive organic EL display apparatuses and organic EL display apparatuses can be formed by employing a publicly known material, structure, and formation method.

Examples of the material for the active layer of the TFT include inorganic semiconductor materials such as amorphous silicon, polycrystalline silicon (polysilicon), microcrystalline silicon, and cadmium selenide; oxide semiconductor materials such as zinc oxide and indium oxide-gallium oxide-zinc oxide; and organic semiconductor materials such as polythiophene derivatives, thiophene oligomers, poly(p-phenylenevinylene) derivatives, naphthacene, and pentacene. Examples of the structure of the TFT include a staggered type, an inverted staggered type, a top gate type, and a coplanar type.

Examples of the formation method of the active layer of the TFT include (1) a method in which an amorphous silicon film formed by a plasma-enhanced chemical vapor deposition (PECVD) method is subjected to ion doping with impurities, (2) a method in which amorphous silicon is formed by a low pressure chemical vapor deposition (LPCVD) method that uses a silane ($SiH_4$) gas, the amorphous silicon is crystallized into polysilicon by a solid phase growth method, and then ion doping is performed by an ion implantation method, (3) a method in which amorphous silicon is formed by an LPCVD method that uses a $Si_2H_6$ gas or a PECVD method that uses a $SiH_4$ gas, the amorphous silicon is annealed by using a laser such as an excimer laser and crystallized into polysilicon, and then ion doping is performed (low-temperature process), (4) a method in which a polysilicon layer is formed by an LPCVD method or a PECVD method and thermally oxidized at 1000° C. or more to form a gate insulating film, a gate electrode composed of $n^+$ polysilicon is formed thereon, and then ion doping is performed (high-temperature process), (5) a method in which an organic semiconductor material is formed by an ink-jet method or the like, and (6) a method in which a single crystal film of an organic semiconductor material is obtained.

A gate insulating film of the TFT in this embodiment can be formed of a publicly known material. Examples of the gate insulating film include an insulating film composed of $SiO_2$ formed by a PECVD method or an LPCVD method and an insulating film composed of $SiO_2$ obtained by thermally oxidizing a polysilicon film.

A signal electrode line, a scanning electrode line, a common electrode line, a first driving electrode, and a second driving electrode of the TFT in this embodiment can each be formed of a publicly known material. Examples of the material for the signal electrode line, scanning electrode line, common electrode line, first driving electrode, and second driving electrode include tantalum (Ta), aluminum (Al), and copper (Cu) A TFT for the organic EL element substrate 210 can be formed so as to have the above structure, but this embodiment is not limited to these materials, structures, and formation methods.

An interlayer insulating film that can be used for active drive organic EL display apparatuses and organic EL display apparatuses can be formed of a publicly known material. Examples of the material for the interlayer insulating film include inorganic materials such as silicon oxide ($SiO_2$), silicon nitride (SiN or $Si_2N_4$), and tantalum oxide (TaO or $Ta_2O_5$); and organic materials such as an acrylic resin and a resist material.

The interlayer insulating film can be formed by a dry process such as a chemical vapor deposition (CVD) method or a vacuum deposition method or a wet process such as a spin coating method. The interlayer insulating film can also be patterned by a photolithography method, when necessary.

When light emitted from the organic EL element 212 is output from the side (second electrode 215 side) opposite the substrate 211, a light-shielding insulating film having a light-shielding property is preferably formed in order to prevent a change in the TFT characteristics caused when natural light enters a TFT formed on one surface 211a of the substrate 211. The interlayer insulating film and the light-shielding insulating film can be used in combination. The light-shielding insulating film is composed of a product obtained by dispersing a pigment or dye such as phthalocyanine or quinacridone in a polymer resin such as polyimide, a color resist, a black matrix material, or an inorganic insulating material such as $Ni_xZn_yFe_2O_4$. However, this embodiment is not limited to the materials and formation methods.

In active drive organic EL display apparatuses, when a TFT or the like is formed on one surface 211a of the substrate 211, projections and depressions are formed in the surface, which may cause the partial loss of a pixel electrode, the partial loss of an organic EL layer, the disconnection of a second electrode, the short circuit between the first electrode and the second electrode, and the decrease in withstand voltage in the organic EL element 212. A planarizing film may be formed on the interlayer insulating film to prevent these phenomena.

Such a planarizing film can be formed of a publicly known material. Examples of the material for the planarizing film include inorganic materials such as silicon oxide, silicon nitride, and tantalum oxide and organic materials such as polyimide, an acrylic resin, and a resist material. The planarizing film is formed by a dry process such as a CVD method or a vacuum deposition method or a wet process such as a spin coating method. However, this embodiment is not limited to the materials and formation methods. The planarizing film may have a single-layer structure or a multilayer structure.

The first electrode 213 and the second electrode 215 function as a pair of an anode and a cathode of the organic EL element 212. In other words, when the first electrode 213 is an anode, the second electrode 215 is a cathode. When the first electrode 213 is a cathode, the second electrode 215 is an anode.

The first electrode 213 and the second electrode 215 can be formed of a publicly known electrode material. The electrode material for forming an anode is, for example, a transparent electrode material such as a metal, e.g., gold (Au), platinum (Pt), or nickel (Ni), an oxide (ITO) of indium (In) and tin (Sn), an oxide ($SnO_2$) of tin (Sn), or an oxide (IZO) of indium (In) and zinc (Zn), which has a work function of 4.5 eV or more, from the viewpoint of efficiently performing the injection of holes into the organic EL layer 214.

The electrode material for forming a cathode is, for example, a metal such as lithium (Li), calcium (Ca), cerium (Ce), barium (Ba), or aluminum (Al), or an alloy containing these metals, such as a Mg:Ag alloy or a Li:Al alloy, which has a work function of 4.5 eV or less, from the viewpoint of efficiently performing the injection of electrons into the organic EL layer 214.

The first electrode 213 and the second electrode 215 can be formed using the above materials by a publicly known method such as an EB deposition method, a sputtering method, an ion plating method, or a resistance heating evaporation method, but this embodiment is not limited to these formation methods. If necessary, the formed electrodes can be patterned by a photolithography method or a laser lift-off method. Alternatively, a directly patterned electrode can also be formed by using a shadow mask in combination.

The thickness of each of the first electrode 213 and the second electrode 215 is preferably 50 nm or more.

If the thickness is less than 50 nm, the wiring resistance increases, which may increase the driving voltage.

In the case where a micro-cavity effect is used in order to improve the color purity, luminous efficiency, and front luminance of display apparatuses, when the light emitted from the organic EL layer 214 is output from the first electrode 213 side or the second electrode 215 side, a semitransparent electrode is preferably used as the first electrode 213 or the second electrode 215.

A metal material for semitransparent electrodes or a combination of a metal material for semitransparent electrodes and a transparent electrode material can be used as the material for the semitransparent electrode. In particular, silver is preferably used as the material for the semitransparent electrode from the viewpoint of reflectance and transmittance.

The thickness of the semitransparent electrode is preferably 5 nm to 30 nm. If the thickness of the semitransparent electrode is less than 5 nm, light is not sufficiently reflected and the interference effect cannot be sufficiently produced. If the thickness of the semitransparent electrode is more than 30 nm, the transmittance of light considerably decreases, which may decrease the luminance and luminous efficiency of display apparatuses.

An electrode having high reflectance of light is preferably used as the first electrode 213 or the second electrode 215. Examples of the electrode having high reflectance include a reflective metal electrode (reflective electrode) composed of aluminum, silver, gold, an aluminum-lithium alloy, an aluminum-neodymium alloy, or an aluminum-silicon alloy and an electrode obtained by combining the reflective metal electrode and a transparent electrode.

A charge injection/transport layer is classified into a charge injection layer (hole injection layer 216, electron injection layer 221) and a charge transport layer (hole transport layer 217, electron transport layer 220) in order to more efficiently perform the injection of charges (holes, electrons) from the electrode and the transport (injection) into the light-emitting layer. The charge injection/transport layer may be composed of only a charge injection/transport material shown below. The charge injection/transport layer may optionally contain additives (e.g., donor and acceptor). The charge injection/transport layer may have a structure in which a charge injection/transport material shown below is dispersed in a polymer material (binder resin) or an inorganic material.

A publicly known charge injection/transport material for organic EL elements or organic photoconductors can be used as the charge injection/transport material. Such a charge injection/transport material is classified into a hole injection/transport material and an electron injection/transport material. Specific compounds thereof are shown below, but this embodiment is not limited to these materials.

A publicly known material is used as the materials for the hole injection layer 216 and hole transport layer 217. Examples of the material include oxides such as vanadium oxide ($V_2O_5$) and molybdenum oxide ($MoO_3$) and inorganic p-type semiconductor materials; aromatic tertiary amine compounds such as porphyrin compounds, N,N'-bis(3-methylphenyl)-N,N'-bis(phenyl)-benzidine (TPD), N,N'-di(naphthalen-1-yl)-N,N'-diphenyl-benzidine (α-NPD), 4,4',4"-tris(carbazol-9-yl)triphenylamine (TCTA), N,N-dicarbazolyl-3,5-benzene (m-CP), 4,4'-(cyclohexane-1,1-diyl)bis(N,N-di-p-tolylaniline) (TAPC), 2,2'-bis(N,N-diphenylamine)-9,9'-spirobifluorene (DPAS), N1,N1'-(biphenyl-4,4'-diyl)bis(N1-phenyl-N4,N4-di-m-tolylbenzene-1,4-diamine) (DNTPD), N3,N3,N3''',N3'''-tetra-p-tolyl-[1,1':2',1'':2'',1'''-quaterphenyl]-3,3'''-diamine (BTPD), 4,4'-(diphenylsilanediyl)bis(N,N-di-p-tolylaniline) (DTASi), and 2,2-bis(4-carbazol-9-ylphenyl)adamantane (Ad-Cz); low-molecular-weight nitrogen-containing compounds such as hydrazone compounds, quinacridone compounds, and styrylamine compounds; high-molecular-weight compounds such as polyaniline (PANI), polyaniline-camphorsulfonic acid (PANI-CSA), 3,4-polyethylenedioxythiophene/polystyrene sulfonate (PEDOT/PSS), poly(triphenylamine) derivatives (Poly-TPD), polyvinylcarbazole (PVCz), poly(p-phenylenevinylene) (PPV), and poly(p-naphthalenevinylene) (PNV); and aromatic hydrocarbon compounds such as 2-methyl-9,10-bis(naphthalen-2-yl)anthracene (MADN).

A material having an energy level of the highest occupied molecular orbital (HOMO) lower than the energy level of the material for the hole transport layer 217 is preferably used as the material for the hole injection layer 216 from the viewpoint of more efficiently performing the injection and transport of holes from the anode. The hole transport layer 217 is preferably composed of a material having the mobility of holes higher than the material for the hole injection layer 216.

The hole injection layer 216 and the hole transport layer 217 may optionally contain additives (e.g., donor and acceptor).

The hole injection layer 216 and the hole transport layer 217 preferably contain an acceptor to further improve the hole injection and transport performance. A publicly known acceptor material for organic EL elements can be used for the acceptor. Specific compounds thereof are shown below, but this embodiment is not limited to these materials.

The acceptor may be either an inorganic material or an organic material.

Examples of the inorganic material include gold (Au), platinum (Pt), tungsten (W), iridium (Ir), phosphorus oxychloride ($POCl_3$), hexafluoroarsenate ions ($AsF_6^-$), chlorine (Cl), bromine (Br), iodine (I), vanadium oxide ($V_2O_5$), and molybdenum oxide ($MoO_3$).

Examples of the organic material include compounds having a cyano group, such as 7,7,8,8-tetracyanoquinodimethane (TCNQ), tetrafluorotetracyanoquinodimethane ($TCNQF_4$), tetracyanoethylene (TCNE), hexacyanobutadiene (HCNB), and dicyclodicyanobenzoquinone (DDQ); compounds having a nitro group, such as trinitrofluorenone (TNF) and dinitrofluorenone (DNF); and fluoranil, chloranil, and bromanil.

Among them, compounds having a cyano group, such as TCNQ, $TCNQF_4$, TCNE, HCNB, and DDQ, are preferably used because they can more effectively increase the hole density.

A publicly known material is used as the materials for the hole blocking layer 219, the electron transport layer 220, and the electron injection layer 221. Examples of the material having a low molecular weight include n-type semiconductor inorganic materials; oxadiazole derivatives such as 1,3-bis[2-(2,2'-bipyridin-6-yl)-1,3,4-oxadiazol-5-yl]benzene (Bpy-OXD) and 1,3-bis(5-(4-(tert-butyl)phenyl)-1,3,4-oxadiazol-2-yl)benzene (OXD7); triazole derivatives such as 3-(4-biphenyl)-4-phenyl-5-tert-butylphenyl-1,2,4-triazole (TAZ); thiopyrazine dioxide derivatives; benzoquinone derivatives; naphthoquinone derivatives; anthraquinone derivatives; diphenoquinone derivatives; fluorenone derivatives; benzodifuran derivatives; quinoline derivatives such as 8-hydroxyquinolinolato-lithium (Liq); fluorene derivatives such as 2,7-bis[2-(2,2'-bipyridin-6-yl)-1,3,4-oxadiazol-5-yl]-9,9-dimethylfluorene (Bpy-FOXD); benzene derivatives such as 1,3,5-tri[(3-pyridil)-phen-3-yl]benzene (TmPyPB) and 1,3,5-tri[(3-pyridil)-phen-3-yl]benzene (TpPyPb); benzimidazole derivatives such as 2,2',2"-(1,3,5-benzinetriyl)-tris(1-phenyl-1-H-benzimidazole) (TPBI); pyridine derivatives such as 3,5-di(pyren-1-yl)pyridine (PY1); biphenyl derivatives such as 3,3',5,5'-tetra[(m-pyridil)-phen-3-yl]biphenyl (BP4 mPy); phenanthroline derivatives such as 4,7-diphenyl-1,10-phenanthroline (BPhen) and 2,9-dimethyl-4,7-diphenyl-1,10-phenanthroline (BCP); triphenylborane derivatives such as tris(2,4,6-trimethyl-3-(pyridin-3-yl)phenyl)borane (3TPYMB); tetraphenylsilane derivatives such as diphenyl-bis(4-(pyridin-3-yl)phenyl)silane (DPPS); poly(oxadiazole) (Poly-OXZ); and polystyrene derivatives (PSS). In particular, examples of the material for the electron injection layer 221 include fluorides such as lithium fluoride (LiF) and barium fluoride and oxides such as lithium oxide ($Li_2O$).

A material having an energy level of the lowest unoccupied molecular orbital (LUMO) higher than the energy level of the electron transport layer 220 is preferably used as the material for the electron injection layer 210 from the viewpoint of more efficiently performing the injection and transport of electrons from the cathode. The electron transport layer 220 is preferably composed of a material having the mobility of electrons higher than that of the electron injection layer 221.

The electron transport layer 220 and the electron injection layer 221 may optionally contain additives (e.g., donor and acceptor).

The electron transport layer 220 and the electron injection layer 221 preferably contain a donor to improve the electron transport and injection performance. A publicly known donor material for organic EL elements can be used for the donor. Specific compounds thereof are shown below, but this embodiment is not limited to these materials.

The donor may be either an inorganic material or an organic material.

Examples of the inorganic material include alkali metals such as lithium, sodium, and potassium; alkaline-earth metals such as magnesium and calcium; rare-earth elements; aluminum (Al); silver (Ag); copper (Cu); and indium (In).

Examples of the organic material include compounds having an aromatic tertiary amine skeleton; fused polycyclic compounds that may have a substituent, such as phenanthrene, pyrene, perylene, anthracene, tetracene, and pentacene; tetrathiafulvalene (TTF); dibenzofuran; phenothiazine; and carbazole.

Examples of the compounds having an aromatic tertiary amine skeleton include anilines; phenylenediamines; benzidines such as N,N,N',N'-tetraphenylbenzidine, N,N'-bis(3-methylphenyl)-N,N'-bis(phenyl)benzidine, and N,N'-di(naphthalen-1-yl)-N,N'-diphenylbenzidine; triphenylamines such as triphenylamine, 4,4',4"-tris(N,N-diphenylamino)triphenylamine, 4,4',4"-tris(N-3-methylphenyl-N-phenylamino)triphenylamine, and 4,4',4"-tris(N-(1-naphthyl)-N-phenylamino)triphenylamine; and triphenyldiamines such as N,N'-di(4-methylphenyl)-N,N'-diphenyl-1,4-phenylenediamine.

The phrase "the fused polycyclic compound 'has a substituent'" means that at least one hydrogen atom in the fused polycyclic compound is substituted with a group (substituent) other than the hydrogen atom. The number of substituents is not particularly limited, and all hydrogen atoms may be substituted with substituents. The position of the substituent is also not particularly limited.

Examples of the substituent include an alkyl group having 1 to 10 carbon atoms, an alkoxy group having 1 to 10 carbon atoms, an alkenyl group having 2 to 10 carbon atoms, an alkenyloxy group having 2 to 10 carbon atoms, an aryl group having 6 to 15 carbon atoms, an aryloxy group having 6 to 15 carbon atoms, a hydroxyl group, and a halogen atom.

The alkyl group may be a linear, branched, or cyclic alkyl group.

Examples of the linear or branched alkyl group include a methyl group, an ethyl group, an n-propyl group, an isopropyl group, an n-butyl group, an isobutyl group, a sec-butyl group, a tert-butyl group, an n-pentyl group, an isopentyl group, a neopentyl group, a tert-pentyl group, a 1-methylbutyl group, an n-hexyl group, a 2-methylpentyl group, a 3-methylpentyl group, a 2,2-dimethylbutyl group, a 2,3-dimethylbutyl group, an n-heptyl group, a 2-methylhexyl group, a 3-methylhexyl group, a 2,2-dimethylpentyl group, a 2,3-dimethylpentyl group, a 2,4-dimethylpentyl group, a 3,3-dimethylpentyl group, a 3-ethylpentyl group, a 2,2,3-trimethylbutyl group, an n-octyl group, an isooctyl group, a nonyl group, and a decyl group.

The cyclic alkyl group may be a monocyclic or polycyclic alkyl group. Examples of the cyclic alkyl group include a cyclopropyl group, a cyclobutyl group, a cyclopentyl group, a cyclohexyl group, a cycloheptyl group, a cyclooctyl group, a cyclononyl group, a cyclodecyl group, a norbornyl group, an isobornyl group, an 1-adamantyl group, a 2-adamantyl group, and a tricyclodecyl group.

The alkoxy group is a monovalent group in which an alkyl group bonds to an oxygen atom.

The alkenyl group is a group in which one single bond (C—C) between carbon atoms in an alkyl group having 2 to 10 carbon atoms is substituted with a double bond (C=C).

The alkenyloxy group is a monovalent group in which an alkenyl group bonds to an oxygen atom.

The aryl group may be a monocyclic or polycyclic aryl group, and the number of rings is not particularly limited. Preferred examples of the aryl group include a phenyl group, a 1-naphthyl group, and a 2-naphthyl group.

The aryloxy group is a monovalent group in which an aryl group bonds to an oxygen atom.

The halogen atom is a fluorine atom, a chlorine atom, a bromine atom, or an iodine atom.

Among these compounds, the compounds having an aromatic tertiary amine skeleton, the fused polycyclic compounds that may have a substituent, and the alkali metals are preferably used as the donor because they can more effectively increase the electron density.

The light-emitting layer 218 may be composed of only an organic light-emitting material shown below or a combination of a light-emitting dopant and a host material. The light-emitting layer 218 may optionally contain a hole transport material, an electron transport material, and additives (e.g., donor and acceptor). These materials may also be dispersed in a polymer material (binder resin) or an inorganic material. From the viewpoint of luminous efficiency and durability, the light-emitting layer 218 preferably has a structure in which a light-emitting dopant is dispersed in a host material.

A publicly known light-emitting material for organic EL elements can be used as the organic light-emitting material.

Such an organic light-emitting material is classified into a low-molecular-weight light-emitting material and a high-molecular-weight light-emitting material. Specific compounds thereof are shown below, but this embodiment is not limited to these materials.

Examples of the low-molecular-weight light-emitting material (including a host material) used in the light-emitting layer 218 include aromatic dimethylidene compounds such as 4,4'-bis(2,2'-diphenylvinyl)-biphenyl (DPVB); oxadiazole compounds such as 5-methyl-2-[2-[4-(5-methyl-2-benzoxazolyl)phenyl]vinyl]benzoxazole; triazole derivatives such as 3-(4-biphenyl)-4-phenyl-5-t-butylphenyl-1,2,4-triazole (TAZ); styrylbenzene compounds such as 1,4-bis(2-methylstyryl)benzene; fluorescent organic materials such as thiopyrazine dioxide derivatives, benzoquinone derivatives, naphthoquinone derivatives, anthraquinone derivatives, diphenoquinone derivatives, and fluorenone derivatives; fluorescent light-emitting organic metal complexes such as an azomethine-zinc complex and an (8-hydroxyquinolinato)aluminum complex ($Alq_3$); BeBq (bis(benzoquinolinato)beryllium complex); 4,4'-bis(2,2-di-p-tolyl-vinyl)-biphenyl (DTVBi); tris(1,3-diphenyl-1,3-propanediono) (monophenanthroline) Eu(III) ($Eu(DBM)_3(Phen)$); diphenylethylene derivatives; triphenylamine derivatives such as tris[4-(9-phenylfluoren-9-yl)phenyl]amine (TFTPA); diaminocarbazole derivatives; bisstyryl derivatives; aromatic diamine derivatives; quinacridone compounds; perylene compounds; coumarin compounds; distyrylarylene derivatives (DPVBi); oligothiophene derivatives (BMA-3T); silane derivatives such as 4,4'-di(triphenylsilyl)biphenyl (BSB), diphenyl-di(o-tolyl)silane (UGH1), 1,4-bis(triphenylsilyl)benzene (UGH2), 1,3-bis(triphenylsilyl)benzene (UGH3), and triphenyl-(4-(9-phenyl-9H-fluoren-9-yl)phenyl)silane (TPSi-F); carbazole derivatives such as 9,9-di(4-dicarbazole-benzyl)fluorene (CPF), 3,6-bis(triphenylsilyl)carbazole (mCP); 4,4'-bis(carbazol-9-yl)biphenyl (CBP), 4,4'-bis(carbazol-9-yl)-2,2'-dimethylbiphenyl (CDBP), N,N-dicarbazolyl-3,5-benzene (m-CP), 3-(diphenylphosphoryl)-9-phenyl-9H-carbazole (PPO1), 3,6-di(9-carbazolyl)-9-(2-ethylhexyl)carbazole (TCz1), 9,9'-(5-(triphenylsilyl)-1,3-phenylene)bis(9H-carbazole) (SimCP), bis(3,5-di(9H-carbazol-9-yl)phenyl)diphenylsilane (SimCP2), 3-(diphenylphosphoryl)-9-(4-diphenylphosphoryl)phenyl)-9H-carbazole (PPO21), 2,2-bis(4-carbazolylphenyl)-1,1-biphenyl (4CzPBP), 3,6-bis(diphenylphosphoryl)-9-phenyl-9H-carbazole (PPO2), 9-(4-tert-butylphenyl)-3,6-bis(triphenylsilyl)-9H-carbazole (CzSi), 3,6-bis[(3,5-diphenyl)phenyl]-9-phenyl-carbazole (CzTP), 9-(4-tert-butylphenyl)-3,6-ditrityl-9H-carbazole (CzC), 9-(4-tert-butylphenyl)-3,6-bis(9-(4-methoxyphenyl)-9H-fluoren-9-yl)-9H-carbazole (DFC), 2,2'-bis(4-carbazol-9-yl)phenyl)-biphenyl (BCBP), and 9,9'-((2,6-diphenylbenzo[1,2-b:4,5-b']difuran-3,7-diyl)bis(4,1-phenylene))bis(9H-carbazole) (CZBDF); aniline derivatives such as 4-(diphenylphosphoryl)-N,N-diphenylaniline (HM-A1); fluorene derivatives such as 1,3-bis(9-phenyl-9H-fluoren-9-yl)benzene (mDPFB), 1,4-bis(9-phenyl-9H-fluoren-9-yl)benzene (pDPFB), 2,7-bis(carbazol-9-yl)-9,9-dimethylfluorene (DMFL-CBP), 2-[9,9-di(4-methylphenyl)-fluoren-2-yl]-9,9-di(4-methylphenyl) fluorene (BDAF), 2-(9,9-spirobifluoren-2-yl)-9,9-spirobifluorene (BSBF), 9,9-bis[4-(pyrenyl)phenyl]-9H-fluorene (BPPF), 2,2'-dipyrenyl-9,9-spirobifluorene (Spiro-Pye), 2,7-dipyrenyl-9,9-spirobifluorene (2,2'-Spiro-Pye), 2,7-bis[9,9-di(4-methylphenyl)-fluoren-2-yl]-9,9-di(4-methylphenyl)fluorene (TDAF), 2,7-bis(9,9-spirobifluoren-2-yl)-9,9-spirobifluorene (TSBF), and 9,9-spirobifluoren-2-yl-diphenyl-phosphine oxide (SPPO1); pyrene derivatives such as 1,3-di(pyren-1-yl)benzene (m-Bpye); benzoate derivatives such as propane-2,2'-diylbis(4,1-phenylene)dibenzoate (MMA1); phosphine oxide derivatives such as 4,4'-bis(diphenylphosphine oxide)biphenyl (PO1) and 2,8-bis(diphenylphosphoryl)dibenzo[b,d]thiophene (PPT); terphenyl derivatives such as 4,4''-di(triphenylsilyl)-p-terphenyl (BST); and triazine derivatives such as 2,4-bis(phenoxy)-6-(3-methyldiphenylamino)-1,3,5-triazine (BPMT).

Examples of the high-molecular-weight light-emitting material used in the light-emitting layer 218 include polyphenylenevinylene derivatives such as poly(2-decyloxy-1,4-phenylene) (DO-PPP), poly[2,5-bis[2-(N,N,N-triethylammonium)ethoxy]-1,4-phenyl-alto-1,4-phenylene]dibromide ($PPP-NEt^{3+}$), poly[2-(2'-ethylhexyloxy)-5-methoxy-1,4-phenylenevinylene](MEH-PPV), poly[5-methoxy-(2-propanoxysulfonide)-1,4-phenylenevinylene](MPS-PPV), and poly[2,5-bis(hexyloxy)-1,4-phenylene-(1-cyanovinylene)] (CN-PPV); polyspiro derivatives such as poly(9,9-dioctylfluorene) (PDAF); and carbazole derivatives such as poly (N-vinylcarbazole) (PVK).

The organic light-emitting material is preferably a low-molecular-weight light-emitting material and is preferably a phosphorescent material having high luminous efficiency from the viewpoint of low power consumption.

A publicly known dopant for organic EL elements can be used as the light-emitting dopant used in the light-emitting layer 218. Such a dopant is shown below. Examples of an ultraviolet-light-emitting material include fluorescent light-emitting materials such as p-quaterphenyl, 3,5,3,5-tetra-tert-butylsexiphenyl, and 3,5,3,5-tetra-tert-butyl-p-quinquephenyl. Examples of a blue-light-emitting material include fluorescent light-emitting materials such as styryl derivatives and phosphorescent light-emitting organic metal complexes such as bis[(4,6-difluorophenyl)-pyridinato-N,C2']picolinate iridium (III) (FIrpic) and bis(4',6'-difluorophenylpyridinato) tetrakis(1-pyrazoyl)borate iridium (III) (FIr6). An example of a green-light-emitting material is a phosphorescent light-emitting organic metal complex such as tris(2-phenylpyridinato) iridium $(Ir(ppy)_3)$.

The materials for the layers constituting the organic EL layer 214 have been described. However, for example, the host material can also be used as the hole transport material or the electron transport material, and the hole transport material and the electron transport material can also be used as the host material.

Each of the hole injection layer 216, the hole transport layer 217, the light-emitting layer 218, the hole blocking layer 219, the electron transport layer 220, and the electron injection layer 221 is formed by, for example, a publicly known wet process, dry process, or laser transfer method.

The wet process is performed by, for example, a coating method such as a spin coating method, a dipping method, a doctor blade method, a discharge coating method, or a spray coating method or a printing method such as an ink-jet method, a letterpress printing method, an intaglio printing method, a screen printing method, or a microgravure coating method using a liquid prepared by dissolving or dispersing the material for each of the layers in a solvent.

The liquid used in the coating method or printing method may contain additives for adjusting the physical properties of the liquid, such as a leveling agent and a viscosity modifier.

The dry process is performed by, for example, a resistance heating evaporation method, an electron beam (EB) deposition method, a molecular beam epitaxy (MBE) method, a sputtering method, or an organic vapor phase deposition (OVPD) method using the material constituting each of the layers.

The thickness of each of the hole injection layer 216, the hole transport layer 217, the light-emitting layer 218, the hole blocking layer 219, the electron transport layer 220, and the electron injection layer 221 is normally about 1 nm to 1000 nm and preferably 10 nm to 200 nm. If the thickness is less than 10 nm, the required physical properties (the charge injection, transport, and confinement properties) are not achieved. Furthermore, pixel defects may be caused due to foreign matter such as dust. If the thickness is more than 200 nm, the driving voltage increases due to resistance components of the organic EL layer 214, which increases the power consumption.

The edge cover 222 can be formed of an insulating material by a publicly known method such as an EB deposition method, a sputtering method, an ion plating method, or a resistance heating evaporation method and can also be patterned by a publicly known dry or wet photolithography method, but this embodiment is not limited to these formation methods.

A publicly known material can be used as the insulating material for the edge cover 222. However, in this embodiment, the insulating material is not particularly limited. Since the edge cover 222 needs to transmit light, SiO, SiON, SiN, SiOC, SiC, HfSiON, ZrO, HfO, and LaO are exemplified as the insulating material for the edge cover 222.

The thickness of the edge cover 222 is preferably 100 nm to 2000 nm. If the thickness is less than 100 nm, the insulating property is not sufficiently provided and the leakage occurs between the first electrode 213 and the second electrode 215. This increases the power consumption and causes no emission of light. If the thickness is more than 2000 nm, it takes a lot of time for the film formation process, which decreases the productivity and causes the disconnection of the second electrode 215 due to the edge cover 222.

The organic EL element 212 preferably has a micro-cavity structure (optical micro-cavity structure) provided by an interference effect between the first electrode 213 and the second electrode 215 or a micro-cavity structure (optical micro-cavity structure) provided by a dielectric multilayer film. When a micro-cavity structure is provided by the first electrode 213 and the second electrode 215, the light emitted from the organic EL layer 214 can be concentrated in the front direction (the direction toward the light-output side) due to the interference effect between the first electrode 213 and the second electrode 215. This provides the directivity to the light emitted from the organic EL layer 214, which can reduce the emission loss of light that escapes to the surroundings and can increase the luminous efficiency. Thus, the emission energy generated in the organic EL layer 214 can be efficiently transferred to the fluorescent layer and also the front luminance of display apparatuses can be increased.

The emission spectrum of the organic EL layer 214 can also be adjusted by the interference effect between the first electrode 213 and the second electrode 215, which can provide a desired emission peak wavelength and full width at half maximum. Therefore, a spectrum in which the red and green fluorescent bodies can be more effectively excited can be provided in a controlled manner and the color purity of blue pixels can be improved.

The display apparatus of this embodiment is electrically connected to external driving circuits (scanning line electrode circuit, data signal electrode circuit, and power supply circuit).

The substrate 211 for the organic EL element substrate 210 is a substrate obtained by coating a glass substrate with an insulating material, preferably a substrate obtained by coating a metal substrate or a plastic substrate with an insulating material, and more preferably a substrate obtained by coating a metal substrate or a plastic substrate with an insulating material.

In the display apparatus of this embodiment, the organic EL element substrate 210 may be directly connected to an external circuit to perform driving. Alternatively, a switching circuit such as a TFT may be disposed in a pixel and a wiring line to which the TFT is connected may be electrically connected to external driving circuits (scanning line electrode circuit (source driver), data signal electrode circuit (gate driver), and power supply circuit) for driving the organic EL element substrate 210.

In this embodiment, a color filter is preferably disposed between the fluorescent substrate and the organic EL element substrate 210. A publicly known color filter can be used as the color filter.

By disposing the color filter, the color purity of each of a red pixel, a green pixel, and a blue pixel can be increased and the color reproduction region of display apparatuses can be broadened. A blue color filter formed on a blue fluorescent layer, a green color filter formed on a green fluorescent layer, and a red color filter formed on a red fluorescent layer absorb excitation light components contained in natural light. Therefore, the light emission of the fluorescent layer caused by natural light can be suppressed or prevented, and thus a decrease in the contrast can be suppressed or prevented. Furthermore, excitation light that is transmitted without being absorbed by the fluorescent layer can be prevented from leaking out by the presence of the blue color filter formed on the blue fluorescent layer, the green color filter formed on the green fluorescent layer, and the red color filter formed on the red fluorescent layer. Therefore, a decrease in the color purity of display caused by a color mixture of the excitation light and light emitted from the fluorescent layer can be prevented.

According to the display apparatus of this embodiment, there can be realized a display apparatus in which the conversion efficiency is considerably improved by increasing the light output efficiency and which has good viewing angle characteristics and low power consumption.

(2) Second Embodiment

Figure 16:
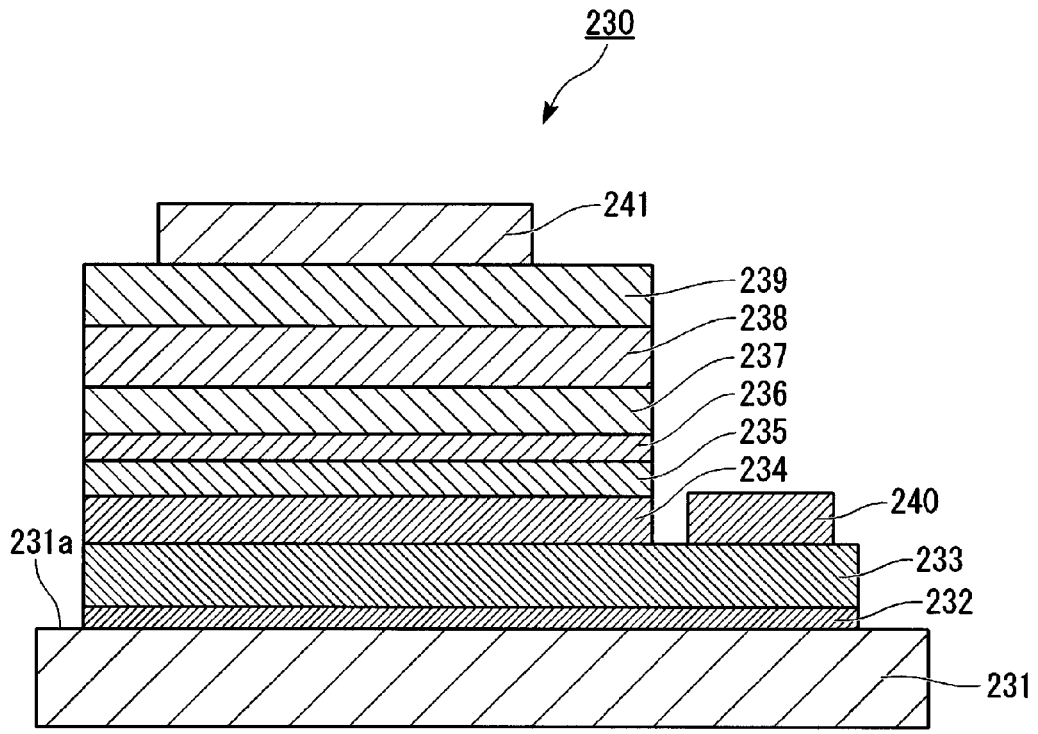
FIG. 16 is a schematic sectional view illustrating an organic EL element substrate in a second embodiment of the display apparatus according to the present invention.

FIG. 16 is a schematic sectional view illustrating an organic EL element substrate constituting a second embodiment of the display apparatus according to the present invention.

The display apparatus of this embodiment schematically includes a fluorescent substrate which is the substrate 14 in the first to tenth embodiments of the above light-emitting devices on which the fluorescent layer 13, the barrier 15, the low-refractive-index layer 16, the light-absorbing layer 17, and the like are formed and an LED substrate (light source) 230 bonded to the fluorescent substrate through the planarizing film 12 and the like in the first to tenth embodiments of the above light-emitting devices.

The LED substrate 230 schematically include a substrate 231; a first buffer layer 232, an n-type contact layer 233, a second n-type cladding layer 234, a first n-type cladding layer 235, an active layer 236, a first p-type cladding layer 237, a second p-type cladding layer 238, and a second buffer layer 239 sequentially stacked on one surface 211a of the substrate 211; a cathode 240 formed on the n-type contact layer 233; and an anode 241 formed on the second buffer layer 239.

Other publicly known LEDs such as an ultraviolet-light-emitting inorganic LED and blue-light-emitting inorganic LED may also be used, and the specific structure is not limited to the above structure.

The constituent components of the LED substrate 230 will now be described in detail.

The active layer 236 is a layer in which light emission occurs as a result of recombination of electrons and holes. A publicly known active layer material for LEDs can be used as an active layer material. Examples of an active layer material for ultraviolet light include AlGaN, InAlN, $In_aAl_bGa_{1-a-b}N$ ($0 \leq a$, $0 \leq b$, $a+b \leq 1$). An example of an active layer material for blue light is $In_zGa_{1-z}N$ ($0<z<1$). However, this embodiment is not limited thereto.

The active layer 236 has a single quantum well structure or a multiple quantum well structure. The active layer having a quantum well structure may be of n-type or p-type, but a non-doped (no addition of impurities) active layer is preferably employed because the full width at half maximum of the emission wavelength is narrowed due to band-to-band emission and thus emitted light with high color purity is provided.

The active layer 236 may be doped with at least one of a donor impurity and an acceptor impurity. In the case where the crystallinity of an active layer doped with an impurity is the same as that of a non-doped active layer, when the active layer is doped with a donor impurity, the band-to-band emission intensity can be further increased compared with a non-doped active layer. When the active layer is doped with an acceptor impurity, the peak wavelength can be shifted to the lower energy side by about 0.5 eV from the peak wavelength of band-to-band emission, but the full width at half maximum is broadened. When the active layer is doped with both an acceptor impurity and a donor impurity, the emission intensity can be further increased compared with the emission intensity of an active layer doped with only an acceptor impurity. In particular, when an active layer doped with an acceptor impurity is formed, the conductivity type of the active layer is preferably set to be an n-type by also performing doping with a donor impurity such as Si.

The second n-type cladding layer 234 and the first n-type cladding layer 235 can be formed of a publicly known n-type cladding layer material for LEDs and may be constituted by a single layer or multiple layers. When the second n-type cladding layer 234 and the first n-type cladding layer 235 are formed of an n-type semiconductor having a band gap energy larger than that of the active layer 236, a potential barrier for holes is formed between the second n-type and first n-type cladding layers 234 and 235 and the active layer 236. As a result, holes can be confined in the active layer 236. For example, the second n-type cladding layer 234 and the first n-type cladding layer 235 can be formed of n-type $In_xGa_{1-x}N$ ($0 \leq x < 1$), but this embodiment is not limited thereto.

The first p-type cladding layer 237 and the second p-type cladding layer 238 can be formed of a publicly known p-type cladding layer material for LEDs and may be constituted by a single layer or multiple layers. When the first p-type cladding layer 237 and the second p-type cladding layer 238 are formed of a p-type semiconductor having a band gap energy larger than that of the active layer 236, a potential barrier for electrons is formed between the first p-type and second p-type cladding layers 237 and 238 and the active layer 236. As a result, electrons can be confined in the active layer 236. For example, the first p-type cladding layer 237 and the second p-type cladding layer 238 can be formed of $Al_yGa_{1-y}N$ ($0 \leq y \leq 1$), but this embodiment is not limited thereto.

The n-type contact layer 233 can be formed of a publicly known contact layer material for LEDs. For example, an n-type contact layer 233 composed of n-type GaN can be formed as a layer which is in contact with the second n-type cladding layer 234 and the first n-type cladding layer 235 and on which an electrode is formed. A p-type contact layer composed of p-type GaN can also be formed as a layer which is in contact with the first p-type cladding layer 237 and the second p-type cladding layer 238 and on which an electrode is formed. Herein, if the second n-type cladding layer 234 and the second p-type cladding layer 238 are formed of GaN, the p-type contact layer is not necessarily formed, and the second cladding layer (second n-type cladding layer 234, second p-type cladding layer 238) can be treated as the contact layer.

The above-described layers used in this embodiment can be formed by a publicly known film formation process for LEDs, but this embodiment is not particularly limited thereto. For example, the above layers can be formed on a substrate such as a sapphire substrate (including C plane, A plane, and R plane), a SiC substrate (including 6H—SiC and 4H—SiC), a spinel substrate ($MgAl_2O_4$, particularly its (111) plane), a ZnO substrate, a Si substrate, a GaAs substrate, or another oxide single crystal substrate (e.g., NGO) by a vapor deposition method such as MOVPE (metal-organic vapor phase epitaxy), MBE (molecular beam epitaxy), or HDVPE (hydride vapor phase epitaxy).

According to the display apparatus of this embodiment, there can be realized a display apparatus in which the conversion efficiency is considerably improved by increasing the light output efficiency and which has good viewing angle characteristics and low power consumption.

(3) Third Embodiment

Figure 17:
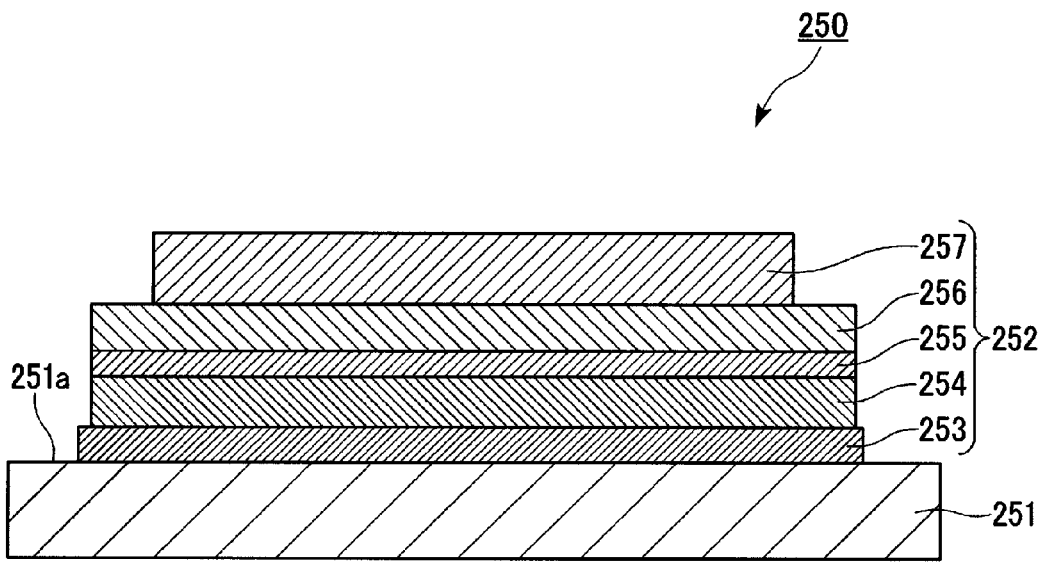
FIG. 17 is a schematic sectional view illustrating an inorganic EL element substrate in a third embodiment of the display apparatus according to the present invention.

FIG. 17 is a schematic sectional view illustrating an inorganic EL element substrate constituting a third embodiment of the display apparatus according to the present invention.

The display apparatus of this embodiment schematically includes a fluorescent substrate which is the substrate 14 in the first to tenth embodiments of the above light-emitting devices on which the fluorescent layer 13, the barrier 15, the low-refractive-index layer 16, the light-absorbing layer 17, and the like are formed and an inorganic EL element substrate (light source) 250 bonded to the fluorescent substrate through the planarizing film 12 and the like in the first to tenth embodiments of the above light-emitting devices.

The inorganic EL element substrate 250 schematically includes a substrate 251 and an inorganic EL element 252 disposed on one surface 251a of the substrate 251.

The inorganic EL element 252 includes a first electrode 253, a first dielectric layer 254, a light-emitting layer 255, a second dielectric layer 256, and a second electrode 257 sequentially stacked on the one surface 251a of the substrate 251.

The first electrode 253 and the second electrode 257 function as a pair of an anode and a cathode of the inorganic EL element 252.

The inorganic EL element 252 can be formed of a publicly known inorganic EL element such as an ultraviolet-light-emitting inorganic EL element or a blue-light-emitting inorganic EL element, but the specific structure is not limited to the above structure.

The constituent members and formation method of the inorganic EL element substrate 250 will now be specifically described, but this embodiment is not limited to the constituent members and the formation method.

The same substrate as the substrate 211 in the organic EL element substrate 210 is used as the substrate 251.

The first electrode 253 and the second electrode 257 function as a pair of an anode and a cathode of the inorganic EL element 252. In other words, when the first electrode 253 is an anode, the second electrode 257 is a cathode. When the first electrode 253 is a cathode, the second electrode 257 is an anode.

The first electrode 253 and the second electrode 257 are composed of a transparent electrode material, e.g., a metal such as aluminum (Al), gold (Au), platinum (Pt), or nickel (Ni); an oxide (ITO) of indium (In) and tin (Sn); an oxide ($SnO_2$) of tin (Sn); and an oxide (IZO) of indium (In) and zinc (Zn). However, this embodiment is not limited to these materials. An electrode disposed on the side to which light is output may be a transparent electrode composed of ITO or the like. An electrode disposed on the side opposite the side to which light is output is preferably a reflective electrode composed of aluminum or the like.

The first electrode 253 and the second electrode 257 can be formed of the above material by a publicly known method such as an EB deposition method, a sputtering method, an ion plating method, or a resistance heating evaporation method, but this embodiment is not limited to these formation methods. If necessary, the formed electrodes can be patterned by a photolithography method or a laser lift-off method. Alternatively, a patterned electrode can be formed by using a shadow mask in combination.

The thickness of each of the first electrode 253 and the second electrode 257 is preferably 50 nm or more.

If the thickness is less than 50 nm, the wiring resistance increases, which may increase the driving voltage.

The first dielectric layer 254 and the second dielectric layer 256 can be formed of a publicly known dielectric material for inorganic EL elements. Examples of the dielectric material include tantalum pentoxide ($Ta_2O_5$), silicon oxide ($SiO_2$), silicon nitride ($Si_3N_4$), aluminum oxide ($Al_2O_3$), aluminum titanate ($AlTiO_3$), barium titanate ($BaTiO_3$), and strontium titanate ($SrTiO_3$). However, this embodiment is not limited to these dielectric materials.

The first dielectric layer 254 and the second dielectric layer 256 may have a single-layer structure composed of one dielectric material selected from the above dielectric materials or may have a multilayer structure composed of two or more of the dielectric materials. The thickness of each of the first dielectric layer 254 and the second dielectric layer 256 is preferably about 200 nm to 500 nm.

The light-emitting layer 255 can be formed of a publicly known light-emitting material for inorganic EL elements. Examples of the light-emitting material include ultraviolet-light-emitting materials such as $ZnF_2$:Gd; and blue-light-emitting materials such as $BaAl_2S_4$:Eu, $CaAl_2S_4$:Eu, $ZnAl_2S_4$:Eu, $Ba_2SiS_4$:Ce, ZnS:Tm, SrS:Ce, SrS:Cu, CaS:Pb, and $(Ba,Mg)Al_2S_4$:Eu. However, this embodiment is not limited to these light-emitting materials.

The thickness of the light-emitting layer 255 is preferably about 300 nm to 1000 nm.

According to the display apparatus of this embodiment, there can be realized a display apparatus in which the conversion efficiency is considerably improved by increasing the light output efficiency and which has good viewing angle characteristics and low power consumption.

As a structure of the light source, the organic EL element substrate has been exemplified in the first embodiment, the LED substrate has been exemplified in the second embodiment, and the inorganic EL element substrate has been exemplified in the third embodiment. In these structures, a sealing film or a sealing substrate for sealing the organic EL element, LED, and inorganic EL element is preferably disposed.

Such a sealing film or a sealing substrate can be formed by employing a publicly known sealing material and sealing method. Specifically, a sealing film can be formed by applying a resin onto a surface on the side opposite the substrate constituting the light source by, for example, a spin coating method, ODF, or a laminating method. Alternatively, a sealing film can be formed by forming an inorganic film composed of SiO, SiON, SiN, or the like by a plasma CVD method, an ion plating method, an ion beam method, or a sputtering method and then applying a resin by a spin coating method, ODF, or a laminating method, or a sealing substrate can be bonded.

The sealing film or the sealing substrate can prevent oxygen and moisture from entering the light-emitting element from the outside, which increases the life of the light source.

When the light source and the fluorescent substrate are joined to each other, they can be bonded to each other with, for example, a publicly known ultraviolet-curable resin or thermosetting resin.

When the light source is directly formed on the fluorescent substrate, there is employed a method in which an inert gas such as nitrogen gas or argon gas is sealed with a glass plate, a metal plate, or the like. Furthermore, for example, a moisture absorbent such as barium oxide is preferably mixed in the sealed inert gas because the degradation of the organic EL element due to moisture can be more effectively reduced.

This embodiment is not limited to these members and the formation methods. When light is output from the side opposite the substrate, a light-transparent material needs to be used for the sealing film or sealing substrate.

(4) Fourth Embodiment

Figure 18:
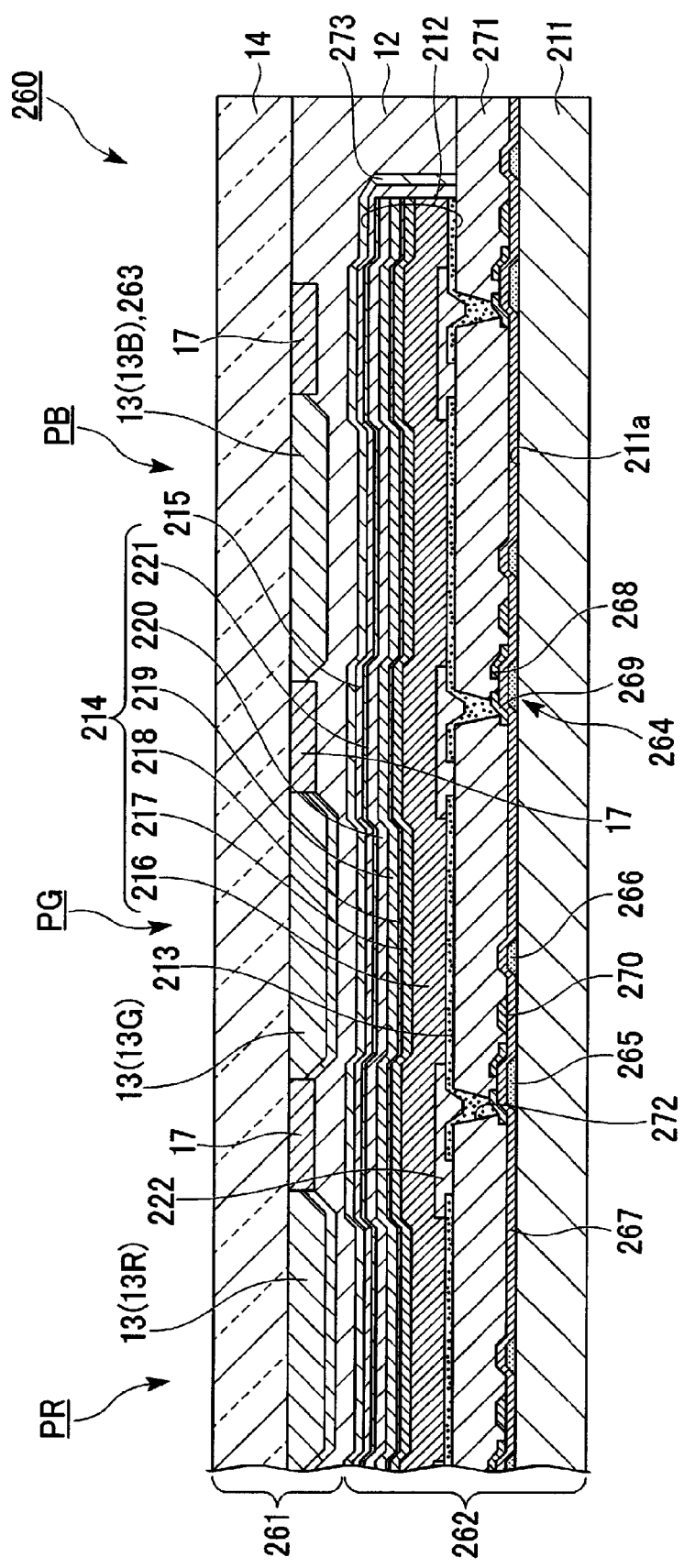
FIG. 18 is a schematic sectional view illustrating a fourth embodiment of the display apparatus according to the present invention.
Figure 19:
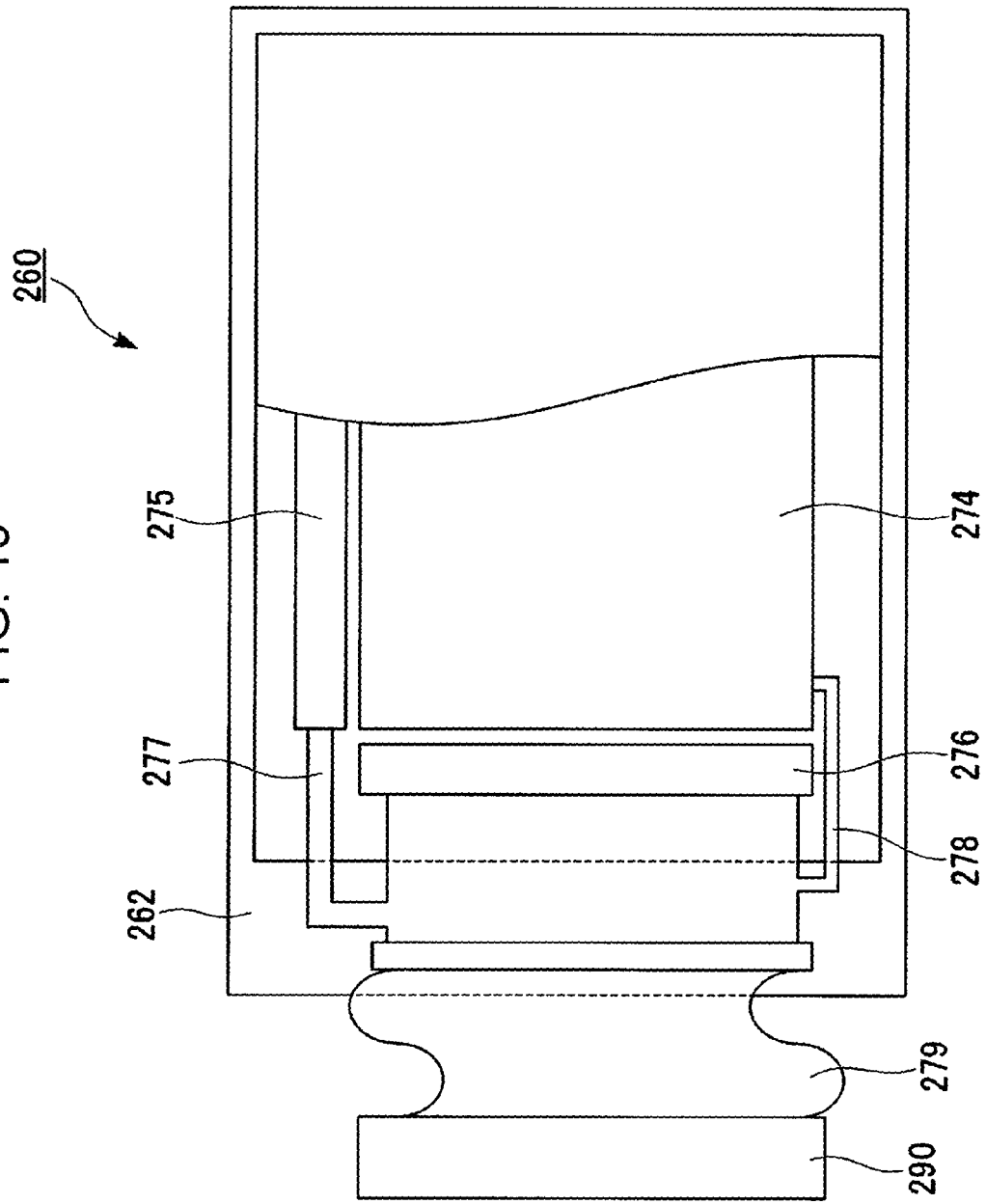
FIG. 19 is a schematic plan view illustrating the fourth embodiment of the display apparatus according to the present invention.

FIG. 18 is a schematic sectional view illustrating a fourth embodiment of the display apparatus according to the present invention. FIG. 19 is a schematic plan view illustrating the fourth embodiment of the display apparatus according to the present invention. In FIG. 18, the same constituent elements as those of the light-emitting device 10 illustrated in FIG. 1 and the organic EL element substrate 210 illustrated in FIG. 15 are designated by the same reference numerals, and the descriptions thereof are omitted.

The display apparatus 260 of this embodiment schematically includes a fluorescent substrate 261 which has the same structure as the substrate 14 in the first to tenth embodiments of the above light-emitting devices on which the fluorescent layer 13, the barrier 15, the low-refractive-index layer 16, the light-absorbing layer 17, and the like are formed and an active-matrix drive organic EL element substrate (light source) 262 bonded to the fluorescent substrate 261 through the planarizing film 12 in the first to tenth embodiments of the above light-emitting devices.

In the organic EL element substrate 262, active-matrix drive that uses a TFT is used as means for switching whether each of a red pixel PR, a green pixel PG, and a blue pixel PB is irradiated with light.

In the case where the organic EL element substrate 262 emits blue light, the blue pixel PB includes a light-scattering layer 263 that scatters blue light.

Active-Matrix Drive Organic EL Element Substrate

The active-matrix drive organic EL element substrate 262 will now be described in detail.

The organic EL element substrate 262 includes a TFT 264 formed on one surface 211a of a substrate 211. That is, a gate electrode 265 and a gate line 266 are formed on the one surface 211a of the substrate 211, and a gate insulating film 267 is formed on the one surface 211a of the substrate 211 so as to cover the gate electrode 265 and the gate line 266. An active layer (not illustrated) is formed on the gate insulating film 267, and a source electrode 268, a drain electrode 269, and a data line 270 are formed on the active layer. A planarizing film 271 is formed so as to cover the source electrode 268, the drain electrode 269, and the data line 270.

The planarizing film 271 does not necessarily have a single-layer structure and may be combined with another interlayer insulating film. A contact hole 272 that penetrates through the planarizing film 271 or the interlayer insulating film and reaches the drain electrode 269 is formed. The first electrode 213 of the organic EL element 212 that is electrically connected to the drain electrode 269 through the contact hole 272 is formed on the planarizing film 271. The structure of the organic EL element 212 is the same as in the first embodiment.

The TFT 264 is formed on the one surface 211a of the substrate 211 in advance before the formation of the organic EL element 212 and functions as a pixel switching element and an organic EL element driving element.

A publicly known TFT is used as the TFT 264. The TFT 264 can be formed by employing a publicly known material, structure, and formation method. In this embodiment, a metal-insulator-metal (MIM) diode may also be used instead of the TFT 264.

The active layer of the TFT 264 is composed of the same material as in the first embodiment.

The active layer of the TFT 264 is formed by the same method as in the first embodiment.

The gate insulating film 267 of the TFT 264 can be formed of a publicly known material. The gate insulating film 267 is composed of, for example, $SiO_2$ formed by a PECVD method or an LPCVD method or $SiO_2$ obtained by thermally oxidizing a polysilicon film.

The data line 270, gate line 266, source electrode 268, and drain electrode 269 of the TFT 264 can be formed of a publicly known conductive material. The data line 270, gate line 266, source electrode 268, and drain electrode 269 are composed of a material such as tantalum (Ta), aluminum (Al), or copper (Cu).

The TFT 264 may have the above configuration, but this embodiment is not limited to the materials, the structures, and the formation methods.

The interlayer insulating film used in this embodiment is the same as in the first embodiment.

The interlayer insulating film is formed by the same method as in the first embodiment.

When light emitted from the organic EL element 212 is output from the side (second electrode 215 side) opposite the substrate 211, a light-shielding insulating film having a light-shielding property is preferably formed in order to prevent a change in the electrical characteristics of the TFT 264 caused when natural light enters the TFT 264 formed on the one surface 211a of the substrate 211. The interlayer insulating film and the light-shielding insulating film can be used in combination. The light-shielding insulating film is composed of the same material as in the first embodiment.

In the display apparatus 260, projections and depressions are formed in the surface due to the TFT 264, wiring lines, and electrodes formed on the one surface 211a of the substrate 211, which may cause the partial loss and disconnection of the first electrode 213 and the second electrode 215, the partial loss of the organic EL layer 214, the short circuit between the first electrode 213 and the second electrode 215, and the decrease in withstand voltage in the organic EL element 212. The planarizing film 271 is desirably formed on the interlayer insulating film to prevent these phenomena.

The planarizing film 271 can be formed of a publicly known material. The planarizing film 271 is composed of the same material as in the first embodiment.

The planarizing film 271 may have a single-layer structure or a multilayer structure.

A sealing film 273 for sealing the organic EL element 212 is disposed on the surface (the surface facing the fluorescent substrate 261) of the organic EL element 212.

As illustrated in FIG. 19, the display apparatus 260 includes a pixel unit 274, a gate signal driving circuit 276, a data signal driving circuit 275, a signal wiring line 277, and a current supply line 278 formed on the organic EL element substrate 262; and a flexible printed circuit (hereafter may be abbreviated as "FPC") 279 and an external driving circuit 290 connected to the organic EL element substrate 262.

The organic EL element substrate 262 is electrically connected to the external driving circuit 290, which includes a scanning line electrode circuit, a data signal electrode circuit, and a power supply circuit, through the FPC 279 in order to drive the organic EL element 214. In this embodiment, switching circuits, such as the TFT 264, are disposed in the pixel unit 274. The data signal driving circuit 275 and the gate signal driving circuit 276 for driving the organic EL element 212 are respectively connected to the wiring lines such as the data line 270 and the gate line 266 to which the TFT 264 and the like are connected. These driving circuits are connected to the external driving circuit 290 through the signal wiring line 277. A plurality of gate lines 266 and a plurality of data lines 270 are disposed in the pixel unit 274. The TFT 264 is disposed near an intersection of the gate line 266 and the data line 270.

The organic EL element 212 is driven by a voltage drive digital gradation system and includes two TFTs of a switching TFT and a driving TFT provided for each pixel. The driving TFT is electrically connected to the first electrode 213 of the organic EL element 214 through the contact hole 272 formed in the planarizing film 271. A capacitor (not shown) for controlling the gate potential of the driving TFT to be a constant potential is connected to the gate electrode of the driving TFT in each pixel. However, this embodiment is not particularly limited thereto. The driving system may be the voltage drive digital gradation system described above or a current drive analog gradation system. The number of TFTs is not particularly limited. The organic EL element 214 may be driven with two TFTs. Alternatively, in order to prevent variations in characteristics (mobility and threshold voltage) of the TFT 264, the organic EL element 214 may be driven with two or more TFTs including a compensation circuit in a pixel.

According to the display apparatus 260, there can be realized a display apparatus in which the conversion efficiency is considerably improved by increasing the light output efficiency and which has good viewing angle characteristics and low power consumption.

In particular, in this embodiment, a display apparatus having high display quality can be realized because an active-matrix drive organic EL element substrate 262 is employed. The active-matrix drive can increase the light emission time of the organic EL element 214 as compared with passive drive and thereby decrease the driving current required for desired luminance, thus reducing power consumption. Furthermore, since light is output from the side (the fluorescent substrate 261 side) opposite the organic EL element substrate 262, the emission region can be broadened regardless of the regions in which TFTs and various wiring lines are formed, and the opening ratio of the pixels can be increased.

(5) Fifth Embodiment

Figure 20:
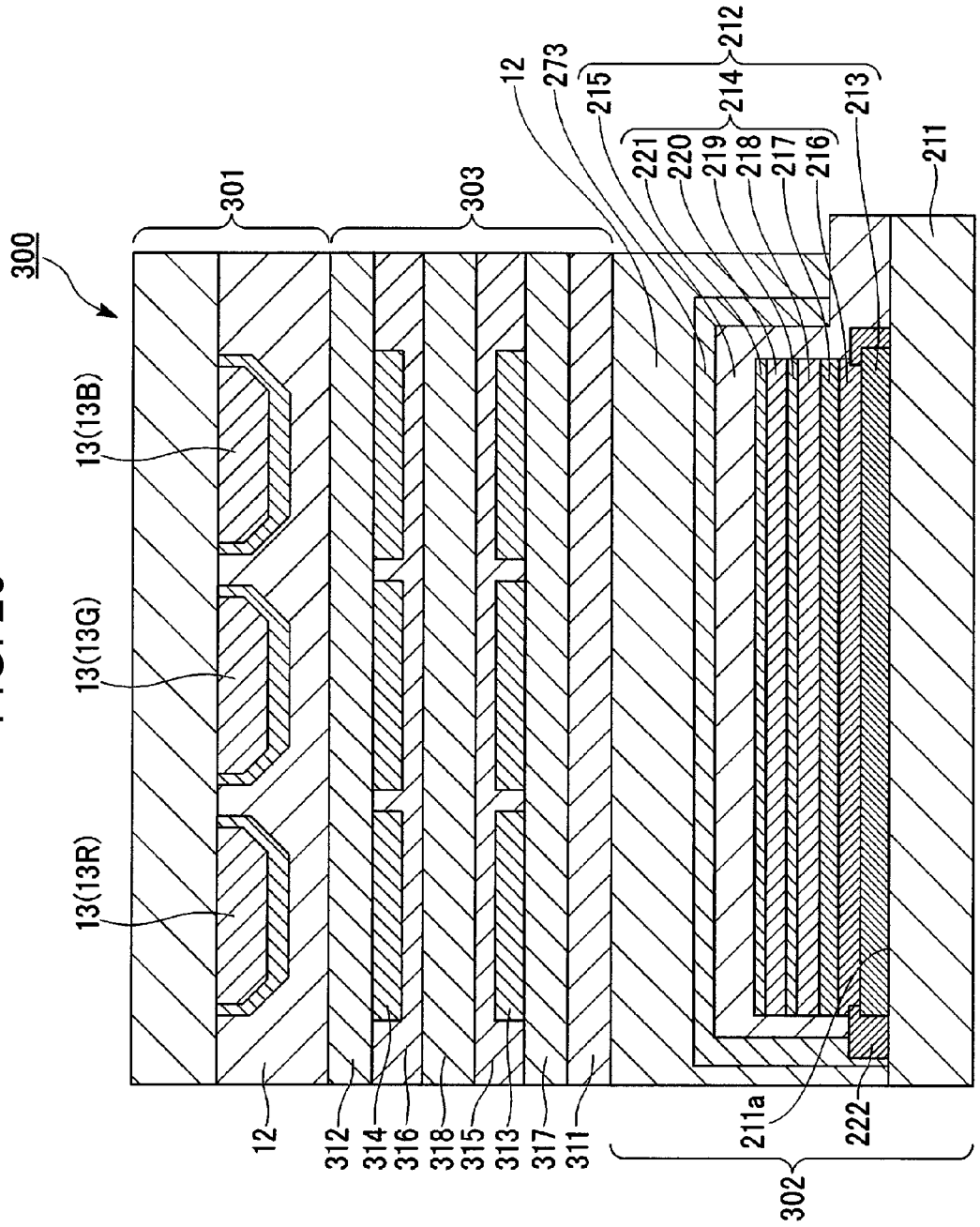
FIG. 20 is a schematic sectional view illustrating a fifth embodiment of the display apparatus according to the present invention.

FIG. 20 is a schematic sectional view illustrating a fifth embodiment of the display apparatus according to this embodiment. In FIG. 20, the same constituent elements as those of the light-emitting device 10 illustrated in FIG. 1, the organic EL element substrate 210 illustrated in FIG. 15, and the display apparatus 260 illustrated in FIG. 18 are designated by the same reference numerals, and the descriptions thereof are omitted.

A display apparatus 300 of this embodiment schematically includes a fluorescent substrate 301 which has the same structure as the substrate 14 in the first to tenth embodiments of the above light-emitting devices on which the fluorescent layer 13, the barrier 15, the low-refractive-index layer 16, the light-absorbing layer 17, and the like are formed, an organic EL element substrate (light source) 302, and a liquid crystal device 303.

The organic EL element 212 of the organic EL element substrate 302 is not separated for each pixel and functions as a planar light source that is common to all pixels.

In the liquid crystal device 303, a voltage applied to a liquid crystal layer can be controlled for each pixel using a pair of electrodes, and the transmittance of light emitted from the entire surface of the organic EL element 212 is controlled for each pixel. That is, the liquid crystal device 303 functions as an optical shutter for allowing light from the organic EL element substrate 302 to selectively pass through each pixel.

A publicly known liquid crystal device can be used as the liquid crystal device 303. The liquid crystal device 303 includes a pair of polarizing plates 311 and 312, transparent electrodes 313 and 314, alignment films 315 and 316, a substrate 317, and a liquid crystal 318 disposed between the alignment films 315 and 316.

An optical anisotropy layer may be disposed between a liquid crystal cell and one of the polarizing plates 311 and 312, or an optical anisotropy layer may be disposed between a liquid crystal cell and the polarizing plate 311 and between a liquid crystal cell and the polarizing plate 312. In the display apparatus 300, the polarizing plate is preferably disposed on the light-output side.

A combination of a known linearly polarizing plate and a $\lambda/4$ plate can be used as the polarizing plates 311 and 312. By disposing the polarizing plates 311 and 312, natural light reflection from an electrode of the display apparatus 300 and natural light reflection at the surface of the substrate or sealing substrate can be prevented, which improves the contrast of the display apparatus 300.

The polarizing plates 311 and 312 suitably have an extinction ratio of 10000 or more at a wavelength of 435 nm or more and 480 nm or less.

The type of liquid crystal cell is not particularly limited and can be appropriately selected in accordance with the application. Examples of the type of liquid crystal cell include a TN mode, a VA mode, an OCB mode, an IPS mode, and an ECB mode.

The liquid crystal device 303 may undergo passive drive or active drive that uses a switching element such as a TFT.

According to the display apparatus 300, there can be realized a display apparatus in which the conversion efficiency is considerably improved by increasing the light output efficiency and which has good viewing angle characteristics and low power consumption.

In this embodiment, by combining the switching of pixels performed by the liquid crystal device 303 and the organic EL element substrate 302 that functions as a planar light source, the power consumption can be further reduced.

Cellular Phone

Figure 21:
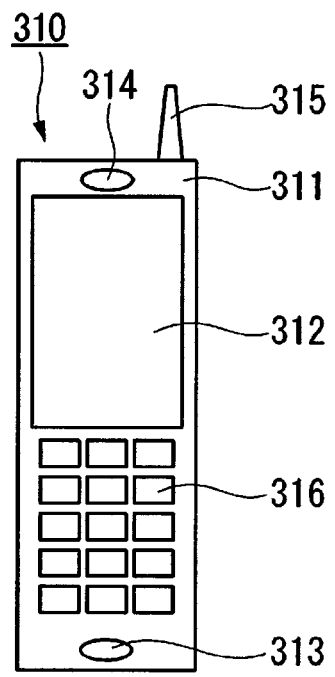
FIG. 21 is an external view illustrating a cellular phone, which is one application example of the first to fifth embodiments of the display apparatus according to the present invention.

The display apparatuses according to one of the first to fifth embodiments can be applied to, for example, a cellular phone illustrated in FIG. 21.

A cellular phone 310 includes a main body 311, a display screen 312, a sound input unit 313, a sound output unit 314, an antenna 315, and operation switches 316. The display apparatus according to one of the first to fifth embodiments can be appropriately used as the display screen 312. By using the display apparatus according to one of the first to fifth embodiments as the display screen 312 of the cellular phone 310, a high luminance screen image can be displayed at low power consumption.

Flat Panel Television

Figure 22:
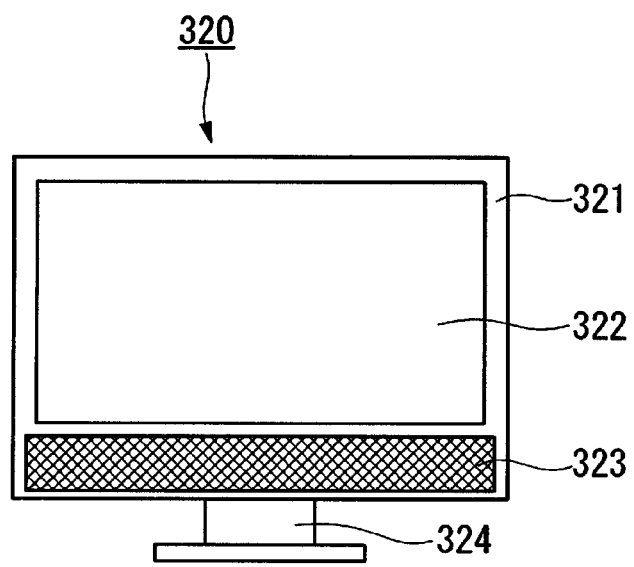
FIG. 22 is an external view illustrating a flat panel television, which is one application example of the first to fifth embodiments of the display apparatus according to the present invention.

The display apparatuses according to one of the first to fifth embodiments can be applied to, for example, a flat panel television illustrated in FIG. 22.

A flat panel television 320 includes a main body cabinet 321, a display screen 322, a speaker 323, and a stand 324. The display apparatus according to one of the first to fifth embodiments can be appropriately used as the display screen 322. By using the display apparatus according to one of the first to fifth embodiments as the display screen 322 of the flat panel tele vision 320, a high luminance screen image can be displayed at low power consumption.

Illumination Apparatus (1) First Embodiment

Figure 23:
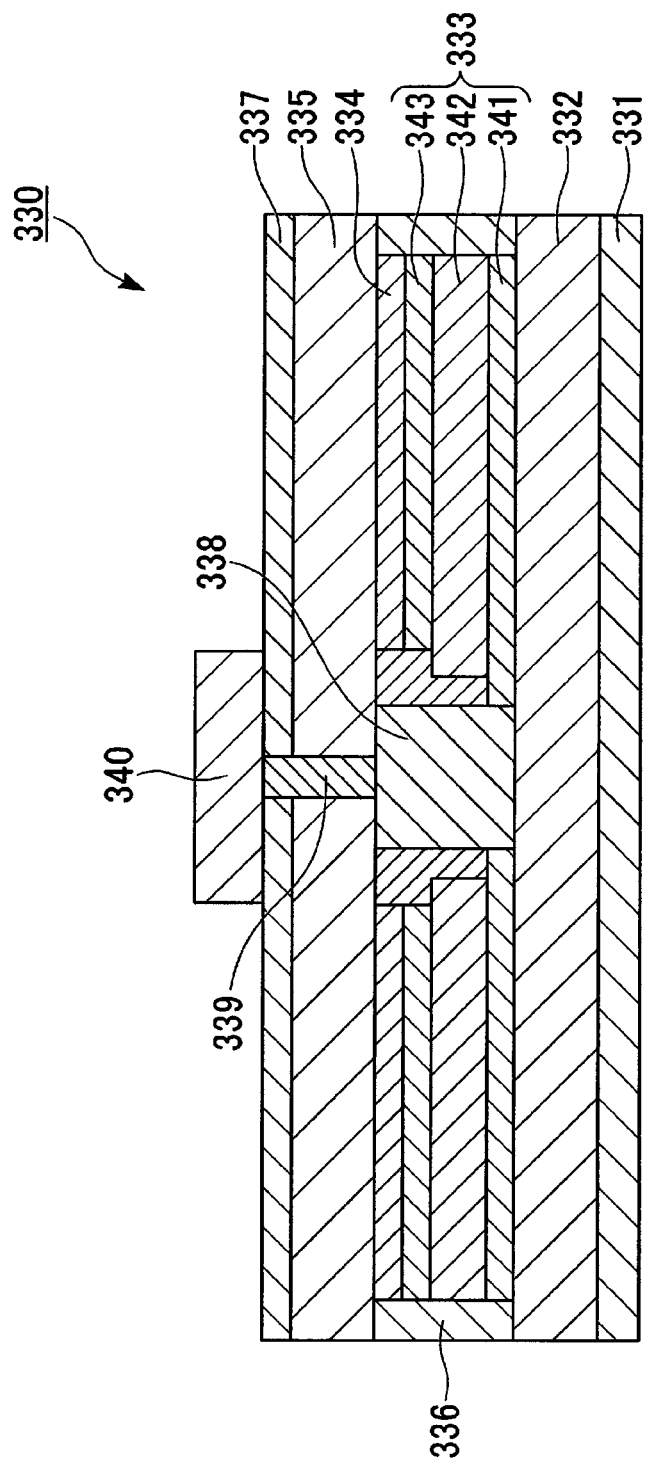
FIG. 23 is a schematic sectional view illustrating a first embodiment of an illumination apparatus according to the present invention.

FIG. 23 is a schematic sectional view illustrating a first embodiment of an illumination apparatus according to the present invention.

An illumination apparatus 330 of this embodiment schematically includes an optical film 331, a fluorescent substrate 332, an organic EL element 333, a thermal diffusion sheet 334, a sealing substrate 335, a sealing resin 336, a heat dissipation member 337, a driving circuit 338, a wiring ling 339, and a ceiling hanger 340.

The organic EL element 333 schematically includes an anode 341, an organic EL layer 342, and a cathode 343.

In the illumination apparatus 330, a fluorescent substrate which has the same structure as the substrate 14 in the first to tenth embodiments of the above light-emitting devices on which the fluorescent layer 13, the barrier 15, the low-refractive-index layer 16, the light-absorbing layer 17, and the like are formed is used as the fluorescent substrate 332. Therefore, an illumination apparatus with high brightness and low power consumption can be realized.

(2) Second Embodiment

Figure 24A:
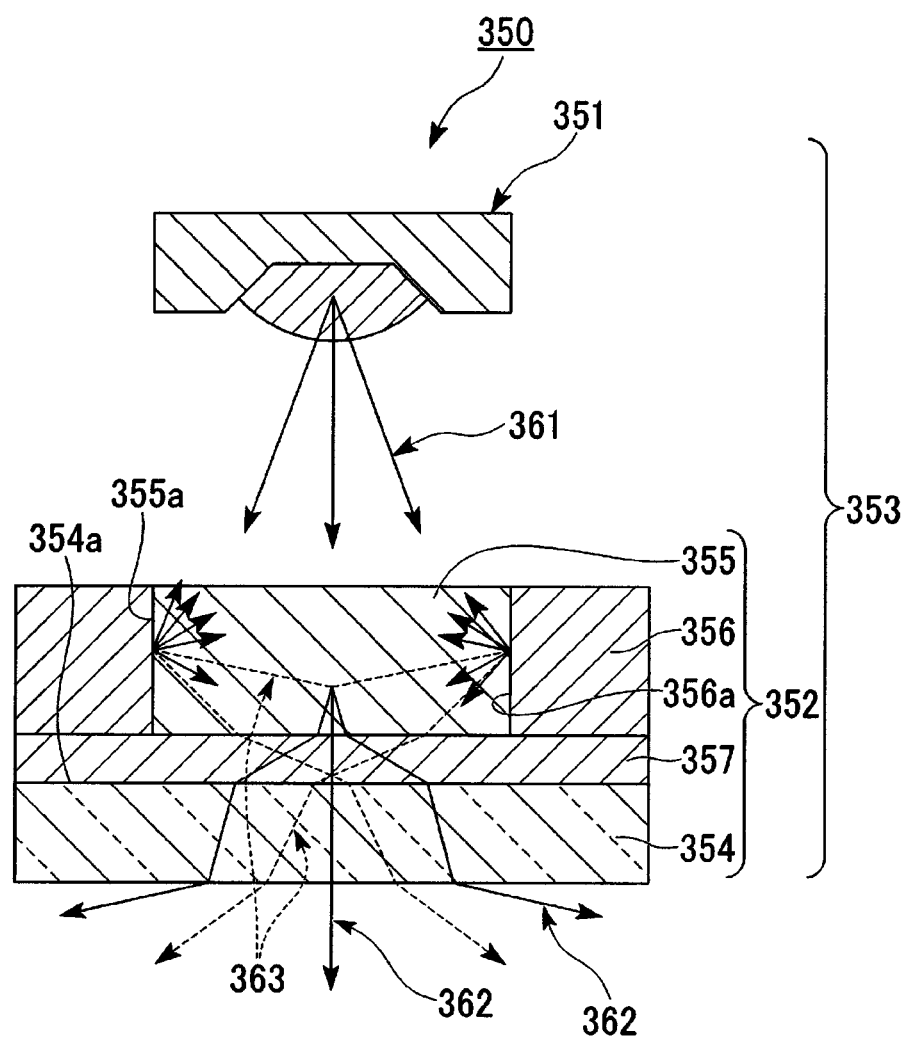
FIG. 24A is a schematic sectional view illustrating a second embodiment of the illumination apparatus according to the present invention.
Figure 24B:
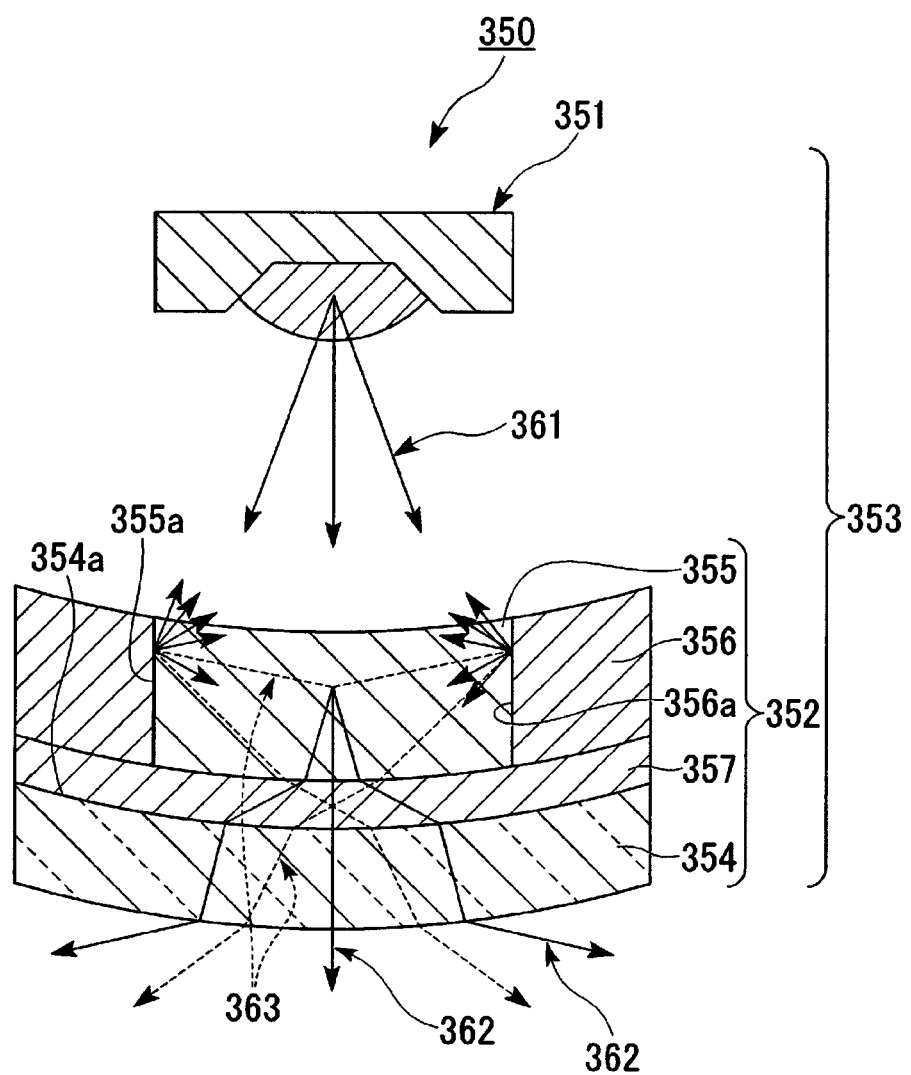
FIG. 24B is a schematic sectional view illustrating the second embodiment of the illumination apparatus according to the present invention.

FIGS. 24A and 24B are schematic sectional views illustrating a second embodiment of the illumination apparatus according to the present invention.

An illumination apparatus 350 includes a light-emitting device 353 schematically including an excitation light source 351 that emits excitation light and a fluorescent substrate 352.

The fluorescent substrate 352 schematically includes a substrate 354, a fluorescent layer 355 that is formed on one surface 354a of the substrate 354 so as to face the excitation light source 351 and that is excited by the excitation light to emit fluorescence, a barrier 356 that surrounds side surfaces 355a of the fluorescent layer 355, the side surfaces 355a extending in a stacking direction of the excitation light source 351 and the substrate 354, and a low-refractive-index layer 357 formed between the fluorescent layer 355 and the substrate 354 and having a refractive index lower than that of the substrate 354.

The barrier 356 has a light-scattering property at least in a portion that faces the fluorescent layer 355 (a side surface 356a of the barrier 356).

Examples of a structure in which the barrier 356 has a light-scattering property include a structure in which the barrier 356 itself is formed of a material containing a resin and light-scattering particles and a structure in which a light-scattering layer (light-scattering film) formed of a material containing a resin and light-scattering particles is disposed on a side surface 356a of the barrier 356.

The same excitation light source as the excitation light source 11 in the first to tenth embodiments of the above light-emitting devices is used as the excitation light source 351.

The same substrate as the substrate 14 in the first to tenth embodiments of the above light-emitting devices is used as the substrate 354.

The same fluorescent layer as the fluorescent layer 13 in the first to tenth embodiments of the above light-emitting devices is used as the fluorescent layer 355.

The same barrier as the barrier 15 in the first to tenth embodiments of the above light-emitting devices is used as the barrier 356.

The same low-refractive-index layer as the low-refractive-index layer 16 in the first to tenth embodiments of the above light-emitting devices is used as the low-refractive-index layer 357.

Light emission in the illumination apparatus 350 will be described with reference to FIG. 24A.

In the illumination apparatus 350, when excitation light 361 enters the fluorescent layer 355 from the excitation light source 351, fluorescence from a fluorescent body is isotropically emitted from the fluorescent layer 355. Part of a fluorescent component 362 (indicated by a solid line in FIG. 24A) emitted to the light-output side (front direction, substrate 354 side) among the fluorescent components emitted from the fluorescent layer 355 can be effectively output to the outside as emission light. A fluorescent component 363 (indicated by a broken line in FIG. 24A) emitted in a direction toward the side surface 355a of the fluorescent layer 355 among the fluorescent components emitted from the fluorescent layer 355 is scattered at the side surface 356a of the barrier 356 having a light-scattering property, and part of the scattered light can be effectively output to the outside as emission light.

Among the fluorescent components emitted from the fluorescent layer 355, a fluorescent component that is emitted at a large angle relative to the direction of the normal to the substrate 354 and is reflected at the interface between the fluorescent layer 355 and the substrate 354 and a fluorescent component emitted to the side (back surface side) opposite the light-output side of the fluorescent layer 355 are scattered at the side surface 356a of the barrier 356 having a light-scattering property and recycled as components that can be output to the substrate 354 side again.

As described above, in the illumination apparatus 350, the barrier 356 has a light-scattering property at least in a portion (side surface 356a) that faces the fluorescent layer 355 and the low-refractive-index layer 357 having a refractive index lower than that of the substrate 354 is formed between the fluorescent layer 355 and the substrate 354. Therefore, the incident angle of light that can enter the substrate 354 from the fluorescent layer 355 can be controlled, and the light that enters the substrate 354 can be output to the outside with certainty without being reflected at the interface between the substrate 354 and the outside. Consequently, the light utilization efficiency can be improved. Furthermore, among the fluorescent components emitted from the fluorescent layer 355, the fluorescent component that is reflected at the interface between the fluorescent layer 355 and the substrate 354 and the fluorescent component that is emitted to the side opposite the light-output side of the fluorescent layer 355 are scattered at the side surface 356a of the barrier 356 having a light-scattering property and recycled as components that can be output to the substrate 354 side again. Therefore, the light utilization efficiency can be further improved. Accordingly, the illumination apparatus 350 is an illumination apparatus with high brightness and low power consumption.

FIG. 24A shows the case where each of the layers constituting the fluorescent substrate 352 has a horizontal surface, but this embodiment is not limited thereto. As illustrated in FIG. 24B, each of the layers constituting the fluorescent substrate 352 may have a curved surface that protrudes to the light-output side (front direction, substrate 354 side).

Electricity-Generating Apparatus

Figure 25:
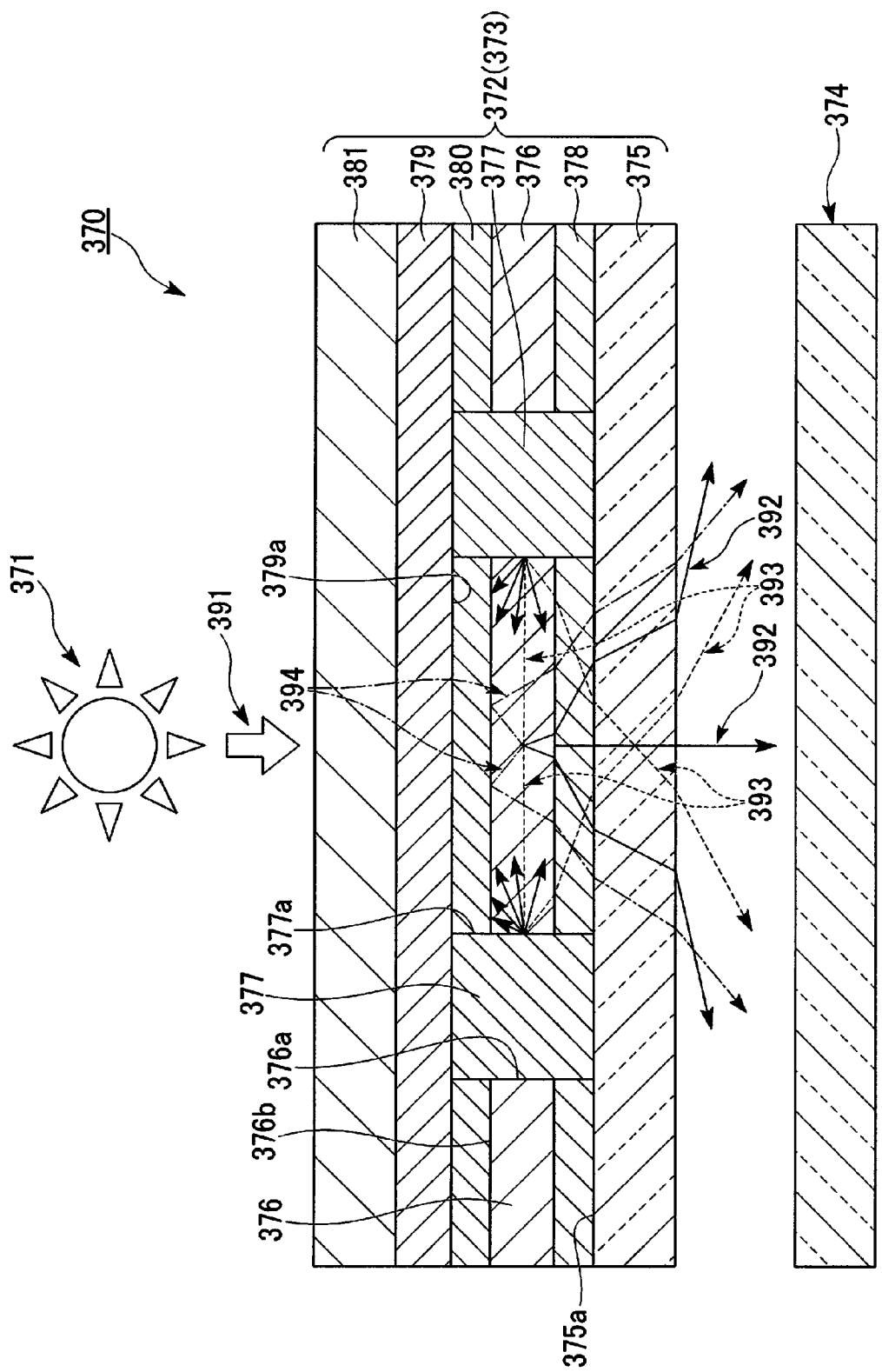
FIG. 25 is a schematic sectional view illustrating an embodiment of an electricity-generating apparatus according to the present invention.

FIG. 25 is a schematic sectional view illustrating an embodiment of an electricity-generating apparatus according to the present invention.

An electricity-generating apparatus 370 schematically includes a light-emitting device 373 that uses sunlight 371 as an excitation light source and is equipped with a fluorescent substrate 372 and a solar cell device 374 disposed so as to face the light-emitting device 373.

The fluorescent substrate 372 schematically includes a first substrate 375, a fluorescent layer 376 that is formed on one surface 375a of the first substrate 375 so as to face the sunlight 371 and that is excited by the excitation light to emit fluorescence, a barrier 377 that surrounds side surfaces 376a of the fluorescent layer 376, the side surfaces 376a extending in a stacking direction of the fluorescent substrate 372, a first low-refractive-index layer 378 formed in each of regions separated by the barrier 377 on one surface 375a of the first substrate 375, a wavelength-selective transmission/reflection layer 379 formed on an incident surface 376b side of the fluorescent layer 376 upon which the excitation light is incident, a second low-refractive-index layer 380 formed in each of regions separated by the barrier 377 on a surface 379a of the wavelength-selective transmission/reflection layer 379 that faces the fluorescent layer 376, and a second substrate 381 disposed on the wavelength-selective transmission/reflection layer 379 on the incident surface 376b side of the fluorescent layer 376.

The barrier 377 has a light-scattering property at least in a portion that faces the fluorescent layer 376 (a side surface 377a of the barrier 377).

Examples of a structure in which the barrier 377 has a light-scattering property include a structure in which the barrier 377 itself is formed of a material containing a resin and light-scattering particles and a structure in which a light-scattering layer (light-scattering film) formed of a material containing a resin and light-scattering particles is disposed on a side surface 377a of the barrier 377.

The same substrate as the substrate 14 in the first to tenth embodiments of the above light-emitting devices is used as the first substrate 375 and the second substrate 381.

The same fluorescent layer as the fluorescent layer 13 in the first to tenth embodiments of the above light-emitting devices is used as the fluorescent layer 376.

The same barrier as the barrier 15 in the first to tenth embodiments of the above light-emitting devices is used as the barrier 377.

The same low-refractive-index layer as the low-refractive-index layer 16 in the first to tenth embodiments of the above light-emitting devices is used as the first low-refractive-index layer 378 and the second low-refractive-index layer 380.

The same wavelength-selective transmission/reflection layer as the wavelength-selective transmission/reflection layer 31 in the second to tenth embodiments of the above light-emitting devices is used as the wavelength-selective transmission/reflection layer 379.

A publicly known solar cell device is used as the solar cell device 374. Examples of the solar cell device include various solar cell devices such as an amorphous silicon solar cell device, a polycrystalline silicon solar cell device, and a monocrystalline silicon solar cell device. Among these solar cell devices, compound solar cell devices composed of InGaP, GaAs, InGaAs, AlGaAs, $Cu(In,Ga)Se_2$, $Cu(In,Ga)(Se,S)_2$, $CuInS_2$, CdTe, and CdS or quantum dot solar cell devices composed of Si and InGaAs are desirably used.

Light emission in the electricity-generating apparatus 370 will be described with reference to FIG. 25.

In the electricity-generating apparatus 370, when excitation light 391 enters the fluorescent layer 376 from the sunlight 371, fluorescence from a fluorescent body is isotropically emitted from the fluorescent layer 376. Part of a fluorescent component 392 (indicated by a solid line in FIG. 25) emitted to the light-output side (front direction, first substrate 375 side) among the fluorescent components emitted from the fluorescent layer 376 can be effectively output to the outside as emission light. A fluorescent component 393 (indicated by a broken line in FIG. 25) emitted in a direction toward the side surface 376a of the fluorescent layer 376 among the fluorescent components emitted from the fluorescent layer 376 is scattered at the side surface 377a of the barrier 377 having light-scattering property, and part of the scattered light can be effectively output to the outside as emission light. A fluorescent component 394 emitted to the side (back surface side) opposite the light-output side of the fluorescent layer 376 among the fluorescent components emitted from the fluorescent layer 376 is reflected at the interface between the fluorescent layer 376 and the second low-refractive-index layer 380 and can be output to the outside with certainty.

The light output to the light-output side (front direction, first substrate 375 side) enters the solar cell device 374. The photoelectric conversion occurs in the solar cell device 374 and thus electricity is generated.

As described above, in the electricity-generating apparatus 370, the barrier 377 has a light-scattering property at least in a portion that faces the fluorescent layer 376 and the first low-refractive-index layer 378 having a refractive index lower than that of the first substrate 375 is formed between the fluorescent layer 376 and the first substrate 375. Therefore, the incident angle of light that can enter the first substrate 375 from the fluorescent layer 376 can be controlled, and the light that enters the first substrate 375 can be output to the outside with certainty without being reflected at the interface between the first substrate 375 and the outside. Furthermore, since the wavelength-selective transmission/reflection layer 379 is formed on the incident surface 376b side of the fluorescent layer 376 and the second low-refractive-index layer 380 is formed on the surface 379a of the wavelength-selective transmission/reflection layer 379 that faces the fluorescent layer 376, the component 394 emitted to the back surface side among the fluorescent components emitted from the fluorescent layer 376 is reflected at the interface between the fluorescent layer 376 and the second low-refractive-index layer 380 and can be output to the outside with certainty. This allows sunlight to efficiently enter the solar cell device 374 from the fluorescent substrate 372, and thus the power generation efficiency of the solar cell device 374 can be improved.

The technical scope in aspects of the present invention is not limited to the above embodiments, and various modifications may be made without departing from the gist in the aspects of the present invention.

For example, the display apparatuses according to the above embodiments preferably include a polarizing plate on the light-output side. The polarizing plate may be a combination of a known linearly polarizing plate and a λ/4 plate. Such a polarizing plate can prevent natural light reflection from an electrode of the display apparatus or natural light reflection at a surface of a substrate or a sealing substrate, which can improve the contrast of the display apparatus. Specific description of the shape, number, arrangement, material, and formation method of constituent elements of a fluorescent substrate and a display apparatus is not limited to the above embodiments and may be appropriately modified.

EXAMPLES

Aspects of the present invention will now be further specifically described based on Examples and Comparative Examples, but are not limited to the Examples below.

Comparative Example 1

A glass substrate having a thickness of 0.7 mm was washed with water; then subjected to ultrasonic cleaning with pure water for 10 minutes, ultrasonic cleaning with acetone for 10 minutes, and steam cleaning with isopropyl alcohol for 5 minutes; and dried at 100° C. for one hour.

A green fluorescent layer having a thickness of 100 μm was formed on one surface of the glass substrate.

The green fluorescent layer was formed as follows. First, 15 g of ethanol and 0.22 g of γ-glycidoxypropyltriethoxysilane were added to 0.16 g of Aerosil having an average particle size of 5 nm and stirred in an open system at room temperature for one hour. This mixture and 20 g of a green fluorescent body $Ca_{0.97}Mg_{0.03}:ZrO_3:Ho$ were transferred into a mortar and thoroughly mixed by grinding. The resultant mixture was heated in an oven at 70° C. for two hours and further heated in an oven at 120° C. for two hours to obtain surface modified $Ba_2SiO_4:Eu^{2+}$.

Subsequently, 30 g of polyvinyl alcohol dissolved in a mixed solution (300 g) of water/dimethyl sulfoxide=1/1 was added to 10 g of surface modified $Ca_{0.97}Mg_{0.03}:ZrO_3:Ho$ and stirred with a dispersing device to prepare a coating solution for forming green fluorescent bodies.

The thus-prepared coating solution for forming green fluorescent bodies was then applied onto one surface of the glass substrate at a desired position with a width of 3 mm by a screen printing method.

The glass substrate was then dried by heating in a vacuum oven (200° C., 10 mmHg) for four hours to form a green fluorescent layer. Thus, a fluorescent substrate of Comparative Example 1 including the glass substrate and the green fluorescent layer formed on one surface of the glass substrate was obtained.

When blue LED light with a wavelength of 450 nm was made to enter as excitation light from the back of the fluorescent substrate of Comparative Example 1 while the side surfaces of the green fluorescent layer were covered with a light-shielding film, it was confirmed that fluorescence was output from the side surfaces of the fluorescent substrate and the surroundings of the fluorescent substrate became blurred when the fluorescent substrate was viewed from the front.

The luminance conversion efficiency of the fluorescent substrate at 25° C. concerning fluorescence output from the front when blue LED light with a wavelength of 450 nm was made to enter as excitation light from the back of the fluorescent substrate of Comparative Example 1 was measured using a commercially available luminance meter (BM-7 manufactured by TOPCON TECHNOHOUSE CORPORATION). The luminance of the blue LED light serving as excitation light was 1000 cd/m² whereas the luminance of green light emitted from the green fluorescent layer and having an emission peak wavelength of 547 nm was 1023 cd/m². As a result, the luminance conversion efficiency of the fluorescent substrate of Comparative Example 1 was 100%.

Comparative Example 2

A low-refractive-index layer having a thickness of 50 μm was formed on one surface of the same type of glass substrate as in Comparative Example 1 by a sputtering method. A fluorocarbon resin having a refractive index of about 1.35 to 1.4 was used as a material of the low-refractive-index layer.

Subsequently, a green fluorescent layer was formed on the low-refractive-index layer in the same manner as in Comparative Example 1 to obtain a fluorescent substrate of Comparative Example 2 including the glass substrate and the low-refractive-index layer and green fluorescent layer formed on the one surface of the glass substrate.

When blue LED light with a wavelength of 450 nm was then made to enter as excitation light from the back of the fluorescent substrate of Comparative Example 2 while the side surfaces of the green fluorescent layer were covered with a light-shielding film, it was confirmed that fluorescence was not output from the side surfaces of the fluorescent substrate and the surroundings of the fluorescent substrate did not become blurred when the fluorescent substrate was viewed from the front.

The luminance conversion efficiency of the fluorescent substrate at 25° C. concerning fluorescence output from the front when blue LED light with a wavelength of 450 nm was made to enter as excitation light from the back of the fluorescent substrate of Comparative Example 2 was measured in the same manner as in Comparative Example 1. The luminance of the blue LED light serving as excitation light was 1000 cd/m² whereas the luminance of green light emitted from the green fluorescent layer and having an emission peak wavelength of 547 nm was 816 cd/m². That is, the luminance conversion efficiency of the fluorescent substrate of Comparative Example 1 was 80%.

Comparative Example 3

A low-refractive-index layer having a thickness of 50 μm was formed on one surface of a glass substrate by a sputtering method in the same manner as in Comparative Example 2.

A fluorocarbon resin having a refractive index of about 1.35 to 1.4 was used as a material of the low-refractive-index layer.

Subsequently, a green fluorescent layer was formed on the low-refractive-index layer in the same manner as in Comparative Example 1.

An aluminum total reflection film having a thickness of 50 μm was then uniformly formed by a sputtering method on the side surfaces of the green fluorescent layer to obtain a fluorescent substrate of Comparative Example 3 including the glass substrate, the low-refractive-index layer and green fluorescent layer formed on the one surface of the glass substrate, and the aluminum total reflection film formed on the side surfaces of the green fluorescent layer.

When blue LED light with a wavelength of 450 nm was then made to enter as excitation light from the back of the fluorescent substrate of Comparative Example 3, it was confirmed that fluorescence was not output from the side surfaces of the fluorescent substrate and the surroundings of the fluorescent substrate did not become blurred as in Comparative Example 2 when the fluorescent substrate was viewed from the front.

The luminance conversion efficiency of the fluorescent substrate at 25° C. concerning fluorescence output from the front when blue LED light with a wavelength of 450 nm was made to enter as excitation light from the back of the fluorescent substrate of Comparative Example 3 was measured in the same manner as in Comparative Example 1. The luminance of the blue LED light serving as excitation light was 1000 cd/m² whereas the luminance of green light emitted from the green fluorescent layer and having an emission peak wavelength of 547 nm was 2692 cd/m². That is, the luminance conversion efficiency of the fluorescent substrate of Comparative Example 3 was 260%, and 2.6 times the luminance was observed compared with the fluorescent substrate of Comparative Example 1.

Example 1

A low-refractive-index layer having a thickness of 50 μm was formed on one surface of a glass substrate by a sputtering method in the same manner as in Comparative Example 2.

A fluorocarbon resin having a refractive index of about 1.35 to 1.4 was used as a material of the low-refractive-index layer.

A barrier (light-scattering film) was then formed on the low-refractive-index layer. Hereafter, a method for forming the barrier is described in detail.

First, a white photosensitive composition containing an epoxy resin (refractive index: 1.59), an acrylic resin (refractive index: 1.49), a rutile-type titanium oxide (refractive index: 2.71, particle size: 250 nm), a photopolymerization initiator, and an aromatic solvent was mixed by being stirred to prepare a negative resist.

The negative resist was then applied onto the low-refractive-index layer formed on the one surface of the glass substrate by a spin coating method.

Subsequently, pre-baking was performed at 80° C. for 10-minutes to form a coating film having a thickness of 50 μm.

The coating film was covered with a mask that can form a desired image pattern, and then irradiated with an i-line (300 mJ/cm²) to perform exposure.

Subsequently, development was performed using an alkali developer to obtain a pixel-pattern structure including a barrier formed therein.

Subsequently, post-baking was performed using a hot-air circulating dryer at 140° C. for 60 minutes to form a barrier for partitioning pixels.

A green fluorescent layer was then formed in an opening surrounded by the barrier.

Herein, a green fluorescent layer having a thickness of 50 μm was formed in an opening by a dispenser method using the coating solution for forming green fluorescent bodies of Comparative Example 1 to form a fluorescent substrate of Example 1 including the glass substrate and the low-refractive-index layer, green fluorescent layer, and barrier formed on the one surface of the glass substrate.

When blue LED light with a wavelength of 450 nm was then made to enter as excitation light from the back of the fluorescent substrate of Example 1, it was confirmed that fluorescence was not output from the side surfaces of the fluorescent substrate and the surroundings of the fluorescent substrate did not become blurred as in Comparative Examples 2 and 3 when the fluorescent substrate was viewed from the front.

The luminance conversion efficiency of the fluorescent substrate at 25° C. concerning fluorescence output from the front when blue LED light with a wavelength of 450 nm was made to enter as excitation light from the back of the fluorescent substrate of Example 1 was measured in the same manner as in Comparative Example 1. The luminance of the blue LED light serving as excitation light was 1000 cd/m² whereas the luminance of green light emitted from the green fluorescent layer and having an emission peak wavelength of 547 nm was 2901 cd/m². That is, the luminance conversion efficiency of the fluorescent substrate of Example 1 was 290%, and 2.9 times the luminance was observed compared with the fluorescent substrate of Comparative Example 1.

Example 2

A low-refractive-index layer having a thickness of 50 μm was formed on one surface of a glass substrate by a sputtering method in the same manner as in Comparative Example 2.

A fluorocarbon resin having a refractive index of about 1.35 to 1.4 was used as a material of the low-refractive-index layer.

Subsequently, a barrier was formed on the low-refractive-index layer in the same manner as in Example 1, and then a green fluorescent layer was formed in an opening surrounded by the barrier.

Subsequently, a dielectric multilayer film prepared by alternately forming six layers of titanium oxide ($TiO_2$: refractive index=2.30) and silicon oxide ($SiO_2$: refractive index=1.47) by an EB deposition method was formed as a wavelength-selective transmission/reflection layer on a surface of the green fluorescent layer on which excitation light is made to enter, by a sputtering method so as to have a thickness of 100 nm. Thus, a fluorescent substrate of Example 2 including the glass substrate and the low-refractive-index layer, green fluorescent layer, barrier, and wavelength-selective transmission/reflection layer formed on the one surface of the glass substrate was obtained.

When blue LED light with a wavelength of 450 nm was then made to enter as excitation light from the back of the fluorescent substrate of Example 2, it was confirmed that fluorescence was not output from the side surfaces of the fluorescent substrate and the surroundings of the fluorescent substrate did not become blurred when the fluorescent substrate was viewed from the front as in Example 1.

The luminance conversion efficiency of the fluorescent substrate at 25° C. concerning fluorescence output from the front when blue LED light with a wavelength of 450 nm was made to enter as excitation light from the back of the fluorescent substrate of Example 2 was measured in the same manner as in Comparative Example 1. The luminance of the blue LED light serving as excitation light was 1000 cd/m² whereas the luminance of green light emitted from the green fluorescent layer and having an emission peak wavelength of 547 nm was 3835 cd/m². That is, the luminance conversion efficiency of the fluorescent substrate of Example 2 was 380%, and 3.8 times the luminance was observed compared with the fluorescent substrate of Comparative Example 1.

Example 3

A dielectric multilayer film prepared by alternately forming six layers of titanium oxide ($TiO_2$: refractive index=2.30) and silicon oxide ($SiO_2$: refractive index=1.47) by an EB deposition method was formed as a wavelength-selective transmission/reflection layer on one surface of the same type of glass substrate of Comparative Example 1 by a sputtering method so as to have a thickness of 100 nm.

Subsequently, a barrier (light-scattering film) having a thickness of 50 μm was formed on the wavelength-selective transmission/reflection layer by the same formation method as in Example 1. A green fluorescent layer having a thickness of 20 μm was formed by the same dispenser method as in Example 1 on the glass substrate in an opening surrounded by the barrier.

Subsequently, a transparent thermosetting adhesive layer composed of a phenolic resin was formed on the entire surface of the barrier that faces the glass substrate by a dispenser method. Another glass substrate, which was the same as that of Comparative Example 1, was bonded to the surface of the barrier, and the bonded substrates were left to stand at 25° C. for 3 hours and then placed in an oven at 180° C. for about 40 minutes to heat-cure the adhesive layer. Thus, a fluorescent substrate of Example 3 was obtained that includes the glass substrate, the wavelength-selective transmission/reflection layer formed on the one surface of the glass substrate, the barrier formed on the one surface of the wavelength-selective transmission/reflection layer, the fluorescent layer formed on the glass substrate in the opening surrounded by the barrier, and the other glass substrate formed on the surface of the barrier with the adhesive layer disposed therebetween so that the fluorescent layer and an air layer were disposed between the glass substrates.

When blue LED light with a wavelength of 450 nm was then made to enter as excitation light from the back of the fluorescent substrate of Example 3, it was confirmed that fluorescence was not output from the side surfaces of the fluorescent substrate and the surroundings of the fluorescent substrate did not become blurred as in Example 1 when the fluorescent substrate was viewed from the front.

The luminance conversion efficiency of the fluorescent substrate at 25° C. concerning fluorescence output from the front when blue LED light with a wavelength of 450 nm was made to enter as excitation light from the back of the fluorescent substrate of Example 3 was measured in the same manner as in Comparative Example 1. The luminance of the blue LED light serving as excitation light was 1000 cd/m² whereas the luminance of green light emitted from the green fluorescent layer and having an emission peak wavelength of 547 nm was 4522 cd/m². That is, the luminance conversion efficiency of the fluorescent substrate of Example 3 was 450%, and 4.5 times the luminance was observed compared with the fluorescent substrate of Comparative Example 1.

Table 1 shows the luminance and luminance conversion efficiency of Comparative Examples 1 to 3 and Examples 1 to 3, the comparison of Comparative Examples 2 and 3 and Examples 1 to 3 with Comparative Example 1, and the results concerning the blurriness at surroundings of the fluorescent substrate.

TABLE 1

|  | Luminance (cd/m²) | Luminance conversion efficiency (%) | Comparison with Comparative Example 1 | Blurriness at surroundings of fluorescent substrate |
|---|---|---|---|---|
| Comparative Example 1 | 1023 | 100 | — | Yes |
| Comparative Example 2 | 816 | 80 | 0.8 times | No |
| Comparative Example 3 | 2692 | 260 | 2.6 times | No* |
| Example 1 | 2901 | 290 | 2.9 times | No* |
| Example 2 | 3835 | 380 | 3.8 times | No* |
| Example 3 | 4522 | 450 | 4.5 times | No* |

*No blurriness was observed in a state in which the side surfaces of the fluorescent layer were not covered with a light-shielding film.

Example 4

Blue Organic EL+Fluorescent Body

A low-refractive-index layer having a thickness of 50 μm was formed on one surface of a glass substrate by a sputtering method in the same manner as in Comparative Example 2.

A fluorocarbon resin having a refractive index of about 1.35 to 1.4 was used as a material of the low-refractive-index layer.

A barrier (light-scattering film) was then formed on the low-refractive-index layer. Hereafter, a method for forming the barrier is described in detail.

First, a white photosensitive composition containing an epoxy resin (refractive index: 1.59), an acrylic resin (refractive index: 1.49), a rutile-type titanium oxide (refractive index: 2.71, particle size: 250 nm), a photopolymerization initiator, and an aromatic solvent was mixed by being stirred to prepare a negative resist.

The negative resist was then applied onto the low-refractive-index layer formed on the one surface of the glass substrate by a spin coating method.

Subsequently, pre-baking was performed at 80° C. for 10 minutes to form a coating film having a thickness of 50 μm.

The coating film was covered with a mask that can form a desired image pattern, and then irradiated with an i-line (300 mJ/cm²) to perform exposure.

Subsequently, development was performed using an alkali developer to obtain a pixel-pattern structure including a barrier formed therein.

Subsequently, post-baking was performed using a hot-air circulating dryer at 140° C. for 60 minutes to form a barrier for partitioning pixels.

A red fluorescent layer, a green fluorescent layer, and a blue scattering layer were formed in openings surrounded by the barrier. Hereafter, a method for forming the red fluorescent layer, green fluorescent layer, and blue scattering layer is described in detail.

The red fluorescent layer was formed as follows. First, 15 g of ethanol and 0.22 g of γ-glycidoxypropyltriethoxysilane were added to 0.16 g of Aerosil having an average particle size of 5 nm and stirred in an open system at room temperature for one hour. This mixture and 20 g of a red fluorescent body $K_5Eu_{2.5}(WO_4)_{6.25}$ were transferred into a mortar and thoroughly mixed by grinding. The resultant mixture was heated in an oven at 70° C. for two hours and further heated in an oven at 120° C. for two hours to obtain surface modified $K_5Eu_{2.5}(WO_4)_{6.25}$.

Subsequently, 30 g of polyvinyl alcohol dissolved in a mixed solution (300 g) of water/dimethyl sulfoxide=1/1 was added to 10 g of the surface modified $K_5Eu_{2.5}(WO_4)_{6.25}$ and stirred with a dispersing device to prepare a coating solution for forming red fluorescent bodies.

The thus-prepared coating solution for forming red fluorescent bodies was applied by a dispenser method in the predetermined opening surrounded by the barrier.

The resulting coating film was then dried by heating in a vacuum oven (200° C., 10 mmHg) for four hours to form a red fluorescent layer having a thickness of 50 μm.

The green fluorescent layer was formed as follows. First, 15 g of ethanol and 0.22 g of γ-glycidoxypropyltriethoxysilane were added to 0.16 g of Aerosil having an average particle size of 5 nm and stirred in an open system at room temperature for one hour. This mixture and 20 g of a green fluorescent body $Ba_2SiO_4:Eu^{2+}$ were transferred into a mortar and thoroughly mixed by grinding. The resultant mixture was heated in an oven at 70° C. for two hours and further heated in an oven at 120° C. for two hours to obtain surface modified $Ba_2SiO_4:Eu^{2+}$.

Subsequently, 30 g of polyvinyl alcohol dissolved in a mixed solution (300 g) of water/dimethyl sulfoxide=1/1 was added to 10 g of the surface modified $Ba_2SiO_4:Eu^{2+}$ and stirred with a dispersing device to prepare a coating solution for forming green fluorescent bodies.

The thus-prepared coating solution for forming green fluorescent bodies was applied by a dispenser method in the predetermined opening surrounded by the barrier.

The resulting coating film was then dried by heating in a vacuum oven (200° C., 10 mmHg) for four hours to form a green fluorescent layer having a thickness of 50 μm.

The blue scattering layer was formed as follows. Thirty grams of polyvinyl alcohol dissolved in a mixed solution (300 g) of water/dimethyl sulfoxide=1/1 was added to 20 g of silica particles (refractive index: 1.65) having an average particle size of 1.5 μm and stirred with a dispersing device to prepare a coating solution for forming blue scattering layers.

The thus-prepared coating solution for forming blue scattering layers was applied by a dispenser method in the predetermined opening surrounded by the barrier.

The resulting coating film was then dried by heating in a vacuum oven (200° C., 10 mmHg) for four hours to form a blue scattering layer having a thickness of 50 μm.

A dielectric multilayer film prepared by alternately forming six layers of titanium oxide ($TiO_2$: refractive index=2.30) and silicon oxide ($SiO_2$: refractive index=1.47) by an EB deposition method was formed as a wavelength-selective transmission/reflection layer on surfaces of the red fluorescent layer, green fluorescent layer, and blue fluorescent layer upon which excitation light was incident, by a sputtering method so as to have a thickness of 100 nm. Thus, a fluorescent substrate was obtained that includes the glass substrate and the low-refractive-index layer, red fluorescent layer, green fluorescent layer, blue fluorescent layer, barrier, and wavelength-selective transmission/reflection layer formed on the one surface of the glass substrate.

A reflective electrode composed of silver was formed on a glass substrate having a thickness of 0.7 mm by a sputtering method so as to have a thickness of 100 nm. A film composed of indium tin oxide (ITO) and having a thickness of 20 nm was formed on the reflective electrode by a sputtering method to form a first electrode (anode).

The first electrode was patterned by a publicly known photolithography method so as to have 90 stripes each having a width of 160 μm and arranged at a pitch of 200 μm.

Subsequently, a $SiO_2$ layer having a thickness of 200 nm was stacked on the first electrode by a sputtering method and patterned by a publicly known photolithography method so as to cover only an edge portion of the first electrode.

Herein, portions 10 μm from the edges of the short sides of the first electrode were covered with the $SiO_2$ layer.

The resultant substrate was washed with water; then subjected to ultrasonic cleaning with pure water for 10 minutes, ultrasonic cleaning with acetone for 10 minutes, and steam cleaning with isopropyl alcohol for 5 minutes; and dried at 120° C. for one hour.

The substrate on which the first electrode was formed was then clamped in a substrate holder in an in-line type resistance heating evaporator and the pressure was reduced to a vacuum of $1\times10^{-4}$ Pa or less. Thus, layers constituting an organic EL layer including an organic light-emitting layer were formed. Hereafter, a method for forming the layers constituting the organic EL layer is described in detail.

A hole injection layer having a thickness of 100 nm was formed by a resistance heating evaporation method using 1,1-bis(di-4-tolylaminophenyl)cyclohexane (TAPC) as a hole injection material.

A hole transport layer having a thickness of 40 nm was then formed by a resistance heating evaporation method using N,N'-di-1-naphthyl-N,N'-diphenyl-1,1'-biphenyl-1,1'-biphenyl-4,4'-diamine (NPD) as a hole transport material.

A blue organic light-emitting layer (thickness: 30 nm) was then formed at a desired pixel position on the hole transport layer. The blue organic light-emitting layer was formed by co-depositing 1,4-bis(triphenylsilyl)benzene (UGH-2) (host material) and bis[(4,6-difluorophenyl)-pyridinato-N,C2']picolinate iridium (III) (FIrpic) (blue phosphorescent light-emitting dopant) at deposition rates of 1.5 Å/sec and 0.2 Å/sec, respectively.

A hole blocking layer (thickness: 10 nm) was then formed on the organic light-emitting layer using 2,9-dimethyl-4,7-diphenyl-1,10-phenanthroline (BCP).

An electron transport layer (thickness: 30 nm) was then formed on the hole blocking layer using tris(8-hydroxyquinoline)aluminum ($Alq_3$).

An electron injection layer (thickness: 0.5 nm) was then formed on the electron transport layer using lithium fluoride (LiF).

Through the above processes, the layers constituting the organic EL layer were formed.

After that, a semitransparent electrode was formed as a second electrode.

First, the above substrate was clamped in a metal deposition chamber and a shadow mask for forming the semitransparent electrode was aligned with the substrate. Herein, a mask having such openings that stripe-shaped second electrodes each having a width of 500 μm were able to be formed at a pitch of 600 μm so as to face the stripes of the first electrode was used as the shadow mask.

Magnesium and silver (thickness: 1 nm) were formed in a desired pattern by co-depositing magnesium and silver on the surface of the electron injection layer by a vacuum deposition method at deposition rates of 0.1 Å/sec and 0.9 Å/sec, respectively.

Furthermore, silver (thickness: 19 nm) was formed thereon in a desired pattern at a deposition rate of 1 Å/sec for the purpose of enhancing the interference effect and preventing the voltage drop due to the wiring resistance in the second electrode.

Through the above processes, a semitransparent electrode was formed.

A micro-cavity effect (interference effect) is produced between the first electrode and the second electrode, which can increase the front luminance. Consequently, the emission energy from the organic EL layer can be efficiently transferred to the light-output side. The emission peak wavelength was adjusted to 460 nm and the full width at half maximum was adjusted to 50 nm by the micro-cavity effect.

An inorganic protective layer composed of $SiO_2$ and having a thickness of 3 μm was then formed by a plasma CVD method using a shadow mask in a sealing area located in a range extending outward from the top, bottom, left, and right edges of the display unit to 2 mm from the edges.

Through the above processes, an organic EL element substrate including the organic EL element formed thereon was produced.

Subsequently, the thus-produced organic EL element substrate and fluorescent substrate were aligned with each other using an alignment mark formed outside the pixel-arranged position. Note that a thermosetting resin was applied onto the fluorescent substrate in advance.

After the organic EL element substrate and the fluorescent substrate were aligned with each other, both the substrates were brought into close contact with each other so as to sandwich the thermosetting resin. The thermosetting resin was cured by performing heating at 80° C. for two hours to bond the organic EL element substrate and the fluorescent substrate. This process for bonding the substrates was conducted in a dry air environment (moisture content: −80° C.) for the purpose of preventing the degradation of the organic layer due to moisture.

Finally, terminals formed in the periphery were connected to an external power supply, whereby an organic EL display apparatus of Example 3 was completed.

There was provided an excitation light source in which a blue-light-emitting organic EL element could be freely switched by applying a desired electric current to a desired striped electrode from the external power supply. The blue light was converted into red light through the red fluorescent layer and the blue light was converted into green light through the green fluorescent layer, and thus isotropic red light and isotropic green light were obtained. Furthermore, isotropic blue light was obtained through the blue scattering layer. Accordingly, full-color display was achieved and a good image and an image having good viewing angle characteristics were able to be formed.

Example 5

Active Drive Blue Organic El+Fluorescent Body

A fluorescent substrate was produced in the same manner as in Example 4.

An amorphous silicon semiconductor film was formed on a glass substrate having a size of 100×100 mm by a PECVD method.

A polycrystalline silicon semiconductor film was then formed by performing crystallization.

The polycrystalline silicon semiconductor film was then patterned into islands by a photolithography method.

A gate insulating film and a gate electrode layer were then formed on the patterned polycrystalline silicon semiconductor film in that order and patterning was performed by a photolithography method.

Subsequently, the patterned polycrystalline silicon semiconductor film was doped with an impurity element such as phosphorus to form a source region and a drain region, and thus a TFT element was produced. Next, a planarizing film was formed by sequentially stacking a silicon nitride film formed by a PECVD method and an acrylic resin layer formed by a spin coating method.

Hereafter, a method for forming the planarizing film is described in detail.

After the silicon nitride film was formed, the silicon nitride film and the gate insulating film were etched at one time to form a contact hole that reaches the source and/or drain region, and then a source wiring line was formed.

Subsequently, an acrylic resin layer was formed and a contact hole that reaches the drain region was formed at the same position as that of the contact hole in the drain region, the contact hole being made in the gate insulating film and the silicon nitride film, whereby an active-matrix substrate was completed.

The function of the planarizing film was realized by the acrylic resin layer. A capacitor for controlling the gate potential of a TFT to be a constant potential was formed by disposing an insulating film such as an interlayer insulating film between the drain of a switching TFT and the source of a driving TFT.

A contact hole that penetrates through the planarizing layer was formed on the active-matrix substrate so as to electrically connect the driving TFT and a first electrode of a red-light-emitting organic EL element, a first electrode of a green-light-emitting organic EL element, and a first electrode of a blue-light-emitting organic EL element.

A first electrode (anode) of each pixel was then formed by a sputtering method so as to be electrically connected to the contact hole that penetrates through the planarizing layer and is connected to the TFT for driving each emission pixel.

The first electrode was formed by stacking an Al (aluminum) film having a thickness of 150 nm and an IZO (indium oxide-zinc oxide) film having a thickness of 20 nm.

The first electrode was then patterned into a shape corresponding to each pixel by a publicly known photolithography method.

The area of the first electrode was set to be 300 μm×160 μm. The first electrode was formed on a substrate having a size of 100 mm×100 mm. The area of the display unit was set to be 80 mm×80 mm. There was a sealing area having a width of 2 mm from the top, bottom, left, and right edges of the display unit. On the short side of the display unit, terminal leading portions each having a width of 2 mm were disposed outside the sealing area. On the long side of the display unit, a terminal leading portion having a width of 2 mm was disposed on the side where bending was to be performed.

Subsequently, a $SiO_2$ layer having a thickness of 200 nm was stacked on the first electrode by a sputtering method and patterned by a publicly known photolithography method so as to cover only an edge portion of the first electrode.

Herein, portions 10 μm from the four edges of the first electrode were covered with the $SiO_2$ layer.

The active-matrix substrate on which the first electrode was formed was then washed.

The active-matrix substrate was washed by, for example, performing ultrasonic cleaning with acetone and isopropyl alcohol for 10 minutes and then performing UV-ozone cleaning for 30 minutes.

The active-matrix substrate on which the first electrode was formed was then clamped in a substrate holder in an in-line type resistance heating evaporator and the pressure was reduced to a vacuum of $1 \times 10^{-4}$ Pa or less. Thus, layers constituting an organic EL layer including an organic light-emitting layer were formed. Hereafter, a method for forming the layers constituting the organic EL layer is described in detail.

A hole injection layer having a thickness of 100 nm was formed by a resistance heating evaporation method using 1,1-bis(di-4-tolylaminophenyl)cyclohexane (TAPC) as a hole injection material.

A hole transport layer having a thickness of 40 nm was then formed by a resistance heating evaporation method using N,N'-di-1-naphthyl-N,N'-diphenyl-1,1'-biphenyl-1,1'-biphenyl-4,4'-diamine (NPD) as a hole transport material.

A blue organic light-emitting layer (thickness: 30 nm) was then formed at a desired pixel position on the hole transport layer. The blue organic light-emitting layer was formed by co-depositing 1,4-bis(triphenylsilyl)benzene (UGH-2) (host material) and bis[(4,6-difluorophenyl)-pyridinato-N,C2']picolinate iridium (III) (FIrpic) (blue phosphorescent light-emitting dopant) at deposition rates of 1.5 Å/sec and 0.2 Å/sec, respectively.

A hole blocking layer (thickness: 10 nm) was then formed on the organic light-emitting layer using 2,9-dimethyl-4,7-diphenyl-1,10-phenanthroline (BCP).

An electron transport layer (thickness: 30 nm) was then formed on the hole blocking layer using tris(8-hydroxyquinoline)aluminum ($Alq_3$).

An electron injection layer (thickness: 0.5 nm) was then formed on the electron transport layer using lithium fluoride (LiF).

Through the above processes, the layers constituting the organic EL layer were formed.

After that, a semitransparent electrode was formed as a second electrode.

First, the active-matrix substrate on which the organic EL layer was formed was clamped in a metal deposition chamber and a shadow mask for forming the semitransparent electrode was aligned with the active-matrix substrate. Herein, a mask having such openings that stripe-shaped second electrodes each having a width of 2 mm were able to be formed so as to face the stripes of the first electrode was used as the shadow mask.

Magnesium and silver (thickness: 1 nm) were formed in a desired pattern by co-depositing magnesium and silver on the surface of the electron injection layer by a vacuum deposition method at deposition rates of 0.1 Å/sec and 0.9 Å/sec, respectively.

Furthermore, silver (thickness: 19 nm) was formed thereon in a desired pattern at a deposition rate of 1 Å/sec for the purpose of enhancing the interference effect and preventing the voltage drop due to the wiring resistance in the second electrode.

Through the above processes, a semitransparent electrode was formed.

A micro-cavity effect (interference effect) is produced between the first electrode and the second electrode, which can increase the front luminance. Consequently, the emission energy from the organic EL layer can be efficiently transferred to the light-output side. The emission peak wavelength was adjusted to 460 nm and the full width at half maximum was adjusted to 50 nm by the micro-cavity effect.

An inorganic protective layer composed of $SiO_2$ and having a thickness of 3 μm was then formed by a plasma CVD method using a shadow mask in a sealing area located in a range extending outward from the top, bottom, left, and right edges of the display unit to 2 mm from the edges.

Through the above processes, an active drive organic EL element substrate including the organic EL element formed thereon was produced.

Subsequently, the thus-produced active drive organic EL element substrate and fluorescent substrate were aligned with each other using an alignment mark formed outside the pixel-arranged position.

Note that a thermosetting resin was applied onto the fluorescent substrate in advance.

After the active drive organic EL element substrate and the fluorescent substrate were aligned with each other, both the substrates were brought into close contact with each other so as to sandwich the thermosetting resin. The thermosetting resin was cured by performing heating at 90° C. for two hours to bond the organic EL element substrate and the fluorescent substrate. This process for bonding the substrates was conducted in a dry air environment (moisture content: −80° C.) for the purpose of preventing the degradation of the organic layer due to moisture.

Subsequently, a polarizing plate was bonded to the substrate on the light-output side to produce an active drive organic EL element.

Finally, a terminal formed on the short side was connected to a power supply circuit through a source driver and a terminal formed on the long side was connected to an external power supply through a gate driver to complete an active drive organic EL display apparatus including a display unit having a size of 80 mm×80 mm.

There was provided an excitation light source in which a blue-light-emitting organic EL element could be freely switched by applying a desired electric current to a desired striped electrode from the external power supply. The blue light was converted into red light through the red fluorescent layer and the blue light was converted into green light through the green fluorescent layer, and thus isotropic red light and isotropic green light were obtained. Furthermore, isotropic blue light was obtained through the blue scattering layer. Accordingly, full-color display was achieved and a good image and an image having good viewing angle characteristics were able to be formed.

Example 6

Blue LED+Fluorescent Body

A fluorescent substrate was produced in the same manner as in Example 4.

A buffer layer composed of GaN was grown on the C-plane of a sapphire substrate set in a reaction vessel using TMG (trimethylgallium) and $NH_3$ at 550° C. so as to have a thickness of 60 nm.

The temperature was then increased to 1050° C., and an n-type contact layer composed of Si-doped n-type GaN was grown using a $SiH_4$ gas in addition to TMG and $NH_3$ so as to have a thickness of 5 μm.

A second cladding layer composed of Si-doped n-type $Al_{0.3}Ga_{0.7}N$ layer was then grown using TMA (trimethylaluminum) in addition to the raw material gases at 1050° C. so as to have a thickness of 0.2 μm.

The temperature was then decreased to 850° C., and a first n-type cladding layer composed of Si-doped n-type $In_{0.01}Ga_{0.99}N$ was grown using TMG, TMI (trimethylindium), $NH_3$, and $SiH_4$ so as to have a thickness of 60 nm.

An active layer composed of non-doped $In_{0.05}Ga_{0.95}N$ was then grown using TMG, TMI, and $NH_3$ at 850° C. so as to have a thickness of 5 nm. Furthermore, a first p-type cladding layer composed of Mg-doped p-type $In_{0.01}Ga_{0.99}N$ was grown using CPMg (cyclopentadienylmagnesium) in addition to TMG, TMI, and $NH_3$ at 850° C. so as to have a thickness of 60 nm.

The temperature was then increased to 1100° C., and a second p-type cladding layer composed of Mg-doped p-type $Al_{0.3}Ga_{0.7}N$ was grown using TMG, TMA, $NH_3$, and CPMg so as to have a thickness of 150 nm.

A p-type contact layer composed of Mg-doped p-type GaN was then grown using TMG, $NH_3$, and CPMg at 1100° C. so as to have a thickness of 600 nm.

After the completion of the above processes, the temperature was decreased to room temperature and a wafer was taken out of the reaction vessel. The wafer was annealed at 720° C. to reduce the resistance of the p-type layer.

A mask having a particular shape was then formed on the surface of the p-type contact layer, which was the uppermost layer, and etching was performed until the surface of the n-type contact layer was exposed.

After the etching, a cathode composed of titanium (Ti) and aluminum (Al) was formed on the surface of the n-type contact layer and an anode composed of nickel (Ni) and gold (Au) was formed on the surface of the p-type contact layer.

After the formation of the anode, the wafer was cut into chips each having a size of 350 μm square. Each of the LED chips was fixed, using a UV-curable resin, on a substrate on which a wiring line for making a connection to a separately prepared external circuit was formed, to electrically connect the LED chip to the wiring line on the substrate. Thus, a light source substrate including a blue LED was produced.

Subsequently, the thus-produced light source substrate and fluorescent substrate were aligned with each other using an alignment mark formed outside the pixel-arranged position.

Note that a thermosetting resin was applied onto the fluorescent substrate in advance.

After the light source substrate and the fluorescent substrate were aligned with each other, both the substrates were brought into close contact with each other so as to sandwich the thermosetting resin. The thermosetting resin was cured by performing heating at 80° C. for two hours to bond the organic EL element substrate and the fluorescent substrate. This process for bonding the substrates was conducted in a dry air environment (moisture content: −80° C.) for the purpose of preventing the degradation of the organic layer due to moisture.

Finally, terminals formed in the periphery were connected to an external power supply, whereby an LED display apparatus of Example 5 was completed.

There was provided an excitation light source in which a blue-light-emitting organic EL element could be freely switched by applying a desired electric current to a desired striped electrode from the external power supply. The blue light was converted into red light through the red fluorescent layer and the blue light was converted into green light through the green fluorescent layer, and thus isotropic red light and isotropic green light were obtained. Furthermore, isotropic blue light was obtained through the blue scattering layer. Accordingly, full-color display was achieved and a good image and an image having good viewing angle characteristics were able to be formed.

Example 7

Blue Organic EL+Liquid Crystal+Fluorescent Body

A low-refractive-index layer having a thickness of 50 μm was formed on one surface of a glass substrate having a thickness of 0.7 mm by a sputtering method.

A fluorocarbon resin having a refractive index of about 1.35 to 1.4 was used as a material of the low-refractive-index layer.

A barrier (light-scattering film) was then formed on the low-refractive-index layer. Hereafter, a method for forming the barrier is described in detail.

First, a white photosensitive composition containing an epoxy resin (refractive index: 1.59), an acrylic resin (refractive index: 1.49), a rutile-type titanium oxide (refractive index: 2.71, particle size: 250 nm), a photopolymerization initiator, and an aromatic solvent was mixed by being stirred to prepare a negative resist.

The negative resist was then applied onto the low-refractive-index layer formed on the one surface of the glass substrate by a spin coating method.

Subsequently, pre-baking was performed at 80° C. for 10 minutes to form a coating film having a thickness of 50 μm.

The coating film was covered with a mask that can form a desired image pattern, and then irradiated with an i-line (300 mJ/cm$^2$) to perform exposure.

Subsequently, development was performed using an alkali developer to obtain a pixel-pattern structure including a barrier formed therein.

Subsequently, post-baking was performed using a hot-air circulating dryer at 140° C. for 60 minutes to form a barrier for partitioning pixels.

A red fluorescent layer, a green fluorescent layer, and a blue scattering layer were formed in openings surrounded by the barrier. Hereafter, a method for forming the red fluorescent layer, green fluorescent layer, and blue scattering layer is described in detail.

The red fluorescent layer was formed as follows. First, [2-[2-[4-(dimethylamino)phenyl]ethenyl]-6-methyl-4H-pyran-4-ylidene]propanedinitrile (DCM) (0.02 mol/kg (solid content ratio)) was mixed with an epoxy thermosetting resin and stirred with a dispersing device to prepare a coating solution for forming red fluorescent bodies.

The coating solution for forming red fluorescent bodies was applied by a dispenser method in the predetermined opening surrounded by the barrier.

The resulting coating film was then dried by heating in a vacuum oven (150° C.) for one hour to form a red fluorescent layer having a thickness of 2 μm.

The cross-sectional shape of the red fluorescent layer was a semicylindrical shape because of the effect produced by the water-repellent treatment of the low-reflective layer.

The green fluorescent layer was formed as follows. First, 2,3,6,7-tetrahydro-11-oxo-1H,5H,11H-[1]benzopyrano[6,7,8-ij]quinolizine-10-carboxylic acid (Coumarin 519) (0.02 mol/kg (solid content ratio)) was mixed with an epoxy thermosetting resin and stirred with a dispersing device to prepare a coating solution for forming green fluorescent bodies.

The coating solution for forming green fluorescent bodies was applied by a dispenser method in the predetermined opening surrounded by the barrier.

The resulting coating film was then dried by heating in a vacuum oven (150° C.) for one hour to form a green fluorescent layer having a thickness of 2 μm.

The cross-sectional shape of the green fluorescent layer was a semicylindrical shape because of the effect produced by the water-repellent treatment of the low-reflective layers.

The blue fluorescent layer was formed as follows. First, 7-hydroxy-4-methylcoumarin (Coumarin 4) (0.02 mol/kg (solid content ratio)) was mixed with an epoxy thermosetting resin and stirred with a dispersing device to prepare a coating solution for forming blue fluorescent bodies.

The coating solution for forming blue fluorescent bodies was applied by a dispenser method in the predetermined opening surrounded by the barrier.

The resulting coating film was then dried by heating in a vacuum oven (150° C.) for one hour to form a blue fluorescent layer having a thickness of 2 μm.

The cross-sectional shape of the blue fluorescent layer was a semicylindrical shape because of the effect produced by the water-repellent treatment of the low-reflective layers.

Subsequently, a dielectric multilayer film prepared by alternately forming six layers of titanium oxide ($TiO_2$: refractive index=2.30) and silicon oxide ($SiO_2$: refractive index=1.47) by an EB deposition method was formed as a wavelength-selective transmission/reflection layer on surfaces of the red fluorescent layer, green fluorescent layer, and blue fluorescent layer upon which excitation light was incident, by a sputtering method so as to have a thickness of 100 nm.

Subsequently, a planarizing film was formed on the wavelength-selective transmission/reflection layer by a spin coating method using an acrylic resin. A polarizing film, a transparent electrode, and a light distribution film were formed on the planarizing film by a publicly known method to obtain a fluorescent substrate including the glass substrate and the low-refractive-index layer, red fluorescent layer, green fluorescent layer, blue scattering layer, barrier, and wavelength-selective transmission/reflection layer formed on the one surface of the glass substrate.

Subsequently, a switching element constituted by a TFT was formed on a glass substrate by a publicly known method.

An ITO transparent electrode having a thickness of 100 nm was then formed so as to be electrically connected to the TFT through a contact hole.

The transparent electrode was then patterned by a typical photolithography method so as to have the same pitch as that of pixels of an organic EL unit prepared in advance.

An alignment film was then formed by a printing method.

Subsequently, the substrate including the TFT formed thereon and the fluorescent substrate were bonded to each other with a spacer having a thickness of 10 μm therebetween. A TN-mode liquid crystal material was inserted between the substrates to complete a liquid crystal/fluorescent unit.

A reflective electrode composed of silver was formed on a glass substrate having a thickness of 0.7 mm by a sputtering method so as to have a thickness of 100 nm. A film composed of indium tin oxide (ITO) was formed on the reflective electrode by a sputtering method so as to have a thickness of 20 nm. Thus, a first electrode (anode) was formed.

The first electrode was then patterned by a publicly known photolithography method so as to have a desired width.

Subsequently, a $SiO_2$ layer having a thickness of 200 nm was stacked on the first electrode by a sputtering method and patterned by a publicly known photolithography method so as to cover only an edge portion of the first electrode.

Herein, portions 10 μm from the edges of the short sides of the first electrode were covered with $SiO_2$.

The resultant substrate was washed with water; then subjected to ultrasonic cleaning with pure water for 10 minutes, ultrasonic cleaning with acetone for 10 minutes, and steam cleaning with isopropyl alcohol for 5 minutes; and dried at 120° C. for one hour.

The substrate on which the first electrode was formed was then clamped in a substrate holder in an in-line type resistance heating evaporator and the pressure was reduced to a vacuum of $1 \times 10^{-4}$ Pa or less. Thus, layers constituting an organic EL layer including an organic light-emitting layer were formed. Hereafter, a method for forming the layers constituting the organic EL layer is described in detail.

A hole injection layer having a thickness of 100 nm was formed by a resistance heating evaporation method using 1,1-bis(di-4-tolylaminophenyl)cyclohexane (TAPC) as a hole injection material.

A hole transport layer having a thickness of 10 nm was then formed by a resistance heating evaporation method using carbazole biphenyl (CBP) as a hole transport material.

A near-ultraviolet organic light-emitting layer (thickness: 30 nm) was then formed in a desired pixel position on the hole transport layer. The near-ultraviolet organic light-emitting layer was formed by depositing 3,5-bis(4-t-butylphenyl)-4-phenyl-[1,2,4]triazole (TAZ) (near-ultraviolet phosphorescent light-emitting material) at a deposition rate of 1.5 Å/sec.

A hole blocking layer (thickness: 20 nm) was then formed on the organic light-emitting layer using 2,9-dimethyl-4,7-diphenyl-1,10-phenanthroline (BCP).

An electron transport layer (thickness: 30 nm) was then formed on the hole blocking layer using tris(8-hydroxyquinoline)aluminum ($Alq_3$).

An electron injection layer (thickness: 0.5 nm) was then formed on the electron transport layer using lithium fluoride (LiF).

Through the above processes, the layers constituting the organic EL layer were formed.

After that, a semitransparent electrode was formed as a second electrode.

First, the substrate was clamped in a metal deposition chamber and a shadow mask for forming the semitransparent electrode was aligned with the substrate. Herein, a mask having such openings that stripe-shaped second electrodes each having a width of 500 μm were able to be formed at a pitch of 600 μm so as to face the stripes of the first electrode was used as the shadow mask.

Magnesium and silver (thickness: 1 nm) were formed in a desired pattern by co-depositing magnesium and silver on the surface of the electron injection layer by a vacuum deposition method at deposition rates of 0.1 Å/sec and 0.9 Å/sec, respectively.

Furthermore, silver (thickness: 19 nm) was formed thereon in a desired pattern at a deposition rate of 1 Å/sec for the purpose of enhancing the interference effect and preventing the voltage drop due to the wiring resistance in the second electrode.

Through the above processes, a semitransparent electrode was formed.

A micro-cavity effect (interference effect) is produced between the first electrode and the second electrode, which can increase the front luminance. Consequently, the emission energy from the organic EL layer can be efficiently transferred to the light-output side. The emission peak wavelength was adjusted to 370 nm and the full width at half maximum was adjusted to 30 nm by the micro-cavity effect.

An inorganic protective layer composed of $SiO_2$ and having a thickness of 3 μm was then formed by a plasma CVD method using a shadow mask in a sealing area located in a range extending outward from the top, bottom, left, and right edges of the display unit to 2 mm from the edges.

Through the above processes, an organic EL element substrate including the organic EL element formed thereon was produced.

The thus-produced organic EL element substrate and fluorescent substrate were aligned with each other using an alignment mark formed outside the pixel-arranged position. Note that a thermosetting resin was applied onto the fluorescent substrate in advance.

After the organic EL element substrate and the fluorescent substrate were aligned with each other, both the substrates were brought into close contact with each other so as to sandwich the thermosetting resin. The thermosetting resin was cured by performing heating at 80° C. for two hours to bond the organic EL element substrate and the fluorescent substrate. This process for bonding the substrates was conducted in a dry air environment (moisture content: −80° C.) for the purpose of preventing the degradation of the organic layer due to moisture.

Finally, terminals formed in the periphery were connected to an external power supply, whereby an organic EL display apparatus of Example 6 was completed.

There was provided an excitation light source in which a blue-light-emitting organic EL element could be freely switched by applying a desired electric current to a desired striped electrode from the external power supply. The blue light was converted into red light through the red fluorescent layer and the blue light was converted into green light through the green fluorescent layer, and thus isotropic red light and isotropic green light were obtained. Consequently, isotropic blue light was obtained. Accordingly, full-color display was achieved and a good image and an image having good viewing angle characteristics were able to be formed.

INDUSTRIAL APPLICABILITY

The aspects of the present invention can be applied to light-emitting devices, and various display apparatuses and illumination apparatuses including the light-emitting devices.

REFERENCE SIGNS LIST 10, 30, 50, 70, 90, 110, 130, 150, 170, 190 light-emitting device
11 excitation light source
12 planarizing film
13 fluorescent layer
14 substrate
15, 71, 91 barrier
16, 111, 131 low-refractive-index layer
17, 132 light-absorbing layer
31 wavelength-selective transmission/reflection layer
51 second light-absorbing layer
151 second substrate
171, 191 second low-refractive-index layer
210 organic EL element substrate
211 substrate
212 organic EL element
213 first electrode
214 organic EL layer
215 second electrode
216 hole injection layer
217 hole transport layer
218 light-emitting layer
219 hole blocking layer
220 electron transport layer
221 electron injection layer
222 edge cover
230 LED substrate
231 substrate
232 first buffer layer
233 n-type contact layer
234 second n-type cladding layer
235 first n-type cladding layer
236 active layer
237 first p-type cladding layer
238 second p-type cladding layer
239 second buffer layer
240 cathode
241 anode
250 inorganic EL element substrate
251 substrate
252 inorganic EL element
253 first electrode
254 first dielectric layer
255 light-emitting layer
256 second dielectric layer
257 second electrode
260, 300 display apparatus
261, 301 fluorescent substrate
262, 302 organic EL element substrate
263 light-scattering layer
264 TFT
265 gate electrode
266 gate line
267 gate insulating film
268 source electrode
269 drain electrode
270 data line
271 planarizing film
272 contact hole
273 sealing film
274 pixel unit
275 data signal driving circuit
276 gate signal driving circuit
277 signal wiring line
278 current supply line
279 flexible printed circuit
290 external driving circuit
303 liquid crystal device
311, 312 polarizing plate
313, 314 transparent electrode
315, 316 alignment film
317 substrate
318 liquid crystal
330 illumination apparatus
331 optical film
332 fluorescent substrate
333 organic EL element
334 thermal diffusion sheet
335 sealing substrate
336 sealing resin
337 heat dissipation member
338 driving circuit
339 wiring line
340 ceiling hanger
341 anode
342 organic EL layer
343 cathode
350 illumination apparatus
351 excitation light source
352 fluorescent substrate
353 light-emitting device
354 substrate
355 fluorescent layer
356 barrier
357 low-refractive-index layer
370 electricity-generating apparatus
371 sunlight
372 fluorescent substrate
373 light-emitting device
374 solar cell
375 first substrate
376 fluorescent layer
377 barrier
378 first low-refractive-index layer
379 wavelength-selective transmission/reflection layer
380 second low-refractive-index layer
381 second substrate

The invention claimed is:

1. A light-emitting device comprising:
an excitation light source that emits excitation light;
a first substrate which is disposed so as to face the excitation light source and on which a fluorescent layer and a first low-refractive-index layer are formed, the fluorescent layer being excited by the excitation light to emit fluorescence; and
a barrier that surrounds side surfaces of the fluorescent layer, the side surfaces extending in a stacking direction of the excitation light source and the first substrate,
wherein at least a portion of the barrier that faces the fluorescent layer has a light-scattering property,
the first low-refractive-index layer is located between the fluorescent layer and the first substrate, and
the first low-refractive-index layer has a refractive index lower than that of the first substrate.

2. The light-emitting device according to claim 1, further comprising a second substrate disposed on an incident surface side of the fluorescent layer upon which the excitation light is incident.

3. The light-emitting device according to claim 1, further comprising a second low-refractive-index layer located on an incident surface side of the fluorescent layer upon which the excitation light is incident.

4. The light-emitting device according to claim 1, further comprising a wavelength-selective transmission/reflection layer configured to transmit at least light with a peak wavelength of the excitation light and reflect at least light with an emission peak wavelength of the fluorescent layer, the wavelength-selective transmission/reflection layer being located on an incident surface side of the fluorescent layer upon which the excitation light is incident.

5. The light-emitting device according to claim 4, wherein the second low-refractive-index layer is located between the fluorescent layer and the wavelength-selective transmission/reflection layer or between the wavelength-selective transmission/reflection layer and the excitation light source.

6. The light-emitting device according to claim 1, wherein the fluorescent layer is constituted by a plurality of separated fluorescent layers each located in a predetermined region, and the first low-refractive-index layer is formed so as to extend between the plurality of separated fluorescent layers and the first substrate.

7. The light-emitting device according to claim 6, further comprising a light-absorbing layer disposed between two adjacent separated fluorescent layers among the plurality of separated fluorescent layers.

8. The light-emitting device according to claim 7, wherein the light-absorbing layer is located on at least one of an upper surface and a lower surface of the barrier.

9. The light-emitting device according to claim 7, wherein the light-absorbing layer is located between the first low-refractive-index layer and the first substrate.

10. The light-emitting device according to claim 1, wherein the first low-refractive-index layer has such a refractive index that an outgoing angle of incident light that enters the first substrate from the first low-refractive-index layer is smaller than a critical angle of at least incident light that can be output from the first substrate toward the outside.

11. The light-emitting device according to claim 1, wherein the first low-refractive-index layer is composed of a gas.

12. The light-emitting device according to claim 11, further comprising a gas barrier film configured to block the gas, the gas barrier film being disposed on an incident surface side of the fluorescent layer upon which the excitation light is incident.

13. The light-emitting device according to claim 1, wherein at least a portion of the barrier that faces the fluorescent layer is formed of a material containing a resin and light-scattering particles.

14. The light-emitting device according to claim 1, wherein at least a portion of the barrier that faces the fluorescent layer has irregularities.

15. A display apparatus comprising the light-emitting device according to claim 1.

16. The display apparatus according to claim 15,
wherein the excitation light source emits excitation light in an ultraviolet region, and
the fluorescent layer includes a red fluorescent layer that emits red light through irradiation with the excitation light and constitutes a red pixel, a green fluorescent layer that emits green light through irradiation with the excitation light and constitutes a green pixel, and a blue fluorescent layer that emits blue light through irradiation with the excitation light and constitutes a blue pixel.

17. The display apparatus according to claim 15,
wherein the excitation light source emits blue excitation light, and
the fluorescent layer includes a red fluorescent layer that emits red light through irradiation with the excitation light and constitutes a red pixel, a green fluorescent layer that emits green light through irradiation with the excitation light and constitutes a green pixel, and a scattering layer that scatters the excitation light and constitutes a blue pixel.

18. The display apparatus according to claim 15, wherein the fluorescence is output to the outside from the first substrate.

19. The display apparatus according to claim 15, wherein the excitation light source is a light-emitting diode, an organic electroluminescence element, or an inorganic electroluminescence element.

20. The display apparatus according to claim 15, further comprising a polarizing plate having an extinction ratio of 10000 or more at a wavelength of 435 nm or more and 480 nm or less, the polarizing plate being disposed between the excitation light source and the first substrate.

* * * * *